United States Patent
Okuyama et al.

(10) Patent No.: US 9,651,864 B2
(45) Date of Patent: May 16, 2017

(54) NEGATIVE RESIST COMPOSITION, METHOD FOR PRODUCING RELIEF PATTERN USING THE SAME, AND ELECTRONIC COMPONENT USING THE SAME

(75) Inventors: Kenichi Okuyama, Tokyo-to (JP); Satoru Kanke, Tokyo-to (JP)

(73) Assignee: DAI NIPPON PRINTING CO., LTD., Tokyo-to (JP)

(*) Notice: Subject to any disclaimer, the term of this patent is extended or adjusted under 35 U.S.C. 154(b) by 93 days.

(21) Appl. No.: 13/637,101

(22) PCT Filed: Mar. 24, 2011

(86) PCT No.: PCT/JP2011/057233
§ 371 (c)(1),
(2), (4) Date: Sep. 25, 2012

(87) PCT Pub. No.: WO2011/118726
PCT Pub. Date: Sep. 29, 2011

(65) Prior Publication Data
US 2013/0017376 A1  Jan. 17, 2013

(30) Foreign Application Priority Data

Mar. 26, 2010 (JP) ................. 2010-072178
Sep. 28, 2010 (JP) ................. 2010-216579
Sep. 28, 2010 (JP) ................. 2010-216580

(51) Int. Cl.
G03F 7/004 (2006.01)
B32B 3/10 (2006.01)
G03F 7/20 (2006.01)
G03F 7/038 (2006.01)

(52) U.S. Cl.
CPC ............ *G03F 7/0382* (2013.01); *G03F 7/038* (2013.01); *Y10T 428/24802* (2015.01)

(58) Field of Classification Search
CPC ................. G03F 7/038; G03F 7/0382
See application file for complete search history.

(56) References Cited

U.S. PATENT DOCUMENTS

| | | | |
|---|---|---|---|
| 4,201,580 A * | 5/1980 | Feit ................. | 430/319 |
| 5,959,807 A | 9/1999 | Jurgenson | |
| 6,197,473 B1 | 3/2001 | Kihara et al. | |
| 6,211,328 B1 * | 4/2001 | Kurimoto et al. ............ | 528/219 |
| 2003/0143484 A1 * | 7/2003 | Rottstegge et al. ....... | 430/270.1 |
| 2003/0204117 A1 * | 10/2003 | Matsuishi et al. ............ | 568/718 |
| 2004/0023151 A1 | 2/2004 | Takeda et al. | |
| 2010/0047709 A1 * | 2/2010 | Echigo et al. ............. | 430/270.1 |
| 2010/0239980 A1 | 9/2010 | Okuyama et al. | |

FOREIGN PATENT DOCUMENTS

| | | |
|---|---|---|
| JP | 10-069745 A | 3/1998 |
| JP | 10-239843 A | 9/1998 |
| JP | 11-153863 A | 6/1999 |
| JP | 2003-233185 A | 8/2003 |
| JP | 2003300922 A | 10/2003 |
| JP | 2009-173623 A | 8/2009 |
| JP | 2009-173623 A | 8/2009 |
| JP | 2009-265445 A | 11/2009 |
| WO | WO 2008053974 A1 * | 5/2008 |
| WO | 2009/060869 A1 | 5/2009 |

OTHER PUBLICATIONS

Junyan Dai, et al; "Molecular Glass Resists for High-Resolution Patterning", Chem. Mater. Publication Date: Jun. 23, 2006, 18, pp. 3404-3411.
Nathaniel Clark, et al; "Time-dependent exposure dose of hydrogen silsesquioxane when used as a negative electron-beam resist", J. Vac. Sci. Technol. B 24(6), Nov./Dec. 2006, pp. 3073-3076.
S. Omoto, et al; "Comparison of EB Exposure Characteristics between HSQ and Calix Arene of High Resolution Negative Resist", Journal of Photopolymer Science and Technology, vol. 23, No. 1, Accepted May 7, 2010; pp. 97-100.
Hiroaki Oizumi, et al; "Development of New Negative-tone Molecular Resists Based on Calixarene for EUV Lithography", Journal of Photopolymer Science and Technology, vol. 21, No. 3, Accepted Jun. 13, 2008, pp. 443-449.
Masahiko Ishida, et al; "Sub-10-nm-Scale Lithography Using p-chloromethyl-methoxy-calix[4]arene Resist", Jpn. J. Appl. Phys. vol. 42, pp. 3913-3916; Part 1, No. 6B, Jun. 2003.
Richard A. Lawson, et al; "Negative-Tone Molecular Resists Based on Cationic Polymerization", Proc. SPIE 7273, Advances in Resist Materials and Processing Technology XXVI, From Conference vol. 7273; San Jose, CA; Feb. 22, 2009; doi:10.1117/12.81445; pp. 72733E-1-72733E-10.
International Search Report; mailed Apr. 19, 2011; PCT/JP2011/057233.

* cited by examiner

*Primary Examiner* — Ian Rummel
(74) *Attorney, Agent, or Firm* — Ladas & Parry LLP

(57) ABSTRACT

An object of the present invention is to provide a negative resin composition which can produce a pattern with high sensitivity, high resolution and low line edge roughness in pattern formation by exposure to electron beams or EUV, a method for producing a relief pattern and an electronic component using the negative resist composition.

Disclosed is a negative resist composition comprising a phenolic compound (A) which has: two or more phenolic hydroxyl groups per molecule; one or more substituents of one or more kinds selected from the group consisting of a hydroxymethyl group and an alkoxymethyl group per molecule in the ortho-position of any of the phenolic hydroxyl groups; and a molecular weight of 400 to 2,500, wherein the content of the phenolic compound (A) is 70% by weight or more of the total solid content of the negative resist composition.

15 Claims, No Drawings

NEGATIVE RESIST COMPOSITION, METHOD FOR PRODUCING RELIEF PATTERN USING THE SAME, AND ELECTRONIC COMPONENT USING THE SAME

TECHNICAL FIELD

The present invention relates to a negative resist composition for forming chemically and non-chemically amplified resists which are useful in microfabrication, and a method for producing a relief pattern and an electronic component using the resist composition.

BACKGROUND ART

Recently in the production of semiconductor devices and liquid crystal display devices, pattern size reduction has been developed rapidly with advances in lithography techniques. Accordingly, there is a demand for high resolution such as a pattern having a width of 50 nm or less.

For pattern size reduction, in general, short wavelength exposure sources has been increasingly used. Besides the currently used KrF excimer laser, lithography techniques using exposure lights such as ArF, $F_2$, EUV, x-rays, electron beams and other charged particle beams have been proposed.

Especially, pattern forming techniques using exposure to electron beams and EUV are positioned as the second-generation or the third-generation lithography techniques, and there is a demand for the development of a negative resist for forming the gate layer of a semiconductor integrated circuit or processing a mask pattern to be formed on a glass substrate, which meets all the requests for high sensitivity, high resolution and low line edge roughness (LER).

As the resist material which meets such requests, a chemically amplified photosensitive composition is used, which utilizes the catalytic reaction of acid for the purpose of increasing sensitivity. A negative, chemically amplified photosensitive composition generally comprises an alkali-soluble resin, which will be the resist substrate, an acid generator component which produces acid by exposure to light, a crosslinking agent, a basic compound, etc. When such a photosensitive composition is exposed to light, a crosslinking bond is formed between the resin and crosslinking agent by the action of acid produced from the acid generator component by the exposure; therefore, the photosensitive composition is changed from an alkali-soluble composition to an alkali-insoluble composition. Also, pattern exposure is possible with a smaller exposure amount since the acid produced by the crosslinking reaction catalytically repeats reaction. On the other hand, in the chemically amplified photosensitive composition, there is a contradictory relationship between sensitivity, resolution and LER, and an issue for the composition is how to balance them.

A resist material comprising a polymer having a weight average molecular weight of about 5,000 or more, has been used for the alkali-soluble resin to be the resist substrate in semiconductor lithography.

However, such a polymer material has a large molecular weight and a wide molecular weight distribution, so that there is a limit to decreasing resolution or LER.

Accordingly, as the alkali-soluble resin to be the resist substrate, low-molecular-weight materials have been under development. The low-molecular-weight materials are expected to have better resolution than polymer materials and also to decrease LER. Examples of negative resists comprising such low-molecular-weight materials as the resist substrate include a resist comprising calix resorcinarene and a derivative thereof (Patent Literature 1 and Non-Patent Literature 1), a resist comprising a low-molecular-weight polyphenol compound derivative (Non-Patent Literature 2) and a resist comprising a cyclic polyphenol compound derivative (Patent Literature 2).

Also recently, a molecular resist based on cationic polymerization was reported in the field of negative, chemically amplified resist compositions (Non-Patent Literature 3). The molecular resist based on cationic polymerization utilizes the crosslinking ability of epoxy groups; therefore, it needs no crosslinking agent that has been used therefor. However, since the molecular resist of Non-Patent Literature 3 comprises no phenolic hydroxyl group, it cannot be developed in alkali developing solutions production. It is described in Non-Patent Literature 3 that the molecular resist based on cationic polymerization offers high sensitivity, high resolution and low LER; however, as shown in reference examples described later, it was found that the resist has a problem with dimensional stability of pattern and such a problem that dewetting occurs in the step of forming a coating film for forming a pattern (in a post-applied bake treatment), so that it is not possible to form a uniform resist film and thus to obtain a fine pattern with low LER.

A negative resist composition is disclosed in Patent Literature 3, which comprises a polymer with alkali developing property and crosslinking ability. However, in the case of using the polymer with alkali developing property and crosslinking ability, swelling is likely to occur upon development and no fine pattern with low LER can be formed due to pattern collapse or waved pattern caused by the swelling.

Also, imprinting has been attracting attention as a new lithography technique.

Especially, there is a demand for development of a resist with a resolution of 20 nm or less, which is used as a resist for producing an imprint mold that is used as an original plate in lithography, or for producing a gate layer of a semiconductor circuit by electron beam direct writing.

As a resist material that meets the demand, a positive resist composition mainly comprising an α-methylstyrene-α-chloroacrylic acid methyl ester copolymer, is commonly used.

Moreover, a calixarene resist (Non-Patent Literature 4) and a hydrogen silsesquioxane (HSQ) resist (Non-Patent Literature 5) have been proposed as negative resists with a resolution of about 10 nm.

As described above, calixarene is useful as a super-resolution resist for research and development or trial production because it functions as a negative resist and provides a resolution of about 10 nm. However, organic solvents such as xylene are used for development of this resist. Since these developing solutions are used in a large amount in the pattern formation process and volatile, it is difficult to collect them absolutely and thus to use them on mass production lines such as semiconductor integrated circuit production.

Meanwhile, the HSQ resist has characteristics such as a resolution of about 10 nm and high etching resistance, and alkali developing solutions can be used for development of the resist. However, this resist material has a problem of poor line width stability during electron beam writing (change in sensitivity during writing). "Line width stability during electron beam writing" means that a change in line width in vacuum during the time between electron beam writing and development. Since time lapses after writing and before development differs between the beginning and end of the writing of a surface of a substrate, there is a problem of change in pattern line width even on the same surface of the substrate (Non-Patent Literature 6). Since HSQ is an inorganic compound, there is also such a problem that it is difficult to remove a resist residue left between patterns by ozone or plasma asking in a gas phase.

CITATION LIST

Patent Literature 1: Japanese Patent Application Laid-Open (JP-A) No. H10-239843
Patent Literature 2: JP-A No. H11-153863
Patent Literature 3: JP-A No. 2003-233185
Non-Patent Literature 1: Journal of Photopolymer Science and Technology, Volume 21, Number 3, (2008) 443-449
Non-Patent Literature 2: Chemistry of Materials, 2006, 18, 3404-3411
Non-Patent Literature 3: Proc. of SPIE, Volume 7273, (2009), 72733E1-10
Non-Patent Literature 4: Jpn. J. Appl. Phys., Vol. 42, (2003) pp. 3913-3916
Non-Patent Literature 5: J. Vac. Sci. Tech. B, 24, (2006) 3073-3076
Non-Patent Literature 6: Journal of Photopolymer Science and Technology, Volume 23, No. 1, (2010) 97-100

SUMMARY OF INVENTION

Technical Problem

In light of the above circumstances, an object of the present invention is to increase performance and to solve the technical problems of semiconductor device microfabrication. Another object of the present invention is to provide a negative resist composition which is alkali-developable and can produce a pattern that has high resolution and low line edge roughness, and a method for producing a relief pattern and an electronic component using the negative resist composition.

More specifically, a first object of the present invention is to provide a chemically amplified negative resist composition which is alkali-developable and can produce a pattern that has high sensitivity, high resolution and low line edge roughness in pattern formation by exposure to electron beams, ion beams or EUV, and a method for producing a relief pattern and an electronic component using the negative resist composition.

A second object of the present invention is to provide a non-chemically amplified negative resist composition which is alkali-developable and can produce a pattern that has high post-exposure line width stability in vacuum, high resolution and low line edge roughness in pattern formation by exposure to electron beams, ion beams or EUV, a method for producing a relief pattern and an electronic component using the negative resist composition.

Solution to Problem

As the result of diligent researches, the inventors of the present invention considered it important to form a more uniform resist film, in order to obtain high resolution and low line edge roughness. They thought that it is possible to decrease the number of components in a resist composition by designing the composition so that a certain molecule has multiple functions, and it is thus possible to improve the non-uniformity of a resist film, which is due to phase separation of the components. Under this idea, the inventors found that higher resolution and lower and improved line edge roughness can be obtained by incorporating a specific crosslinkable group in a specific phenolic compound which will be the resist substrate, and using the thus-obtained resist substrate with both crosslinking ability and alkali developing property, as compared to the case of using a mixture of two components of a similar phenolic compound and a crosslinking agent. The inventors of the present invention completed the present invention based on this knowledge, therefore.

The negative resist composition of the present invention is a negative resist composition comprising a phenolic compound (A) which has: two or more phenolic hydroxyl groups per molecule; one or more substituents of one or more kinds selected from the group consisting of a hydroxymethyl group and an alkoxymethyl group per molecule in the ortho-position of any of the phenolic hydroxyl groups; and a molecular weight of 400 to 2,500, wherein the phenolic compound (A) is 70% by weight or more of the total solid content of the negative resist composition.

According to the present invention, it is possible to obtain a pattern with high resolution and low line edge roughness by, as the resist substrate contained in a negative resist composition, using a phenolic compound which functions as the resist substrate with alkali developing property and also as a crosslinking agent, and increasing the content of the phenolic compound.

The negative resist composition of the present invention has the following two embodiments.

The first embodiment of the negative resist composition of the present invention is a negative resist composition comprising a phenolic compound (A) which has: two or more phenolic hydroxyl groups per molecule; one or more substituents of one or more kinds selected from the group consisting of a hydroxymethyl group and an alkoxymethyl group per molecule in the ortho-position of any of the phenolic hydroxyl groups; and a molecular weight of 400 to 2,500, and an acid generator (B) which directly or indirectly produces acid by exposure to active energy rays having a wavelength of 248 nm or less, wherein the content of the phenolic compound (A) is 70% by weight or more of the total solid content of the negative resist composition, and wherein the negative resist composition is a chemically amplified negative resist composition.

The second embodiment of the negative resist composition of the present invention is a negative resist composition comprising a phenolic compound (A) which has: two or more phenolic hydroxyl groups per molecule; two or more substituents of one or more kinds selected from the group consisting of a hydroxymethyl group and an alkoxymethyl group per molecule in the ortho-position of any of the phenolic hydroxyl groups; and a molecular weight of 400 to 2,500, wherein the content of the phenolic compound (A) is 70% by weight or more of the total solid content of the negative resist composition, and wherein the negative resist composition substantially comprises no acid generator and is a non-chemically amplified negative resist composition.

In the negative resist composition of the present invention, the phenolic compound (A) preferably has a glass transition temperature (Tg) of 60° C. or more, from the viewpoint of obtaining a pattern with high resolution and low line edge roughness.

In the negative resist composition of the present invention, the phenolic compound (A) preferably has three or more substituents of one or more kinds selected from the group consisting of a hydroxymethyl group and an alkoxymethyl group per molecule in the ortho-position of any of the phenolic hydroxyl groups, from the viewpoint of increasing crosslinking ability and obtaining a pattern with high sensitivity, high resolution and low line edge roughness.

In the negative resist composition of the present invention, the phenolic compound (A) preferably has a solubility of 5% by weight or more at 23° C. in organic solvents having a boiling point of 80 to 180° C., from the viewpoint of obtaining a resist film with excellent uniformity.

When the negative resist composition of the present invention is the chemically amplified negative resist composition of the first embodiment, the resist composition preferably further comprises an organic basic compound (C), from the viewpoint of obtaining a well-shaped resist pattern and temporal stability during storage.

The method for producing a relief pattern of the present invention comprises the steps of:

(i) forming a resist film by applying the negative resist composition of the present invention to a substrate and heating the same, and (ii) exposing the resist film to electron beams, ion beams, EUV or x-rays and then developing the same.

According to the present invention, it is possible to form a pattern with high sensitivity, high resolution and low line edge roughness.

In the case of using a chemically amplified resist composition in the relief pattern production method of the present invention, the method preferably further comprises the step of heating the resist film after the exposure and before the development, from the viewpoint of forming a pattern with high sensitivity, high resolution and low line edge roughness.

The present invention also provides an electronic component at least part of which comprises the negative resist composition of the present invention or a cured product thereof.

Advantageous Effects of Invention

According to the present invention, it is possible to obtain a negative resist composition that is alkali-developable and a pattern with high resolution and low line edge roughness by, as the resist substrate contained in the negative resist composition, using a phenolic compound which functions as the resist substrate with alkali developing property and also as a crosslinking agent, and increasing the content of the phenolic compound.

Especially when the negative resist composition of the present invention is a chemically amplified resist composition, it is possible to obtain a pattern that has high sensitivity, high resolution and low line edge roughness by alkaline development.

The phenolic compound having the specific structure also functions as the resist substrate which is used in a non-chemically amplified resist composition that substantially comprises no photoacid generator. When the negative resist composition of the present invention is the non-chemically amplified resist composition, it is possible to obtain a pattern that has high post-exposure line width stability in vacuum, high resolution and low line edge roughness by alkaline development.

DESCRIPTION OF EMBODIMENTS

Hereinafter, the present invention will be described in detail.

I. Negative Resist Composition

The negative resist composition of the present invention is a negative resist composition comprising a phenolic compound (A) which has: two or more phenolic hydroxyl groups per molecule; one or more substituents of one or more kinds selected from the group consisting of a hydroxymethyl group and an alkoxymethyl group per molecule in the ortho-position of any of the phenolic hydroxyl groups; and a molecular weight of 400 to 2,500, wherein the content of the phenolic compound (A) is 70% by weight or more of the total solid content of the negative resist composition.

When many components are contained in a negative resist composition, due to the compatibility problem of the components, the components are sometimes likely to cause phase separation in the resulting film. It is not possible to produce a uniform resist film in this case, and poor line edge roughness is thus obtained. Or, for example, in the case of producing a resist composition by mixing a polyphenol compound with a crosslinking agent, because there is a limit on the content of the crosslinking agent from the viewpoint of the compatibility thereof, it is difficult for this case to improve the sensitivity.

In the case of using a polymer as the resist substrate, swelling is likely to occur upon development; therefore, a decrease in resolution and a deterioration in line edge roughness are caused by the swelling.

In order to obtain a pattern with high resolution and low line edge roughness, the inventors considered it important to form a resist film with high uniformity by using a low-molecular-weight resist substrate which is more effective than polymers in inhibiting swelling upon development. They thought that it is possible to decrease the number of components in a resist composition by designing the composition so that a certain molecule has multiple functions, and it is thus possible to improve the non-uniformity of a resist film, which is due to phase separation of the components.

Under this idea, the inventors introduced as a crosslinkable group one or more substituents of one or more kinds selected from the group consisting of a hydroxymethyl group and an alkoxymethyl group per molecule in the ortho-position of any of the phenolic hydroxyl groups, into a relatively-low-molecular weight specific phenolic compound that will be the resist substrate. It is considered that by using such a specific resist substrate with crosslinking ability and alkali developing property and increasing the content of the resist substrate in the solid content of the resist composition, the uniformity of the thus-produced resist film is increased, and it is thus possible to obtain a pattern with high resolution and low line edge roughness.

The negative resist composition of the present invention has the following two embodiments: chemically amplified negative resist composition and non-chemically amplified negative resist composition.

The first embodiment of the negative resist composition of the present invention is a negative resist composition comprising a phenolic compound (A) which has: two or more phenolic hydroxyl groups per molecule; one or more substituents of one or more kinds selected from the group consisting of a hydroxymethyl group and an alkoxymethyl group per molecule in the ortho-position of any of the phenolic hydroxyl groups; and a molecular weight of 400 to 2,500, and an acid generator (B) which directly or indirectly produces acid by exposure to active energy rays having a wavelength of 248 nm or less, wherein the content of the phenolic compound (A) is 70% by weight or more of the total solid content of the negative resist composition, and wherein the negative resist composition is a chemically amplified negative resist composition.

In the chemically amplified negative resist composition, acid is produced from the acid generator (B) when exposed to light (irradiation with light) in resist pattern formation. By the action of the acid, a crosslinking bond is formed between the phenolic compounds (A) by one or more substituents of one or more kinds being selected from the group consisting of a hydroxymethyl group and an alkoxymethyl group and being present in the ortho-position of any of the phenolic hydroxyl groups, thus becoming alkali-insoluble. Therefore, when the resist film comprising the negative resist composition is selectively exposed to light in resist pattern formation, or when it is selectively exposed to light and then subjected to post-exposure bake in resist pattern formation, the exposed portion becomes alkali-insoluble, while the unexposed portion remains alkali-soluble and unchanged, so that a negative resist pattern can be formed by alkali development.

Such a chemically amplified resist composition can achieve high sensitivity by the action of acid. It can also achieve high resolution because the resist composition contains the relatively-low-molecular-weight resist substrate in a high solid content concentration.

The second embodiment of the negative resist composition of the present invention is a negative resist composition comprising a phenolic compound (A) which has: two or more phenolic hydroxyl groups per molecule; two or more substituents of one or more kinds selected from the group consisting of a hydroxymethyl group and an alkoxymethyl group per molecule in the ortho-position of any of the phenolic hydroxyl groups; and a molecular weight of 400 to 2,500, wherein the content of the phenolic compound (A) is 70% by weight or more of the total solid content of the negative resist composition, and wherein the negative resist composition substantially comprises no acid generator and is a non-chemically amplified negative resist composition.

Chemically amplified resists use acid diffusion to achieve high sensitivity. The acid diffusion length is said to be a few nanometers to a few dozen nanometers, and it is difficult to obtain a super high resolution pattern of 20 nm or less with low line edge roughness.

Accordingly, the inventors of the present invention focused on non-chemically amplified resist materials which promote crosslinking reaction without the aid of acid. The specific low-molecular-weight polyphenol compound (A) which is used in the present invention and has two or more crosslinkable groups per molecule and alkali developing property, has a high ratio of crosslinkable groups to hydroxyl groups; therefore, the reactivity of the polyphenol compound (A) is increased by increasing the concentration of the polyphenol compound (A) in the solid content of the resist composition, so that crosslinking reaction can be promoted with sufficient sensitivity, without the aid of acid. Moreover, because the hydroxymethyl group and alkoxymethyl group incorporated as the crosslinkable groups have excellent chemical stability, it is possible to improve the post-exposure line width stability during the time of standing after application of the resist or in vacuum after application of the resist.

The non-chemically amplified negative resist composition is alkali-soluble since it has phenolic hydroxyl groups. However, when it is exposed to light (irradiation with light) such as electron beams in resist pattern formation, a crosslinking bond is formed between the phenolic compounds (A) by one or more substituents of one or more kinds being selected from the group consisting of a hydroxymethyl group and an alkoxymethyl group and being present in the ortho-position of any of the phenolic hydroxyl groups. Thus, the negative resist composition becomes alkali-insoluble. Therefore, when the resist film comprising the negative resist composition is selectively exposed to light in resist pattern formation, the exposed portion becomes alkali-insoluble, while the unexposed portion remains alkali-soluble and unchanged, so that a negative resist pattern can be formed by alkali development.

Also, the non-chemically amplified negative resist composition of the present invention uses no acid diffusion upon image formation; therefore, it has higher resolution than chemically-amplified negative resist compositions and it can achieve low line edge roughness and form a pattern of 20 nm or less in width.

Hereinafter, the components of the negative resist composition of the present invention will be described in detail. In the present invention, "active energy rays" means far-ultraviolet rays such as KrF excimer laser, ArF excimer laser and $F_2$ excimer laser, electron beams, ion beams, EUV, X-rays, etc.

Among the descriptions of "group (or atomic group)" in the present invention, those that do not refer to substitution or unsubstitution encompass those having a substituent and those not having a substituent. For example, "alkyl group" encompasses not only an alkyl group that does not have a substituent (unsubstituted alkyl group) but also an alkyl group that has a substituent (substituted alkyl group). The divalent bond of an alkylene group encompasses one derived from different carbon atom (such as —$CH_2CH_2$—) and also the same carbon atom (such as —$CH_2$—). "Alkyl group" and "cycloalkyl group" encompass saturated hydrocarbon and unsaturated hydrocarbon having a double bond or a triple bond. Cycloalkyl group encompasses monocyclic hydrocarbon and polycyclic hydrocarbons such as dicyclic and tricyclic hydrocarbons.

<Phenolic Compound (A)>

The phenolic compound (A) used in the present invention is a compound which has: two or more phenolic hydroxyl groups per molecule; one or more substituents of one or more kinds selected from the group consisting of a hydroxymethyl group and an alkoxymethyl group per molecule in the ortho-position of any of the phenolic hydroxyl groups; and a molecular weight of 400 to 2,500. High resolution and low line edge roughness can be obtained by setting the molecular weight of the phenolic compound (A) within the above range.

In the present invention, "phenolic hydroxy group" means a hydroxyl group directly connected to an aromatic ring such as benzene.

The phenolic compound (A) used in the present invention is needed to have two or more phenolic hydroxyl groups per molecule, and there is no limit on the number of phenolic hydroxyl groups per molecule. Preferably, the phenolic compound (A) used in the present invention is appropriately selected to have alkali solubility based on the following.

When used for a chemically amplified resist composition, it is preferable to select and use as the phenolic compound (A) one having a development rate of 0.5 nm/sec or more in a tetramethylammonium hydroxide (TMAH) aqueous solution having a concentration of 2.38% by weight (23° C.). It is more preferable to select and use one having a development rate of 1.0 nm/sec or more. Pattern shape improvement and high sensitivity can be obtained by setting the alkali development rate of the alkali-soluble resin within the above range.

When used for a non-chemically amplified resist composition, it is preferable to select and use as the phenolic compound (A) one having a development rate of 0.5 nm/sec or more in a tetramethylammonium hydroxide (TMAH) aqueous solution having a concentration of 25% by weight (23° C.). It is more preferable to select and use one having a development rate of 1.0 nm/sec or more. Pattern shape improvement can be obtained by setting the alkali development rate of the alkali-soluble resin within the above range.

For example, the development rate in a tetramethylammonium hydroxide (TMAH) aqueous solution having a concentration of 2.38% by weight (23° C.) can be obtained by the following manner, for instance: the phenolic compound (A) is used solely to obtain a 5% by weight solution, for example; a coating film is formed by applying the solution onto a silicon wafer so as to have a dry film thickness of 300 nm; the wafer is immersed in a tetramethylammonium hydroxide (TMAH) aqueous solution having a concentration of 2.38% by weight (23° C.) to measure the time required for the coating film to completely dissolve in the solution; and the development rate is calculated using the time.

The phenolic compound (A) used in the present invention is needed to have one or more substituents of one or more kinds selected from the group consisting of a hydroxymethyl group and an alkoxymethyl group per molecule in the ortho-position of any of the phenolic hydroxyl groups. When the resist composition of the present invention is used as a non-chemically amplified resist composition, the phenolic compound (A) is needed to have two or more substituents of one or more kinds selected from the group consisting of a hydroxymethyl group and an alkoxymethyl group per molecule in the ortho-position of any of the phenolic hydroxyl groups. The substituent(s) of one or more kinds selected from the group consisting of a hydroxymethyl group and an alkoxymethyl group in the ortho-position of any of the phenolic hydroxyl groups, functions as a crosslinkable group(s) of each phenolic compound. The phenolic compound (A) used in the present invention preferably has two or more, more preferably has three or more, still more preferably has four or more substituents of one or more kinds selected from the group consisting of a hydroxymethyl group and an alkoxymethyl group per molecule in the ortho-position of any of the phenolic hydroxyl groups, from the viewpoint of increasing crosslinking ability.

As the alkoxymethyl group, those that has an alkoxy group having 1 to 6 carbon atoms is preferable. More specifically, there may be mentioned a methoxymethyl group, an ethoxymethyl group, an n-propoxymethyl group, an isopropoxymethyl group, an n-butoxymethyl group, a sec-butoxymethyl group, a t-butoxymethyl group and various kinds of pentyloxymethyl groups, for example.

As the alkoxymethyl group, a methoxymethyl group and an ethoxymethyl group are particularly preferable because excellent sensitivity can be obtained.

As the crosslinkable group, one or more substituents selected from the group consisting of a hydroxymethyl group and an alkoxymethyl group in the ortho-position of any of the phenolic hydroxyl groups, are particularly preferable, from the viewpoint of high reactivity and excellent sensitivity.

As the phenolic compound (A) used in the present invention, a compound having a molecular weight of 400 to 2,500 is selected and used. If the molecular weight is less than the lower limit, there is a decrease in resist film-forming ability and pattern-forming ability. On the other hand, if the molecular weight is more than the upper limit, swelling is likely to occur due to the solvent used for the resist composition and pattern collapse is thus likely to occur; moreover, there is a possibility of deterioration in pattern shape. Here, "molecular weight" refers to the sum of atomic weights of atoms constituting the molecular. In the case of an oligomer having a molecular weight distribution, the molecular weight is represented by a weight-average molecular weight measured by GPC (polystyrene-equivalent weight-average molecular weight).

The molecular weight of the phenolic compound (A) used in the present invention is preferably 500 to 2,500, more preferably 600 to 2,000, from the viewpoint of film forming property and resolution.

The phenolic compound (A) used in the present invention preferably has a glass transition temperature (Tg) of 60° C. or more, more preferably 90° C. or more. If the glass transition temperature is 60° C. or more, dewetting is unlikely to occur when forming a coating film, and it is easy to obtain a uniform film. Dewetting is a phenomenon in which a spread coating film is melted in a post applied bake treatment to cause cissing, thereby failing to form a film uniformly.

In general, a solvent having a boiling point of 90 to 180° C. is used for resist compositions to form a uniform resist film by spin coating or the like because, when a solvent having a low boiling point is used, the resulting resist film dries too rapidly to obtain a uniform film. A resist film formed by spin coating contains a large amount of residual solvent. To remove the solvent and form a stable resist film, the resist substrate is heated on a hot plate at 90° C. or more (post applied bake). However, when a phenolic compound having a glass transition temperature of less than 60° C. is used, dewetting occurs in the post-applied bake step, and there is a possibility that a uniform film cannot be obtained. In contrast, when the phenolic compound having a glass transition temperature of 60° C. or more is used, post-applied bake is possible at high temperature and thus a uniform film is obtained. In addition, a resist film with excellent environmental tolerance (e.g., post-coating delay or PCD) is obtained. Also, it is possible to prevent pattern density dependence which arises in pattern formation by electron beams. Moreover, in a dry etching process after resist pattern formation, a pattern with excellent etching resistance (a property that prevents the pattern from melting upon etching at high temperature) is obtained.

The glass transition temperature used herein is one measured with a differential scanning calorimeter (DSC).

The phenolic compound (A) used in the present invention preferably has a solubility of 5% by weight or more at 23° C. in organic solvents having a boiling point of 80 to 180° C. In this case, it is possible to prevent a resist film from rapid drying upon spin coating, and thus there is an advantage that a uniform resist film is obtained. Typical examples of the organic solvents having a boiling point of 80 to 180° C. include cyclopentanone, propylene glycol monomethyl ether, cyclohexanone, propylene glycol monomethyl ether acetate, ethyl lactate, 2-heptanone, diethylene glycol dimethyl ether and 1-ethoxy-2-propanol.

It is particularly preferable that the phenolic compound (A) used in the present invention has a glass transition temperature of (Tg) of 60° C. or more and a solubility of 5% by weight or more at 23° C. in organic solvents having a boiling point of 80 to 180° C.

The phenolic compound (A) is not particularly limited and can be appropriately selected. As the phenolic compound (A), for example, there may be mentioned compounds represented by the following chemical formulae (1) and (3).

[Chemical Formula 1]

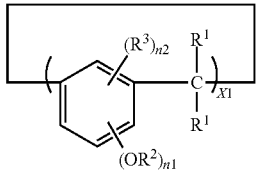

Chemical Formula (1)

In the chemical formula (1), each $R^1$ is independently one selected from the group consisting of a hydrogen atom, an alkyl group, a cycloalkyl group, an aryl group and a group represented by the following chemical formula (2), and the aryl group contained in $R^1$ can contain a hydroxyl group and one or more substituents selected from the group consisting of a hydroxymethyl group and an alkoxymethyl group; each $R^2$ is independently a hydrogen atom or a monovalent organic group; at least two $R^2$s per molecule are hydrogen atoms; $R^3$ is one selected from the group consisting of a halogen atom, an alkyl group, a cycloalkyl group, an aryl group, an alkoxy group, an acyl group, a cyano group, a nitro group, a hydroxymethyl group and an alkoxymethyl group; n1 is an integer of 1 to 3; n2 is an integer of 0 to 2; n1 and n2 are, however, selected from these ranges so as to satisfy the formula n1+n2≤4; x1 is an integer of 3 to 12; in $R^1$ and/or $R^3$, the phenolic compound (A) has one or more substituents of one or more kinds selected from the group consisting of a hydroxymethyl group and an alkoxymethyl group per molecule in the ortho-position of any of the phenolic hydroxyl groups; and groups represented by the same symbol in the chemical formula (1) can be identical or different.

[Chemical Formula 2]

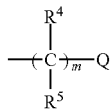

Chemical Formula (2)

In the chemical formula (2), $R^4$ and $R^5$ are each independently a hydrogen atom or an alkyl group having 1 to 3 carbon atoms; Q is an aryl group or a cycloalkyl group; m is 1 or 2.

[Chemical Formula 3]

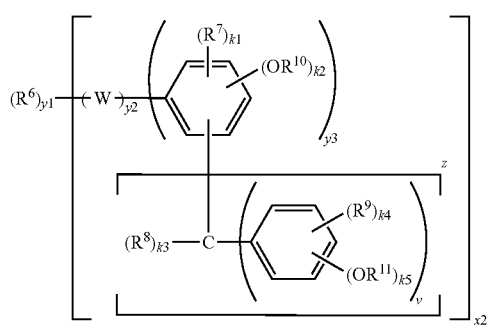

Chemical Formula (3)

In the chemical formula (3), $R^6$, $R^7$, $R^8$ and $R^9$ are each independently one selected from the group consisting of a hydrogen atom, an alkyl group, a cycloalkyl group, an aryl group, a hydroxymethyl group, an alkoxymethyl group and combinations thereof; plural $R^6$s can be bound to form a ring; plural $R^7$s can be bound to form a ring; plural $R^8$s can be bound to form a ring; plural $R^9$s can be bound to form a ring; plural $R^6$s, $R^7$s, $R^8$s and $R^9$s can be identical or different;

$R^{10}$ and $R^{11}$ are each independently a hydrogen atom or a monovalent organic group; plural $R^{10}$s and $R^{11}$s can be identical or different; at least two of $R^{10}$s and $R^{11}$s are hydrogen atoms; in $R^6$, $R^7$ and/or $R^9$, the phenolic compound (A) has one or more substituents of one or more kinds selected from the group consisting of a hydroxymethyl group and an alkoxymethyl group per molecule in the ortho-position of any of the phenolic hydroxyl groups; W is a group selected from the group consisting of a single bond, an ether bond, a thioether bond, an alkylene group which can contain a heteroatom, a cycloalkylene group which can contain a heteroatom, an arylene group which can contain a heteroatom, and combinations thereof; plural Ws can be identical or different;

x2 is a positive integer;

y1 is an integer of 0 or more and when W is a single bond, y1 is 0;

y2 is an integer of 0 or more and y3 is a positive integer;

z is an integer of 0 or more;

v is an integer of 0 or more;

k1 and k4 are a positive integer each; and k2, k3 and k5 are each independently an integer of 0 or more and satisfy the following formulae:

$$k1+k2+z=5,\ k3+v=3,\ k4+k5=5\ \text{and}\ k2+k5\geq 2.$$

In the compound represented by the chemical formula (1), the alkyl group as $R^1$ is not particularly limited; however, it is preferably an alkyl group having 1 to 18 carbon atoms. The alkyl group can be linear or branched. For example, there may be mentioned a methyl group, an ethyl group, an n-propyl group, an n-butyl group, an i-propyl group, an i-butyl group, a t-butyl group, an i-pentyl group, a t-pentyl group and a hexadecyl group. The alkyl group can have an unsaturated bond such as a double bond or triple bond.

As a substituent that the alkyl group has, there may be mentioned a hydroxyl group, an alkoxy group, a halogen atom and a halogenoalkyl group, for example.

The cycloalkyl group as $R^1$ is not particularly limited and there may be mentioned a cyclopropyl group, a cyclobutyl group, a cyclopentyl group, a cyclohexyl group and a cycloheptyl group, for example. The cycloalkyl group can have an unsaturated bond such as a double bond or triple bond and can be monocyclic or polycyclic.

As the cycloalkyl group, a cyclohexyl group is preferable.

There is no particular limit on the substituent that the cycloalkyl group has. For example, there may be mentioned an alkyl group having 1 to 5 carbon atoms, a hydroxyl group, an alkoxy group, an alkoxyalkyl group, a halogen atom and a halogenoalkyl group.

The alkyl group having 1 to 5 carbon atoms can be linear or branched. Examples of the linear alkyl group include a methyl group, an ethyl group, an n-propyl group and an n-butyl group. Examples of the branched alkyl group include an i-propyl group, an i-butyl group, a t-butyl group, an i-pentyl group and a t-pentyl group.

The alkoxy group is not particularly limited; however, it is preferably an alkoxy group having 1 to 8 carbon atoms.

For example, there may be mentioned a methoxy group, an ethoxy group, a propoxy group, a butoxy group and a 2-ethylhexyloxy group.

The alkoxyalkyl group is not particularly limited; however, it is preferably an alkoxyalkyl group having 1 to 8 carbon atoms. For example, there may be mentioned a methoxymethyl group, an ethoxymethyl group, a methoxyethyl group, an ethoxyethyl group and a methoxypropyl group.

As the halogen atom, there may be mentioned a fluorine atom, a chlorine atom, a bromine atom and an iodine atom.

The halogenoalkyl group is not particularly limited; however, it is preferably a halogenoalkyl group having 1 to 8 carbon atoms. For example, there may be mentioned a chloromethyl group, a dichloromethyl group, a trichloromethyl group, a bromomethyl group, a dibromomethyl group, a tribromomethyl group, a fluoromethyl group, a difluoromethyl group, a trifluoromethyl group, a 1-chloroethyl group, a 1-bromoethyl group, a 1-fluoroethyl group, a 1,2-dichloroethyl group and a 1,1,2,2-tetrachloroethyl group.

The aryl group as $R^1$ is not particularly limited; however, it preferably has 6 to 14 carbon atoms, more preferably 6 to 10 carbon atoms. For example, there may be mentioned a phenyl group, a naphthyl group and an anthryl group.

As the substituent that the aryl group has, there may be mentioned a hydroxymethyl group, an alkoxymethyl group, a cycloalkyl group, an alkyl group having 1 to 5 carbon atoms, a hydroxyl group, an alkoxy group, an alkoxyalkyl group, a halogen atom and a halogenoalkyl group, for example.

Examples of the cycloalkyl group as the substituent of the aryl group include those that are the same as the examples of the above-mentioned cycloalkyl group.

The cycloalkyl group can have a substituent. As the substituent, there may be mentioned an alkyl group having 1 to 5 carbon atoms, a halogen atom, a cyano group, a hydroxyl group and an alkoxy group, for example. As the alkyl group having 1 to 5 carbon atoms, there may be mentioned a methyl group, an ethyl group, an i-propyl group, for example. The alkoxy group is not particularly limited; however, it is preferably an alkoky group having 1 to 8 carbon atoms. For example, there may be mentioned a methoxy group, an ethoxy group, a propoxy group, a butoxy group and a 2-ethylhexyloxy group.

The alkyl group having 1 to 5 carbon atoms, the alkoxy group, the alkoxyalkyl group, the halogen atom, the halogenoalkyl group and the alkoxymethyl group, each of which is the substituent of the aryl group, are the same as those described above.

In the chemical formula (2), $R^4$ and $R^5$ are each independently a hydrogen atom or an alkyl group having 1 to 3 carbon atoms. The alkyl group having 1 to 3 carbon atoms can be linear or branched; however, from the viewpoint of etching resistance, it is preferably a methyl group or an ethyl group. When m is 2, two $R^4$ and $R^5$ can be each independently identical or different.

In the chemical formula (2), it is preferable that each of $R^4$ and $R^5$ is a hydrogen atom.

In the chemical formula (2), examples of the aryl group as Q include those that are the same as the examples of the above-mentioned aryl group.

Examples of the substituent that the aryl group as Q has include those that are the same as the examples of the above-mentioned substituents that the aryl group has. The substituent that the aryl group as Q has can contain a hydroxyl group and one or more substituents selected from the group consisting of a hydroxymethyl group and an alkokymethyl group. Also in the chemical formula (2), examples of the cycloalkyl group as Q include those that are the same as the examples of the above-mentioned cycloalkyl group. Examples of the substituent that the cycloalkyl group as Q has include those that are the same as the examples of the above-mentioned substituents that the cycloalkyl group has.

The monovalent organic group as $R^2$ is not particularly limited, and there may be mentioned an alkyl group, a cycloalkyl group and an aryl group.

As the alkyl group as $R^2$, there may be mentioned those that are the same as the above-mentioned examples of $R^1$. Examples of the substituent that $R^2$ has include those that are the same as the above-mentioned examples of $R^1$.

As the cycloalkyl group as $R^2$ and as the substituent that the cycloalkyl group has, there may be mentioned those that are the same as the above-mentioned examples of $R^1$. As the aryl group as $R^2$ and as the substituent that the aryl group has, there may be mentioned those that are the same as the above-mentioned examples of $R^1$.

The alkokymethyl group as $R^3$ is as described above.

As the halogen atom and alkyl group as $R^3$, there may be mentioned those that are the same as the above-mentioned examples of $R^1$.

As the substituent that the alkyl group as $R^3$ has, there may be mentioned a cycloalkyl group, an aryl group, an amino group, an amide group, an ureido group, an urethane group, a hydroxyl group, a carboxy group, a halogen atom, an alkoxy group, a thioether group, an acyl group, an acyloxy group, an alkoxycarbonyl group, a cyano group and a nitro group, for example.

As the cycloalkyl group as $R^3$ and as the substituent that the cycloalkyl group has, there may be mentioned those that are the same as the above-mentioned examples of $R^1$. As the aryl group as $R^3$ and as the substituent that the aryl group has, there may be mentioned those that are the same as the above-mentioned examples of $R^1$.

As the alkoxy group as $R^3$, there may be mentioned those that are the same as the above-mentioned examples of $R^1$.

The acyl group as $R^3$ is not particularly limited; however, it is preferably an acyl group having 1 to 8 carbon atoms. For example, there may be mentioned a formyl group, an acetyl group, a propionyl group, a butyryl group, a valeryl group, a pivaloyl group and a benzoyl group.

Also, x1 is an integer of 3 to 12, preferably an integer of 4 to 12, more preferably an integer of 4 to 8.

As long as the compound represented by the chemical formula (1) has two or more phenolic hydroxyl groups per molecule and one or more substituents of one or more kinds selected from the group consisting of a hydroxymethyl group and an alkoxymethyl group per molecule in the ortho-position of any of the phenolic hydroxyl groups, substituents represented by the same symbol in each repeating unit can be identical or different. In each repeating unit, the position of $OR^2$ and that of $R^3$ can be identical or different:

In the compound represented by the chemical formula (1), from the viewpoint of obtaining a well-shaped pattern with high sensitivity and high resolution, it is preferable that x1 is 4 and n1 is 2, and it is more preferable that x1 is 4 and n1 is 2, that is, a calix resorcinarene derivative in which four to eight of eight $R^2$s are hydrogen atoms, and the compound has one or more substituents of one or more kinds selected from the group consisting of a hydroxymethyl group and an alkoxymethyl group per molecule in the ortho-position of the hydroxy group in which $R^2$ is a hydrogen atom.

Also in the compound represented by the chemical formula (1), from the viewpoint of obtaining a well-shaped pattern with high sensitivity and high resolution, it is preferable that x1 is 4 and n1 is 2, and it is more preferable that x1 is 4 and n1 is 2, that is, a calix resorcinarene derivative in which zero to eight of eight $R^2$s are hydrogen atoms, and that the compound has, as $R^1$, and an aryl group containing a phenolic hydroxyl group and one or more substituents selected from the group consisting of a hydroxymethyl group and an alkoxymethyl group in the ortho-position of the phenolic hydroxyl group.

In the compound represented by the chemical formula (3), the alkyl group as $R^6$, $R^7$, $R^8$ and $R^9$ can be linear or branched, and it is preferably one having 1 to 10 carbon atoms such as a methyl group, an ethyl group, a propyl group, a butyl group, an isobutyl group, a hexyl group and an octyl group.

The cycloalkyl group as $R^6$, $R^7$, $R^8$ and $R^9$ can be monocyclic or polycyclic. For example, there may be mentioned a group having 5 or more carbon atoms and a monocyclo, bicyclo, tricyclo or tetracyclo structure or so on. The number of carbon atoms is preferably 6 to 30, more preferably 7 to 25, and there may be mentioned an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, for example. These alicyclic hydrocarbon groups can have a substituent.

As the aryl group as $R^6$, $R^7$, $R^8$ and $R^9$, there may be mentioned those that are the same as the above-mentioned examples of $R^1$.

As the hydroxymethyl group or alkoxymethyl group as $R^6$, $R^7$, $R^8$ and $R^9$, there may be mentioned those that are the same as the above-mentioned examples.

In the compound represented by the chemical formula (3), $R^6$ is a (x2)-valent group when (x2) is an integer of 2 or more.

As the substituent that the alkyl group, cycloalkyl group or aryl group can have, there may be mentioned a hydroxyl group, a carboxyl group, a halogen atom (a fluorine atom, a chlorine atom, a bromine atom, an iodine atom), an alkoxy group (e.g., a methoxy group, an ethoxy group, a propoxy group, a butoxy group), a hydroxymethyl group and alkoxymethyl group, for example.

As the monovalent organic group as $R^{10}$ and $R^{11}$, there may be mentioned an alkyl group, an aryl group, an aralkyl group, an alkoxy group, an alkoxycarbonyl group, an amide group and a cyano group, for example. The alkyl group is preferably an alkyl group having 1 to 10 carbon atoms or a cycloalkyl group, and there may be mentioned a methyl group, an ethyl group, a propyl group, an n-butyl group, a sec-butyl group, a hexyl group, a 2-ethylhexyl group, an octyl group, a cyclopropyl group, a cyclobutyl group, a cyclohexyl group and an adamantyl group, for example. The aryl group is preferably an aryl group having 6 to 14 carbon atoms, and there may be mentioned a phenyl group, a naphthyl group and an anthracenyl group, for example. The aralkyl group is preferably an aralkyl group having 6 to 12 carbon atoms, and there may be mentioned a benzyl group, a phenethyl group and a cumyl group, for example. The alkoxy group and the alkoxy group of the alkoxycarbonyl group are preferably an alkoxy group having 1 to 5 carbon atoms, and there may be mentioned a methoxy group, an ethoxy group, a propoxy group, an n-butoxy group and an isobutoxy group, for example.

The alkylene group as W can be linear or branched. It is preferably one having 1 to 10 carbon atoms and there may be mentioned a methylene group, an ethylene group, a propylene group, a butylene group and an isobutylene group, for example.

The cycloalkylene group as W can be monocyclic or polycyclic. As the alkylene group comprising the ring, there may be mentioned a cycloalkylene group having 3 to 8 carbon atoms (such as a cyclopentylene group or a cyclohexylene group).

The alkylene group and cycloalkylene group as W can have a substituent. Examples of the substituent include an alkyl group (preferably one having 1 to 10 carbon atoms, such as a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group and a decyl group), an alkoxy group (preferably one having 1 to 4 carbon atoms, such as a methoxy group, an ethoxy group, a propoxy group and a butoxy group), a fluorine atom, a chlorine atom, a bromine atom and an iodine atom.

The alkylene chain or cycloalkylene chain can contain —O—, —OC(=O)—, —OC(=O)O—, —N(R)—C(=O)—, —N(R)—C(=O)O—, —S—, —SO— and/or —$SO_2$— in the chain. Herein, R is a hydrogen atom or an alkyl group (preferably one having 1 to 10 carbon atoms, such as a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group and a decyl group).

The cyclic arylene group as W is preferably one having 6 to 15 carbon atoms, such as a phenylene group, a tolylene group and a naphthylene group.

Specific examples of the phenolic compound (A) are shown below. The present invention is not limited to these examples, however. The following phenolic hydroxyl group examples can be protected by an organic group if two or more phenolic hydroxyl groups are present per molecule and the compound has one or more substituents of one or more kinds selected from the group consisting of a hydroxymethyl group and an alkoxymethyl group per molecule in the ortho-position of any of the phenolic hydroxyl groups.

In the following formulae, each L is independently a hydrogen atom or the substituent selected from the group consisting of a hydroxymethyl group and an alkoxymethyl group, and at least one L per molecule is the substituent selected from the group consisting of a hydroxymethyl group and an alkoxymethyl group at the ortho-position of the phenolic hydroxyl group. The molecular weight is 400 to 2,500.

[Chemical Formula 4]

Chemical Formula (a-1)

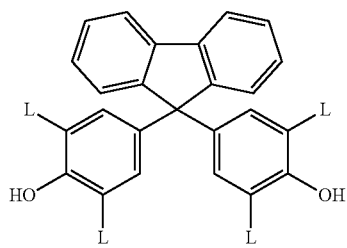

-continued
Chemical Formula (a-2)
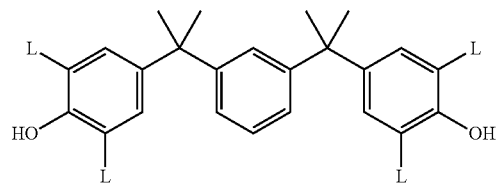
Chemical Formula (a-3)
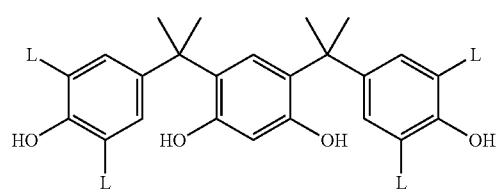
Chemical Formula (a-4)
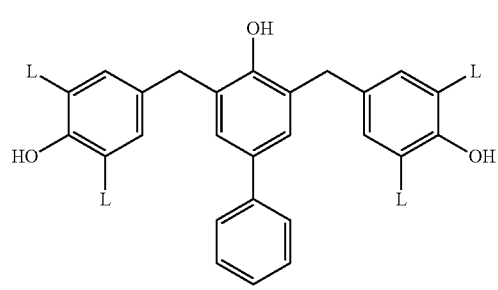
Chemical Formula (a-5)
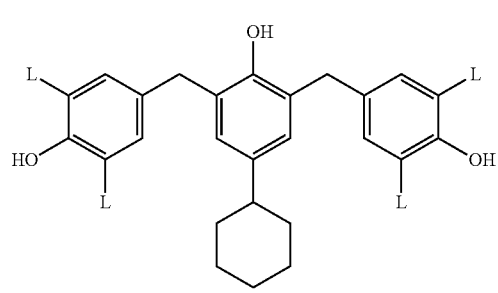
Chemical Formula (a-6)
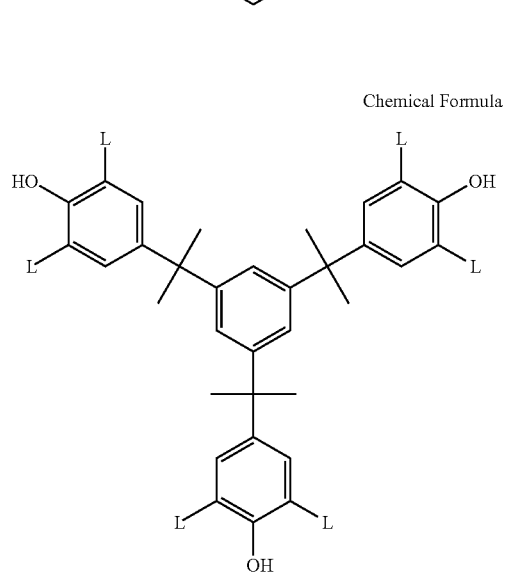
Chemical Formula (a-7)
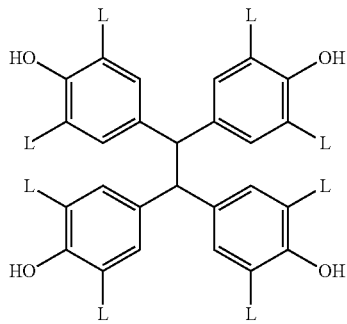
Chemical Formula (a-8)
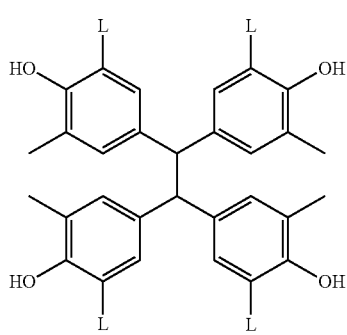
Chemical Formula (a-9)
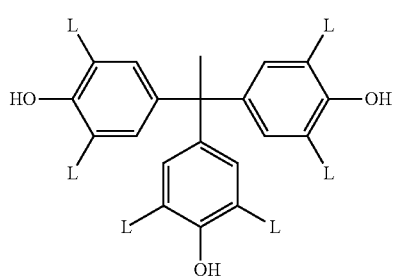
Chemical Formula (a-10)
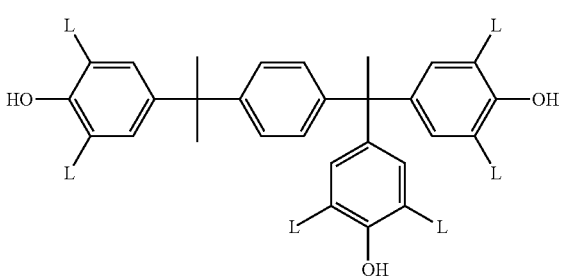

Chemical Formula (a-11)
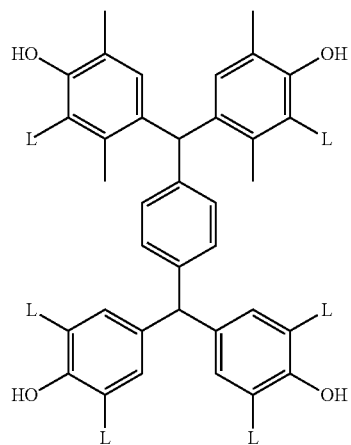
Chemical Formula (a-14)
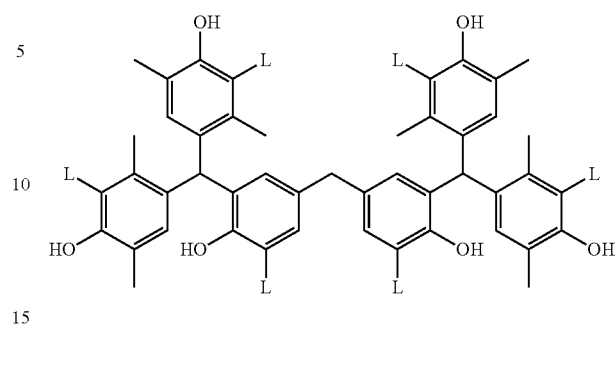
Chemical Formula (a-12)
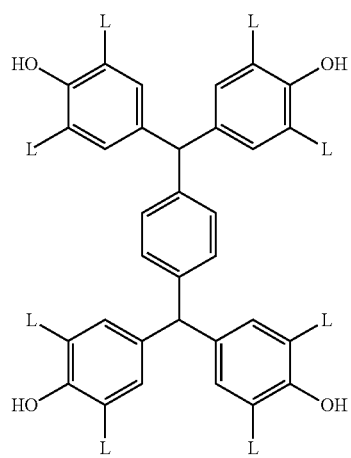
[Chemical Formula 5]
Chemical Formula (a-15)
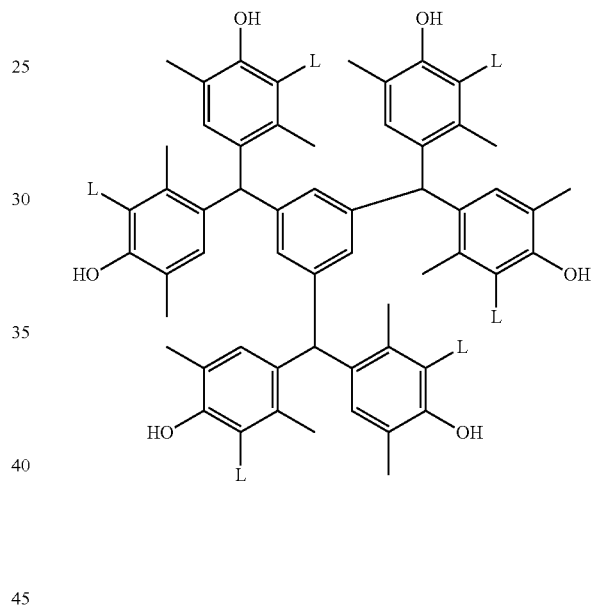
Chemical Formula (a-13)
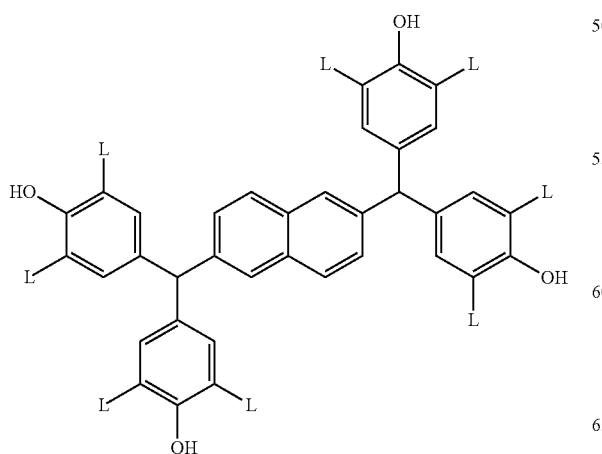
Chemical Formula (a-16)
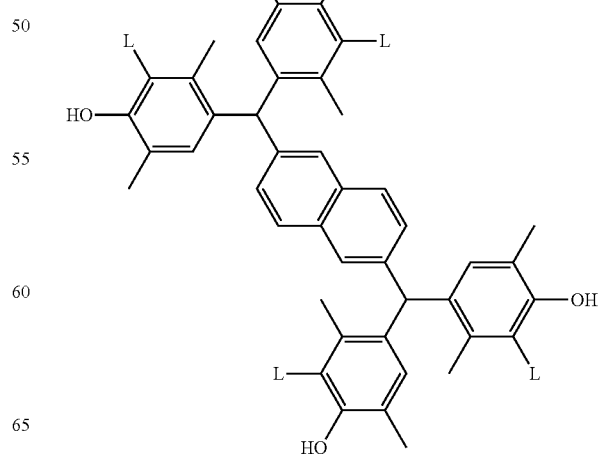

Chemical Formula (a-17)
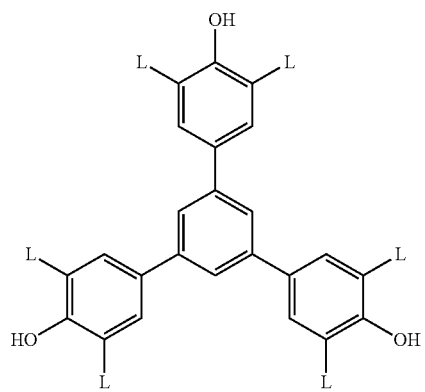
Chemical Formula (a-18)
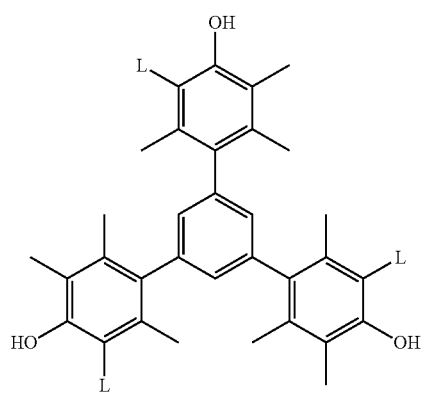
Chemical Formula (a-19)
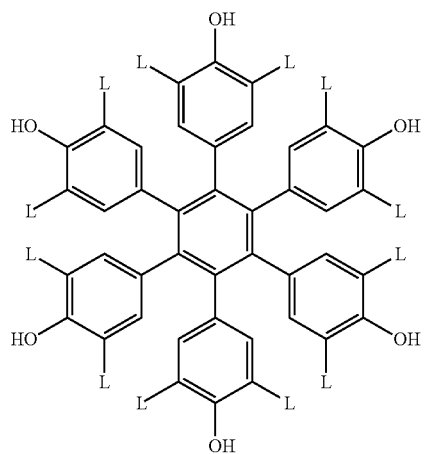
Chemical Formula (a-20)
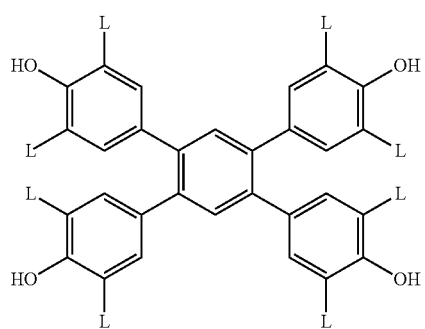
Chemical Formula (a-21)
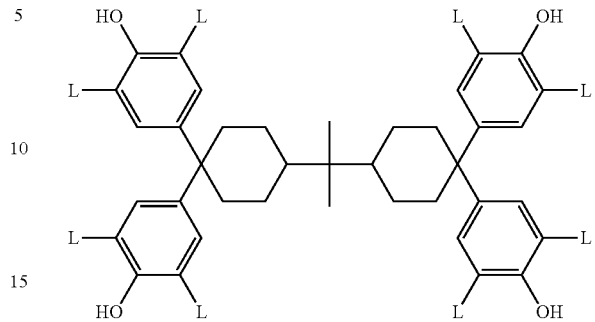
Chemical Formula (a-22)
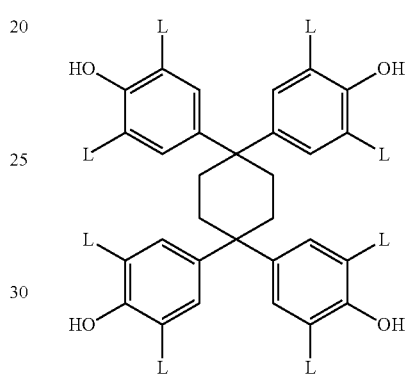
[Chemical Formula 6]
Chemical Formula (a-23)
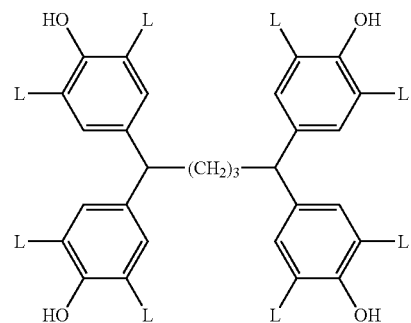
Chemical Formula (a-24)
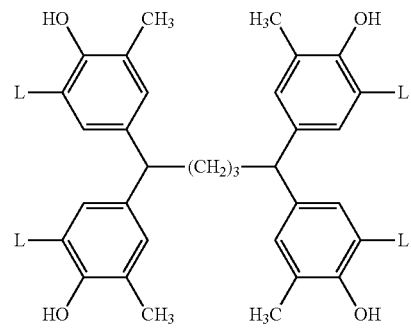

Chemical Formula (a-25)
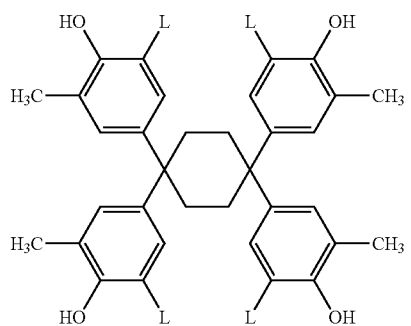
Chemical Formula (a-26)
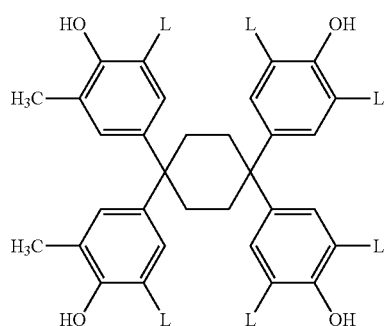
Chemical Formula (a-27)
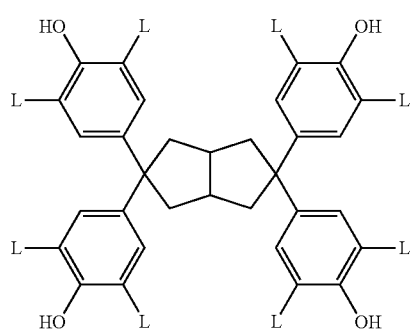
Chemical Formula (a-28)
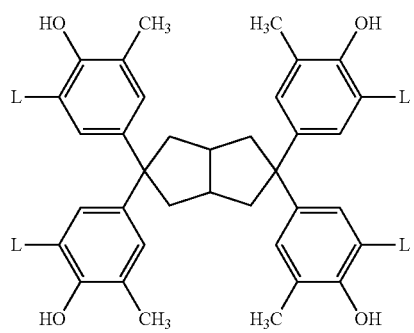
Chemical Formula (a-29)
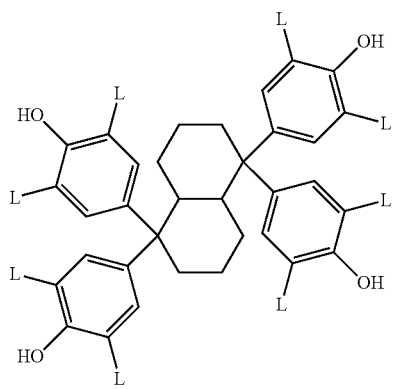
Chemical Formula (a-30)
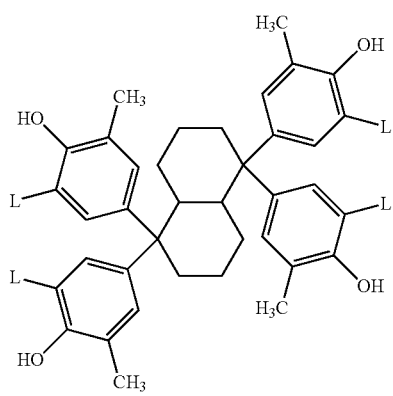
Chemical Formula (a-31)
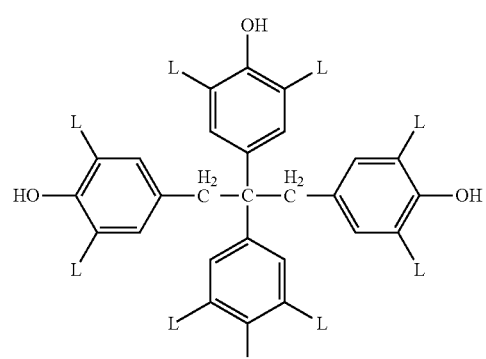
Chemical Formula (a-32)
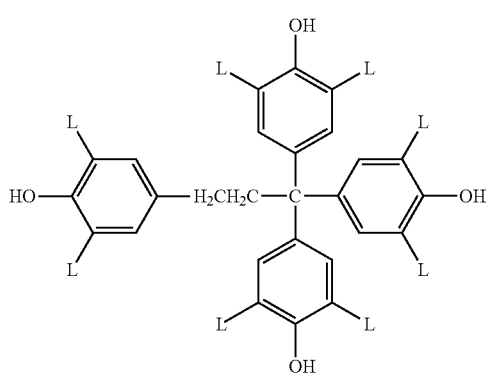

Chemical Formula (a-33)
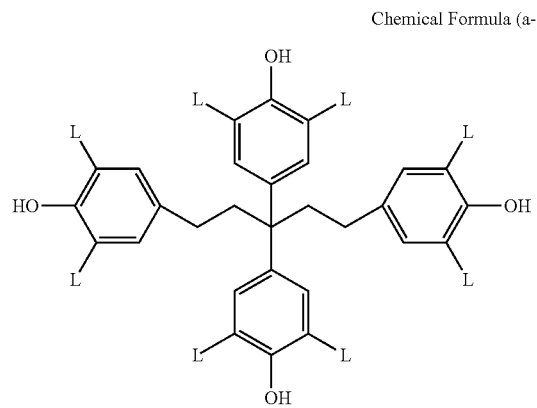
Chemical Formula (a-36)
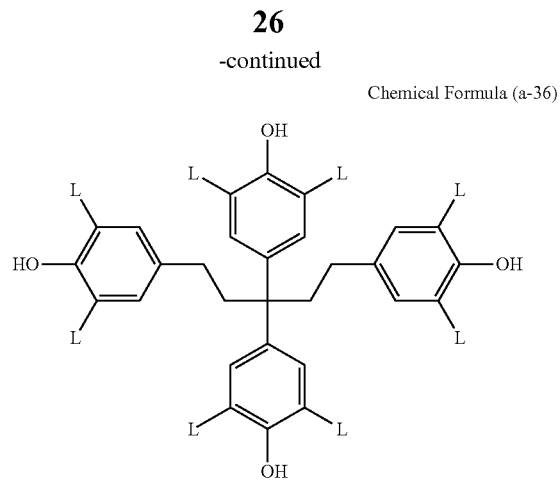
Chemical Formula (a-34)
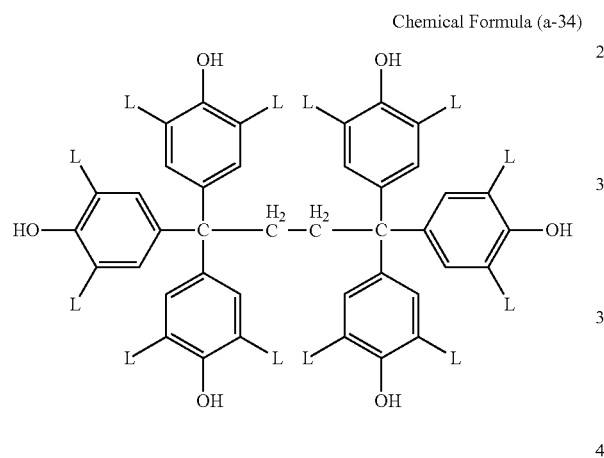
Chemical Formula (a-37)
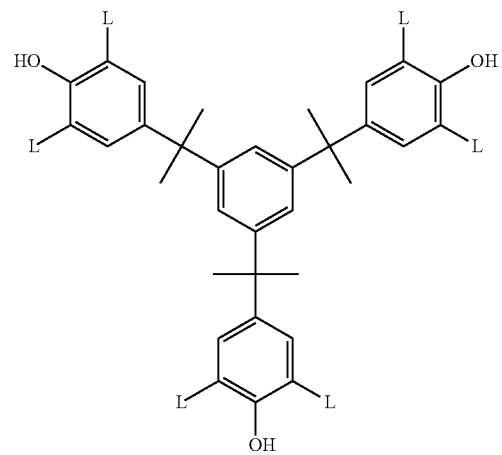
[Chemical Formula 7]
Chemical Formula (a-35)
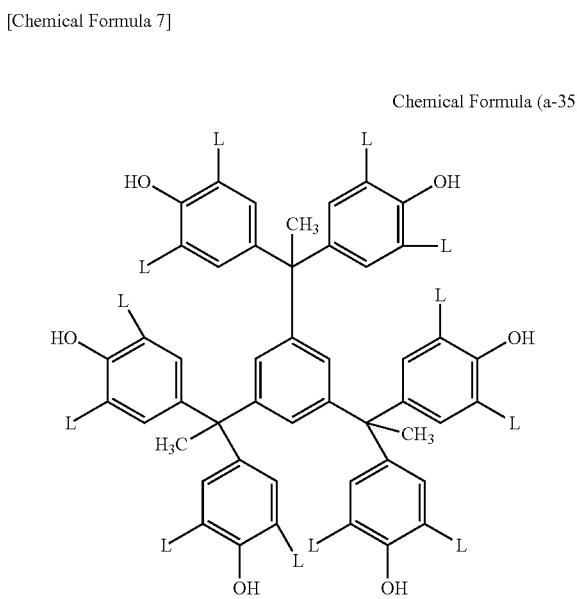
Chemical Formula (a-38)
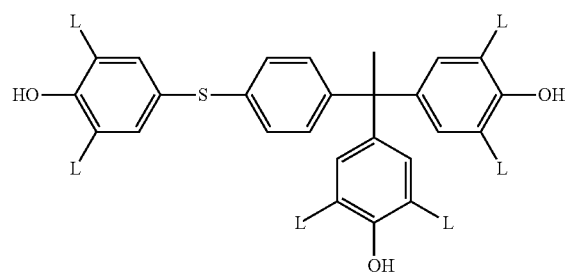
Chemical Formula (a-39)
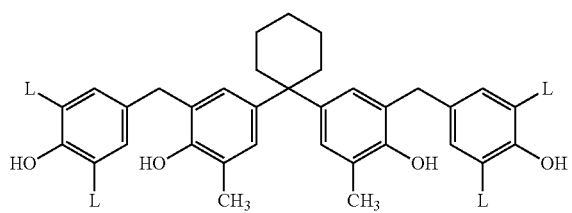

Chemical Formula (a-40)

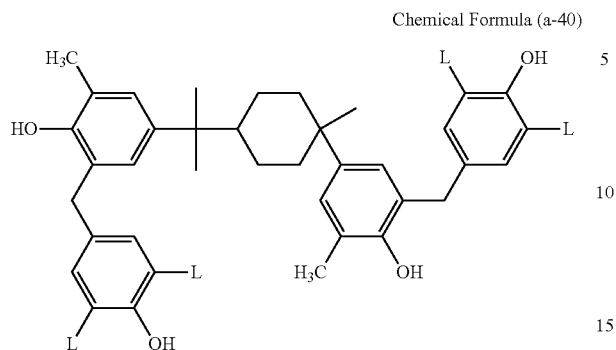

[Chemical Formula 8]

Chemical Formula (a-41)

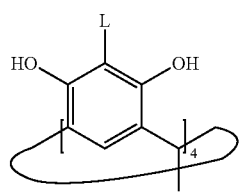

Chemical Formula (a-42)

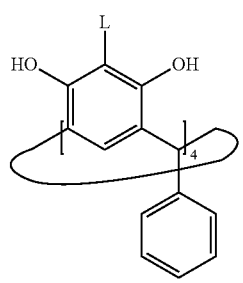

Chemical Formula (a-43)

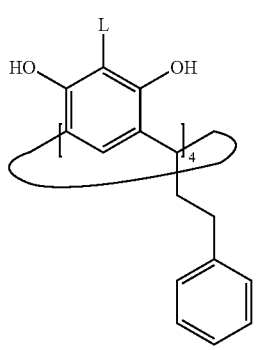

Chemical Formula (a-44)

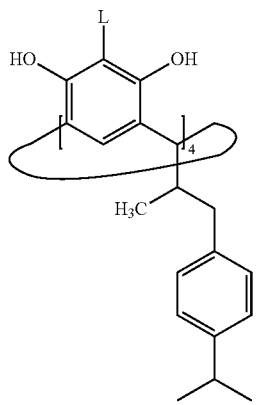

Chemical Formula (a-45)

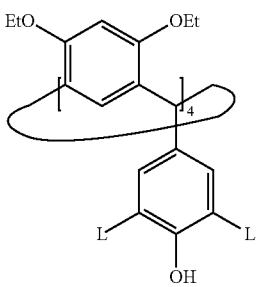

Chemical Formula (a-46)

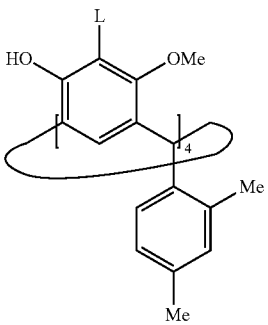

Chemical Formula (a-47)

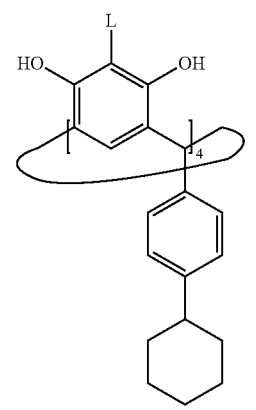

The phenolic compound (A) used in the present invention can be obtained by incorporating one or more substituents of one or more kinds selected from the group consisting of a hydroxymethyl group and an alkoxymethyl group per molecule into the ortho-position of any of the phenolic hydroxyl groups of the parent compound of the phenolic compound.

As the method for incorporating the substituent which functions as a crosslinkable group into the parent compound of the phenolic compound, for example, there may be mentioned a reaction of the phenolic compound having no corresponding hydroxymethyl group with formaldehyde in the presence of a basic catalyst. In this case, to prevent a side reaction such as gelation, it is preferable to develop the reaction at a reaction temperature of 50° C. or less. Various kinds of bisphenol derivatives having an alkoxymethyl group can be obtained by reacting a bisphenol derivative having the corresponding hydroxymethyl group with alcohol in the presence of an acid catalyst. In this case, to prevent a side reaction such as gelation, it is preferably to develop the reaction at a reaction temperature of 100° C. or less.

The parent compound of the phenolic compound (A) is commercially available from Honshu Chemical Industry Co., Ltd., Asahi Organic Chemicals Industry Co., Ltd., etc., and commercially available products can be used. Moreover, the parent compounds can be synthesized by condensation of any phenolic compound and any aldehyde or ketone.

In the negative resist composition of the present invention, the above-mentioned compounds can be used solely or in combination of two or more kinds as the polyphenol compound (A).

However, in the negative resist composition of the present invention, from the viewpoint of improving low line edge roughness, the phenolic compound (A) is preferably such that the purity of compounds represented by the same structural formula is 70% by weight or more. The purity is more preferably 80% by weight or more, still more preferably 90% by weight or more.

Line edge roughness is expected to be decreased because the development is homogeneously progressed when compounds represented by the same structural formula and having high purity are used as the phenolic compound (A).

However, even if the purity of compounds represented by the same structural formula is less than the above value, the phenolic compound (A) can be suitably used when the structure of impurities is similar to the phenolic compound (A) and compatibility thereof is excellent.

Therefore, the phenolic compound used in the present invention preferably has no molecular weight distribution. Even if the phenolic compound used in the present invention has a molecular weight distribution, the molecular weight distribution is preferably small, and the molecular weight distribution (the ratio of weight average molecular weight "Mw" to number average molecular weight "Mn") is preferably 1.0 to 1.1.

When the resist composition of the present invention is a chemically amplified resist composition, the phenolic compound (A) is 70% by weight or more of the total solid content of the negative resist composition, preferably 75% by weight or more, and more preferably 80% by weight or more. Because the composition comprises at least the below-mentioned acid generator (B), the upper limit is preferably 98% by weight or less of the total solid content of the resist composition.

When the resist composition of the present invention is a non-chemically amplified resist composition, the phenolic compound (A) is 70% by weight or more of the total solid content of the negative resist composition, preferably 80% by weight or more, more preferably 90% by weight or more.

In the present invention, "solid content" means the content of components excluding an organic solvent in the negative resist composition.

<Acid Generator (B) which Directly or Indirectly Produces Acid by Exposure to Active Energy Rays Having a Wavelength of 248 nm or Less>

In the present invention, the acid generator (B) which is used for the chemically amplified resist composition and directly or indirectly produces acid by exposure to active energy rays having a wavelength of 248 nm or less, can be selected from known acid generators without any particular limitation, which are used for conventional, chemically-amplified resist compositions.

The acid generator (B) is preferably at least one kind selected from the group consisting of compounds represented by the following chemical formulae (4) to (9).

[Chemical Formula 9]

Chemical Formula (4)

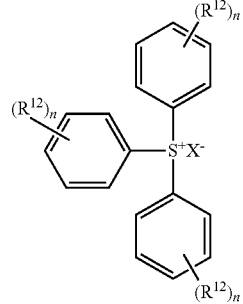

In the chemical formula (4), $R^{12}$s may be identical or different and are each independently one kind selected from the group consisting of a hydrogen atom, a linear alkyl group having 1 to 12 carbon atoms, a branched alkyl group having 3 to 12 carbon atoms, a cyclic alkyl group having 3 to 12 carbon atoms, a linear alkoxy group having 1 to 12 carbon atoms, a branched alkoxy group having 3 to 12 carbon atoms, a cyclic alkoxy group having 3 to 12 carbon atoms, a branched alkoxycarbonylalkoxy group having 5 to 10 carbon atoms, a hydroxyl group and a halogen atom; moreover, $X^-$ is a sulfonate ion or halide ion having one kind selected from the group consisting of an alkyl group having 1 to 12 carbon atoms, an aryl group having 6 to 12 carbon atoms, a halogen-substituted alkyl group having 1 to 12 carbon atoms, and a halogen-substituted aryl group having 6 to 12 carbon atoms. Also, n is an integer of 0 to 5.

Examples of the compound represented by the chemical formula (4) include triphenylsulfonium trifluoromethylsulfonate, triphenylsulfonium nonafluoro-n-butanesulfonate, triphenylsulfonium cyclohexafluoropropane-1,3-bis(sulfonyl)imide, triphenylsulfonium nonafluorobutanesulfonate, triphenylsulfonium perfluoro-n-octanesulfonate, diphenyl-4-methylphenylsulfonium trifluoromethanesulfonate, diphenyl-2,4,6-trimethylphenylsulfonium trifluoromethanesulfonate, diphenyl-2,4,6-trimethylphenylsulfonium p-toluenesulfonate, diphenyl-4-t-butoxyphenylsulfonium trifluoromethanesulfonate, diphenyl-4-t-butoxyphenylsulfonium nonafluoro-n-butanesulfonate, diphenyl-4-hydroxyphenylsulfonium trifluoromethanesulfonate, bis(4-fluorophenyl)-4-hydroxyphenylsulfonium trifluoromethanesulfonate, diphenyl-3,5-dimethyl-4-hydroxyphenylsulfonium nonafluoro-n-butanesulfonate, diphenyl-4-hydroxyphenylsulfonium nonafluoro-n-butanesulfonate, bis(4-hydroxyphenyl)-phenylsulfonium trifluoromethanesulfonate, bis(4-hydroxyphenyl)-t-pentylphenylsulfonium trifluoromethanesulfonate, tris(4- methoxyphenyl)sulfonium trifluoromethanesulfonate, tris (4-fluorophenyl)sulfonium trifluoromethanesulfonate, triphenylsulfonium-p-toluenesulfonate, triphenylsulfonium benzenesulfonate, diphenyl-2,4,6-trimethylphenyl-p-toluenesulfonate, diphenyl-2,4,6-trimethylphenylsulfonium-2-trifluoromethylbenzenesulfonate, diphenyl-2,4,6-trimethylphenylsulfonium-4-trifluoromethylbenzenesulfonate, diphenyl-2,4,6-trimethylphenylsulfonium-2,4-difluorobenzenesulfonate, diphenyl-2,4,6-trimethylphenylsulfonium hexafluorobenzenesulfonate, diphenylnaphthylsulfonium trifluoromethanesulfonate, diphenyl-4-hydroxyphenylsulfonium-p-toluenesulfonate, triphenylsulfonium 10-camphorsulfonate, diphenyl-4-hydroxyphenylsulfonium 10-camphorsulfonate, (4-t-butoxycarbonylmethoxyphenyl) diphenylsulfonium-4-trifluoromethylbenzenesulfonate, 2,4-di(t-butoxycarbonylmethoxy)phenyl diphenylsulfonium-4-trifluoromethylbenzenesulfonate, (4-t-butoxycarbonylmethoxyphenyl)diphenylsulfonium-2,4,6-tris(trifluoromethyl)benzenesulfonate, and 2,4-di(t-butoxycarbonylmethoxy)phenyldiphenylsulfonium-2,4,6-tris(trifluoromethyl)benzenesulfonate.

Chemical Formula (10)

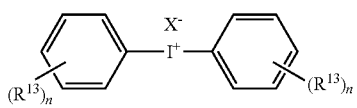

Chemical Formula (5)

In the chemical formula (5), $X^-$, $R^{13}$ and n are the same as $X^-$, $R^{12}$ and n of the chemical formula (4), respectively.

Examples of the compound represented by the chemical formula (5) include bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium p-toluenesulfonate, bis(4-t-butylphenyl)iodonium benzenesulfonate, bis(4-t-butylphenyl)iodonium-2-trifluoromethylbenzenesulfonate, bis(4-t-butylphenyl)iodonium-4-trifluoromethylbenzenesulfonate, bis(4-t-butylphenyl)iodonium-2,4-difluorobenzenesulfonate, bis(4-t-butylphenyl)iodonium hexafluorobenzenesulfonate, bis(4-t-butylphenyl)iodonium 10-camphorsulfonate, diphenyliodonium trifluoromethanesulfonate, diphenyliodonium nonafluoro-n-butanesulfonate, diphenyliodonium perfluoro-n-octanesulfonate, diphenyliodonium p-toluenesulfonate, diphenyliodonium benzenesulfonate, diphenyliodonium 10-camphorsulfonate, diphenyliodonium-2-trifluoromethylbenzenesulfonate, diphenyliodonium-4-trifluoromethylbenzenesulfonate, diphenyliodonium-2,4-difluorobenzenesulfonate, diphenyliodonium hexafluorobenzenesulfonate, bis(4-trifluoromethylphenyl)iodonium trifluoromethanesulfonate, bis(4-trifluoromethylphenyl)iodonium nonafluoro-n-butanesulfonate, bis(4-trifluoromethylphenyl)iodonium perfluoro-n-octanesulfonate, bis(4-trifluoromethylphenyl)iodonium p-toluenesulfonate, bis(4-trifluoromethylphenyl)iodonium benzenesulfonate, and bis(4-trifluoromethylphenyl)iodonium 10-camphorsulfonate.

[Chemical Formula 11]

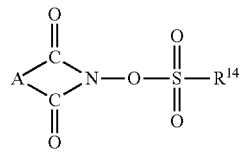

Chemical Formula (6)

In the chemical formula (6), A is an alkylene group having 1 to 12 carbon atoms, an arylene group having 6 to 12 carbon atoms or an alkyleneoxy group having 1 to 12 carbon atoms (—R'—O—; however, R' is an alkylene group having 1 to 12 carbon atoms), and $R^{14}$ is an alkyl group having 1 to 12 carbon atoms, an aryl group having 6 to 12 carbon atoms, a halogen-substituted alkyl group having 1 to 12 carbon atoms, or a halogen-substituted aryl group having 6 to 12 carbon atoms.

Examples of the compound represented by the chemical formula (6) include N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-en-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-en-2,3-dicarboximide, N-(10-camphorsulfonyloxy)naphthylimide, N-(n-octanesulfonyloxy)bicyclo[2.2.1]hept-5-en-2,3-dicarboximide, N-(n-octanesulfonyloxy)naphthylimide, N-(p-toluenesulfonyloxy)bicyclo[2.2.1]hept-5-en-2,3-dicarboximide, N-(p-toluenesulfonyloxy)naphthylimide, N-(2-trifluoromethylbenzenesulfonyloxy)bicyclo[2.2.1]hept-5-en-2,3-dicarboximide, N-(2-trifluoromethylbenzenesulfonyloxy)naphthylimide, N-(4-trifluoromethylbenzenesulfonyloxy)bicyclo[2.2.1]hept-5-en-2,3-dicarboximide, N-(4-trifluoromethylbenzenesulfonyloxy)naphthylimide, N-(perfluorobenzenesulfonyloxy)bicyclo[2.2.1]hept-5-en-2,3-dicarboximide, N-(perfluorobenzenesulfonyloxy)naphthylimide, N-(1-naphthalenesulfonyloxy)bicyclo[2.2.1]hept-5-en-2,3-dicarboximide, N-(1-naphthalenesulfonyloxy)naphthylimide, N-(nonafluoro-n-butanesulfonyloxy)bicyclo[2.2.1]hept-5-en-2,3-dicarboximide, N-(nonafluoro-n-butanesulfonyloxy)naphthylimide, N-(perfluoro-n-octanesulfonyloxy)bicyclo[2.2.1]hept-5-en-2,3-dicarboximide, and N-(perfluoro-n-octanesulfonyloxy)naphthylimide.

[Chemical Formula 12]

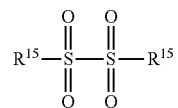

Chemical Formula (7)

In the chemical formula (7), $R^{15}$s can be identical or different and are each independently one kind selected from the group consisting of a linear alkyl group having 1 to 12 carbon atoms, a branched alkyl group having 3 to 12 carbon atoms, a cyclic alkyl group having 3 to 12 carbon atoms, an aryl group having 6 to 12 carbon atoms, a heteroaryl group having 3 to 12 carbon atoms, and an aralkyl group having 7 to 12 carbon atoms. Each substituent can be substituted with an alkyl group having 1 to 12 carbon atoms, a hydroxyl group, a halogen atom or a haloalkyl group having 1 to 12 carbon atoms.

Examples of the compound represented by the chemical formula (7) include diphenyl disulfone, di(4-methylphenyl) disulfone, dinaphthyl disulfone, di(4-t-butylphenyl)disulfone, di(4-hydroxyphenyl) disulfone, di(3-hydroxynaphthyl) disulfone, di(4-fluorophenyl)disulfone, di(2-fluorophenyl) disulfone, and di(4-trifluoromethylphenyl)disulfone.

[Chemical Formula 13]

Chemical Formula (8)

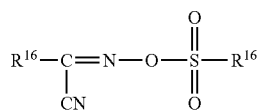

In the chemical formula (8), $R^{16}$s can be identical or different and are each independently one kind selected from the group consisting of a linear alkyl group having 1 to 12 carbon atoms, a branched alkyl group having 3 to 12 carbon atoms, a cyclic alkyl group having 3 to 12 carbon atoms, an aryl group having 6 to 12 carbon atoms, a heteroaryl group having 3 to 12 carbon atoms, and an aralkyl group having 7 to 12 carbon atoms. Each substituent can be substituted with an alkyl group having 1 to 12 carbon atoms, a halogen atom or an alkoxy group having 1 to 12 carbon atoms.

Examples of the compound represented by the chemical formula (8) include α-(methylsulfonyloxyimino)-phenylacetonitrile, α-(methylsulfonyloxyimino)-4-methoxyphenylacetonitrile, α-(trifluoromethylsulfonyloxyimino)-phenylacetonitrile, α-(trifluoromethylsulfonyloxyimino)-4-methoxyphenylacetonitrile, α-(ethylsulfonyloxyimino)-4-methoxyphenylacetonitrile, α-(propylsulfonyloxyimino)-4-methylphenylacetonitrile, and α-(methylsulfonyloxyimino)-4-bromophenylacetonitrile.

[Chemical Formula 14]

Chemical Formula (9)

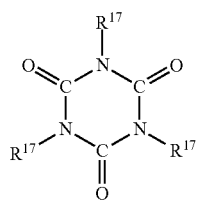

In the chemical formula (9), $R^{17}$s can be identical or different and are each independently an alkyl halide group having one or more chlorine atoms and one or more bromine atoms. The alkyl halide group preferably has 1 to 5 carbon atoms.

Examples of the compound represented by the chemical formula (9) include a monochloroisocyanuric acid, a monobromoisocyanuric acid, a dichloroisocyanuric acid, a dibromoisocyanuric acid, a trichloroisocyanuric acid and a tribromoisocyanuric acid.

Other examples of the acid generator (B) include bissulfonyldiazomethanes such as bis(p-toluenesulfonyl)diazomethane, bis(2,4-dimethylphenylsulfonyl)diazomethane, bis(t-butylsulfonyl)diazomethane, bis(n-butylsulfonyl)diazomethane, bis(isobutylsulfonyl)diazomethane, bis(isopropylsulfonyl)diazomethane, bis(n-propylsulfonyl)diazomethane and bis(cyclohexylsulfonyl)diazomethane, and halogen-containing triazine derivatives such as 2-(4-methoxyphenyl)-4,6-(bistrichloromethyl)-1,3,5-triazine, 2-(4-methoxynaphthyl)-4,6-(bistrichloromethyl)-1,3,5-triazine, tris(2,3-dibromopropyl)-1,3,5-triazine, and tris(2,3-dibromopropyl)isocyanurate.

These acid base generators (B) can be used solely or in combination of two or more kinds.

When the resist composition of the present invention is a chemically amplified resist composition, the content of the acid base generator (B) is preferably 1 to 30 parts by weight, more preferably 1 to 25 parts by weight, still more preferably 5 to 20 parts by weight, with respect to 100 parts by weight of the phenolic compound (A). If the content is smaller than this range, there is a possibility that image formation is impossible. If the content is larger than this range, there is a possibility that a uniform resist solution cannot be obtained and there is a decrease in storage stability.

Therefore, the content of the acid generator (B) is preferably 2 to 30% by weight of the total solid content of the resist composition, more preferably 4 to 20% by weight.

On the other hand, when used as a non-chemically amplified resist composition, the negative resist composition of the present invention substantially comprises no photoacid generator. "Substantially comprises no acid generator" means that the resist composition does not comprise a photoacid generator enough to substantially function as a chemically amplified resist composition. When the negative resist composition of the present invention is a non-chemically amplified resist composition, as a guideline, the content of the photoacid generator is less than 1 part by weight with respect of 100 parts by weight of the phenolic compound (A), and the content is less than 2% by weight of the total solid content of the resist composition.

<Organic Basic Compound (C)>

When the negative resist composition of the present invention is a chemically-amplified resist composition, because the negative resist composition comprises the acid generator (B), it is preferable to use an organic basic compound (C) further, in order to improve resist pattern shape and to increase temporal stability during storage. As the organic basic compound (C), any one can be selected from known organic basic compounds and used.

As the organic basic compound (C), for example, there may be mentioned nitrogen-containing organic compounds such as a nitrogen-containing compound having a nitrogen atom, an amide group-containing compound, a urea compound and a nitrogen-containing heterocyclic compound. However, the organic basic compound (D) is not limited to these examples. Also preferably used are the nitrogen-containing organic compounds containing a polar group in the chain thereof, such as an ether bond, a carbonyl bond, an ester bond, a carbonate bond, a sulfide bond or a sulfone bond, and the nitrogen-containing organic compounds containing a polar group as a substituent, such as an ester group, an acetal group, a cyano group, an alkoxy group or a hydroxyl group.

Examples of the nitrogen-containing organic compounds include mono(cyclo) alkylamines such as n-hexylamine, n-heptylamine, n-octylamine, n-nonylamine, n-decylamine, n-dodecylamine and cyclohexylamine; di(cyclo)alkylamines such as di-n-butylamine, di-n-pentylamine, di-n-hexylamine, di-n-heptylamine, di-n-octylamine, di-n-nonylamine, di-n-decylamine, methyl-n-dodecylamine, di-n-dodecylmethylamine, cyclohexylmethylamine and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, dimethyl-n-dodecylamine, di-n-dodecylmethylamine, dicyclohexylmethylamine and tricyclohexylamine; alkanolamines such as monoethanolamine, diethanolamine and triethanolamine; aromatic amines such as aniline, N-methylaniline, N,N-dimethylaniline, 2-methylaniline, 3-methylaniline, 4-methylaniline, 4-nitroaniline, diphenylamine, triphenylamine, tribenzylamine and 1-naphthylamine; ethylenediamine, N,N,N',N'-tetramethylethylenediamine, N,N,N',N'-tetrakis(2-hydroxypropyl)ethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis[1-(4-aminophenyl)-1-methylethyl]benzene, 1,3-bis[1-(4-aminophenyl)-1-methylethyl]benzene, polyethyleneimine, 2,2-(phenylimino)diethanol, polyallylamine and a polymer of N-(2-dimethylaminoethyl)acrylamide; and tris(2-acetoxyethyl)amine, tris(2-pivaloyloxyethyl)amine, tris(2-t-butoxycarbonyloxyethyl)amine, tris[2-(2-oxopropoxy)ethyl]amine, tris[2-(methoxycarbonylmethyl)oxyethyl]amine, tris[2-(t-butoxycarbonylmethyloxy)ethyl]amine, tris[2-(2-methoxyethoxy)ethyl]amine, N-[2-(methylsulfonyl)ethyl]bis(2-acetoxyethyl)amine, N-[2-(methylsulfonyl)ethyl]bis(2-formyloxyethyl)amine, N-[2-(methylsulfonyl)ethyl]bis(2-methoxyethyl)amine, dimethyl 3,3'-[2-(methylsulfonyl)ethyl]iminodipropionate, N-(tetrahydrofurfuryl)bis[2-(methylsulfonyl)ethyl]amine, t-butyl 3-[bis(2-methoxyethyl)amino]propionate and t-butyl 3-[bis(2-acetoxyethyl)amino]propionate.

Examples of the amide group-containing compound include formamide, N-methylformamide, N,N-dimethylformamide, acetamide, N-methylacetamide, N,N-dimethylacetamide, propionamide, benzamide, pyrrolidone and N-methylpyrrolidone.

Examples of the urea compound include urea, methylurea, 1,1-dimethylurea, 1,3-dimethylurea, 1,1,3,3-tetramethylurea, 1,3-diphenylurea and tri-n-butylthiourea.

Examples of the nitrogen-containing heterocyclic compound include imidazoles such as imidazole, benzimidazole, 4-methylimidazole, 4-methyl-2-phenylimidazole, 2-phenylbenzimidazole, 4,5-diphenylimidazole and 2,4,5-triphenylimidazole; pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 8-oxyquinoline and acridine; and pyrazine, pyrazole, pyridazine, quinozaline, purine, pyrrolidine, piperidine, morpholine, 4-methylmorpholine, piperazine, 1,4-dimethylpiperazine, 1,4-diazabicyclo[2.2.2]octane, 1-[2-(methoxymethoxy)ethyl]pyrrolidine, 1-[2-(2-methoxyethoxy)methoxy]ethyl]pyrrolidine, 1-[2-(2-methoxyethoxy)methoxy]ethyl]piperidine, 4-[2-(methoxymethoxy)ethyl]morpholine, 4-[2-(2-methoxyethoxy)methoxy]ethyl]morpholine 1-(2',3'-dihydroxylpropyl)-2-methylimidazole, 1,3-di(2'-methyl-1'-imidazoylmethyl)benzene, 1-benzyl-2-methylimidazole, 1-benzylimidazole, 2-(1H-benzimidazole-1-yl)ethyl acetate, 2-(2-phenyl-1H-benzimidazole-1-yl)ethyl acetate, methyl 3-(2-phenyl-1H-benzimidazole-1-yl)propionate, 1-[2-(1,3-dioxolan-2-yl)ethyl]1H-benzimidazole, 4-(1H-benzimidazole-1-yl)butyronitrile, t-butyl 3-morpholinopropionate, t-butyl 3-piperidinopropionate, 1-ethylcyclopentyl 3-piperidinopropionate, and 1-ethyl 2-norbornyl 3-piperidinopropionate.

These organic basic compounds (C) can be used solely or in combination of two or more kinds. The content of the organic basic compound (C) is 0.01 to 10 parts by weight, preferably 0.1 to 5 parts by weight, with respect to 100 parts by weight of the phenolic compound (A). If the content is less than 0.01 part by weight, no effect is obtained by the addition of the organic basic compound (C). On the other hand, if the content exceeds 10 parts by weight, there tends to be a decrease in sensitivity or a deterioration in developing properties of the unexposed portion.

<Other Components>

Because of using the above-specified phenolic compound (A), the negative resist composition of the present invention does not need to comprise a phenolic compound having no hydroxymethyl group or alkoxymethyl group. A phenolic compound not corresponding to the phenolic compound (A) of the present invention, such as a phenolic compound having no hydroxymethyl group or alkoxymethyl group, can be contained within the range in which the effects of the present invention are not reduced. However, from the viewpoint of low line edge roughness, it is preferable that such a compound is not contained in the negative resist composition of the present invention.

Also, because of using the above-specified phenolic compound (A), the negative resist composition of the present invention does not need to comprise a conventionally-used crosslinking agent. However, it is allowed to add a small amount of crosslinking agent, which is in the range in which the effects of the present invention are not reduced, in order to achieve high sensitivity or increase pattern strength for improvement in resolution. The content of such a crosslinking agent is 10% by weight or less of the total solid content of the resist composition, and more preferably, a target of the content can be 5% by weight or less. From the viewpoint of low line edge roughness, it is preferable that such a crosslinking agent is not contained in the negative resist composition of the present invention.

The crosslinking agent not corresponding to the above-specified phenolic compound (A) is not particularly limited. As the crosslinking agent, any one can be selected from known crosslinking agents which are used for conventional, chemically amplified negative resist compositions. For example, there may be mentioned aliphatic cyclic hydrocarbons having a hydroxyl group or a hydroxyalkyl group or both of them, and oxygen-containing derivatives thereof, such as 4,4'-methylenebis[2,6-bis(hydroxymethyl)]phenol (MBHP), 4,4'-methylenebis[2,6-bis(methoxymethyl)]phenol (MBMP), 2,3-dihydroxy-5-hydroxymethylnorbornane, 2-hydroxy-5,6-bis(hydroxymethyl)norbornane, cyclohexanedimethanol, 3,4,8(or 9)-trihydroxytricyclodecane, 2-methyl-2-adamantanol, 1,4-dioxane-2,3-diol and 1,3,5-trihydroxycyclohexane.

Also, there may be used a melamine-based crosslinking agent, a urea-based crosslinking agent, an alkylene urea-based crosslinking agent or a glycoluril-based crosslinking agent using glycoluril.

An oligomer or polymer component for improving resist film performance can be added to the negative resist composition of the present invention, within the range in which the effects of the present invention are not reduced. By adding an oligomer or polymer component and thereby incorporating a network structure into a resist film, it may be possible to increase pattern strength and thus improve resolution, and to improve pattern shape (line edge roughness). The content of such an oligomer or polymer component is preferably 5% by weight or less, more preferably 3% by weight or less of the total solid content of the resist composition.

Examples of the oligomer or polymer component include novolac resins, polyhydroxystyrene derivatives, and acrylic-type copolymers derived from acrylic acid and methacrylic acid, which are alkali-developable resins conventionally used for negative resist compositions for i-line, KrF or ArF. These oligomer or polymer components can have a reactive functional group.

The oligomer or polymer component preferably has a weight-average molecular weight of 2,000 to 30,000, more preferably 2,000 to 20,000. "Weight-average molecular weight" means a polystyrene-equivalent weight-average molecular weight measured by GPC (gel permeation chromatography).

As needed, the negative resist composition of the present invention can be appropriately mixed with miscible additives such as an additional resin for improving resist film performance, a surfactant for increasing coatability, a dissolution inhibitor, a plasticizer, a stabilizing agent, a colorant, a halation inhibitor, etc., to the extent that the effects of the present invention are not reduced.

<Preparation of Negative Resist Composition>

In general, the negative resist composition of the present invention is prepared by uniformly mixing an organic solvent with the above-described phenolic compound (A) and, as needed, other additives.

As the organic solvent, those that are generally used as the solvents for resists can be used. For example, preferred are ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, propylene glycol monomethyl ether propionate, diethylene glycol dimethyl ether, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents can be used solely or in combination. In addition, the resist composition can contain an aromatic solvent such as toluene or xylene, or an alcohol such as isopropyl alcohol, ethyl alcohol, methyl alcohol, n-butyl alcohol, s-butyl alcohol, t-butyl alcohol, isobutyl alcohol, 2-methyl-1-pentanol, 4-methyl-2-pentanol, 2-methoxyethanol, 2-ethoxyethanol, 1-ethoxy-2-propanol and 1-methoxy-2-propanol.

Among these organic solvents, preferably used in the present invention are diethylene glycol dimethyl ether, cyclohexanone, cyclopentanone, 1-ethoxy-2-propanol and ethyl lactate; moreover, propylene glycol monomethyl ether and propylene glycol monomethyl ether acetate, which are safety solvents, and a mixed solvent thereof are preferably used.

The amount of the solvent in the resist composition is not particularly limited and is appropriately determined according to the concentration which makes the resist composition applicable to a substrate, etc., and depending on the thickness of the composition applied. In general, the solvent is used so that the resist composition has a solid content concentration preferably in the range of 0.5 to 20% by weight, more preferably in the range of 0.5 to 15% by weight.

In the negative resist composition of the present invention, the water content is preferably controlled to 0.5% by weight or less, more preferably 0.01 to 0.5% by weight, still more preferably 0.15 to 0.30% by weight. The water content can be controlled by, for example, appropriately drying the used materials or by drying the preparation atmosphere (e.g., a humidity of 50% or less).

Also in the negative resist composition of the present invention, the content of the acid component is preferably controlled to $1\times10^{-3}$ meq/g or less, more preferably to $5\times10^{-4}$ meq/g or less. The content of the acid component can be controlled by, for example, treating the solution or composition solution of the use materials with ion-exchange resin, or by washing the solution of the use materials with pure water. The content of the acid component can be obtained by non-aqueous potentiometry.

After the preparation, the negative resist composition of the present invention is preferably filtered and used.

The negative resist composition of the present invention can be suitably used in the microlithography process for producing miniaturized electronic components, which are used for forming a gate layer of a semiconductor integrated circuit or for processing a mask pattern formed on glass substrates, for example.

The present invention also provides an electronic component at least part of which comprises the negative resist composition of the present invention or a cured product thereof. As long as any of the constituents of the electronic component of the present invention, the constituents comprising a resist composition or a cured product thereof, comprises the negative resist composition of the present invention or a cured product thereof, other constituents of the electronic component can be the same as those of conventionally-known electronic components. Examples of the electronic component of the present invention include an MEMS (microelectromechanical system) component, a micromachine component, a component for microfluidics, a μ-TAS (micro-total analysis system) component, an ink-jet printer component, a microreactor component, an electroconductive layer, a metal bump connection, an LIGA (a German acronym for Lithographie, Galvanoformung, Abformung, that is, lithography, electroplating, and molding) component, a mold and die for microinjection molding and microcoining, a screen or stencil for precise printing, a component for MEMS and semiconductor package, and a printed circuit board which can be treated with ultraviolet (UV) lithography.

II. Method for Forming Relief Pattern

The method for forming a relief pattern of the present invention comprises the steps of:

(i) forming a resist film by applying the negative resist composition of the present invention to a substrate and heating the same, and (ii) exposing the resist film to electron beams, ion beams, EUV or x-rays and then developing the same.

An alkali-developable, well-shaped pattern with high resolution is formed by the relief pattern forming method of the present invention. In the case of using the chemically amplified negative resist composition of the present invention, high sensitivity is achieved further. In the case of using the non-chemically amplified negative resist composition of the present invention, a pattern with post-exposure line width stability in vacuum, is achieved.

The above steps will be explained hereinafter.

(i) The Step of Forming a Resist Film by Applying the Negative Resist Composition of the Present Invention to a Substrate and Heating the Same In this step, first, the negative resist composition is applied onto a substrate.

The application method is not particularly limited as long as it is a method that can uniformly apply the negative resist composition onto the substrate surface. Various methods are usable, such as a spraying method, a roll coating method, a slit coating method and a spin coating method.

Next, post-applied bake (PAB) is performed on the negative resist composition applied onto the substrate to remove the organic solvent, thereby forming a resist film.

The temperature of the post-applied bake can be appropriately determined depending on the components of the composition, the amount of the components, the type of the organic solvent, etc. The temperature is normally 80 to 160° C., preferably 90 to 150° C. The time of the post-applied bake is normally about 30 seconds to 15 minutes.

(ii) The Step of Exposing the Resist Film to Electron Beams, Ion Beams, EUV or X-Rays and then Developing the Same In this step, first, the resist film is selectively exposed to light by exposure to light through a mask with a predetermined pattern or by direct writing with exposure to electron beams which is not through the mask, using an exposure system such as an electron beam lithography system or EUV exposure system.

The exposure source is not particularly limited and there may be used ArF excimer laser, KrF excimer laser, $F_2$ excimer laser, extreme ultraviolet (EUV), electron beams, x-rays, ion beams such as helium or hydrogen, etc.

Next, in the case of using the chemically amplified resist composition, post-exposure bake (PEB) is performed after the exposure. In the case of using the non-chemically amplified resist composition, post-exposure bake (PEB) can be performed after the exposure. The non-chemically amplified resist composition substantially contains no photoacid generator, so that it does not need post-exposure bake for acid diffusion. However, because high sensitivity may be obtained by post-exposure bake, it is preferable to appropriately perform post-exposure bake.

The PEB treatment condition is normally a temperature of 50 to 160° C. and a time of 0.1 to 15 minutes.

Next, the PEB-treated substrate is developed with an alkali developing solution to remove the unexposed portion which was not exposed to the exposure light.

As the developing method, there may be mentioned a spraying method, a slitting method, a puddle developing method, a dipping method, a vibration dipping method, etc.

As the alkali developing solution for developing the negative resist composition of the present invention, for example, aqueous solutions of alkalis are usable, including: inorganic alkalis such as sodium hydroxide, potassium hydroxide, sodium carbonate, sodium silicate, sodium metasilicate and ammonium water; primary amines such as ethylamine and n-propylamine; secondary amines such as diethylamine and di-n-butylamine; tertiary amines such as triethylamine and methyldimethylamine; alcohol amines such as dimethylethanolamine and triethanolamine; quaternary ammonium salts such as tetramethylammonium hydroxide, tetraethylammonium hydroxide, tetrabutylammonium hydroxide and choline; and cyclic amines such as pyrrole and piperidine. Also, these alkaline aqueous solutions can be mixed with an appropriate amount of alcohol such as isopropyl alcohol or an appropriate amount of surfactant such as nonionic surfactant. Among these alkali developing solutions, solutions of quaternary ammonium salts are preferable, and aqueous solutions of tetramethylammonium hydroxide and choline are more preferable.

In the case of using a tetramethylammonium hydroxide (TMAH) aqueous solution as the alkali developing solution, the tetramethylammonium hydroxide aqueous solution preferably has a concentration of 0.1% to 25%, more preferably 0.2% to 5%, still more preferably 0.2% to 2.38%. In general, a tetramethylammonium hydroxide aqueous solution having a concentration of 2.38% is the easiest to obtain in the semiconductor industry. If the tetramethylammonium hydroxide aqueous solution has a concentration of less than 0.1%, the developing solution may be neutralized by carbon dioxide in the air; therefore, there may be a change in sensitivity and thus it is difficult to stably obtain products.

After the developing treatment, a rinsing treatment is performed to rinse off the alkali developing solution on the substrate and the resist composition dissolved by the solution, followed by drying, thereby obtaining a resist pattern.

The present invention is not limited to the above-mentioned embodiments. The above-mentioned embodiments are examples, and any that has the substantially same essential features as the technical ideas described in claims of the present invention and exerts the same effects and advantages is included in the technical scope of the present invention.

EXAMPLES

Hereinafter, the present invention will be explained in more detail by way of examples. The scope of the present invention is not restricted by these examples, however.

The structure and physical properties of production examples were confirmed with the following devices:

MALDI-TOF MS: REFLEX II manufactured by BRUKER

$^1$H-NMR: JEOL JNM-LA400WB manufactured by JEOL Ltd.

Purity: Purity was measured by high-performance liquid chromatography (HPLC) (LC-10ADvp manufactured by Shimadzu Corporation) in the following condition: temperature: 40° C.; flow rate: 1.0 mL/min; column: VP-ODS (4.7 mm×150 mm); detector: SPD-M10Avp; mobile phase: acetonitrile/water Glass transition temperature (Tg): an intersection point of two tangents to smooth curving lines before and after the inflection temperature point of a DTA curve, the DTA curve being obtained when a material for forming a pattern of about 4 mg was heated to 200° C. at a rate of 10° C./min, cooled to room temperature and then heated to 200° C. at a rate of 10° C./min again, with a differential thermal analyzer (DSC-60 manufactured by Shimadzu Corporation).

Tg was deemed as 200° C. or more when no inflection point was found on the DTA curve until 200° C., which point corresponds to glass transition temperature.

Synthesis Example 1

5.8 g (10 mmol) of a phenolic compound represented by the following chemical formula (10) (parent compound: Pre-1) (TEP-BOCP: Asahi Organic Chemicals Industry Co., Ltd.) was added to a solution of 20 mL of 10% by weight potassium hydroxide aqueous solution and 20 mL of ethanol. The mixture was stirred at room temperature to dissolve. To this solution, 14.0 mL (160 mmol) of a 37% formalin aqueous solution was added slowly at room temperature. Under nitrogen atmosphere, the solution was stirred at 40°

C. for 24 hours and then poured into 200 mL water in a beaker. With cooling the beaker in an ice bath, a 2.0 wt % acetic acid aqueous solution was slowly added so that the mixed solution has a pH of 5.0. The resulting precipitate was collected by filtration, washed thoroughly with water and then dried, thereby obtaining a phenolic compound mixture (A-01M) having 4 to 8 hydroxymethyl groups incorporated thereinto. The phenolic compound mixture was purified by high-performance liquid chromatography, thereby obtaining 4.8 g of a phenolic compound 1 (A-01).

The structure of the thus-obtained phenolic compound 1 (A-01) was confirmed with $^1$H-NMR spectrum and MALDI-TOF MS. The glass transition temperature was obtained by differential scanning calorimetry. The results are shown in Table 1.

[Chemical Formula 15]

Chemical Formula (10)

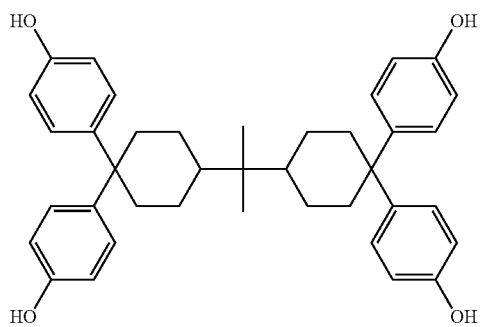

[Chemical Formula 16]

Chemical Formula (11)

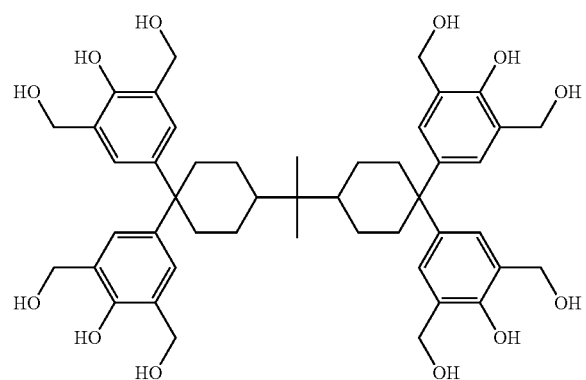

Synthesis Example 2

A phenolic compound 2 (A-02) represented by the following chemical formula (13) was synthesized in the same manner as Synthesis Example 1, except that 4.5 g (10 mmol) of a phenolic compound (Pre-2) represented by the following chemical formula (12) (TEOC-DF: Asahi Organic Chemicals Industry Co., Ltd.) was used in place of the phenolic compound (Pre-1). As a result, 4.3 g of a white compound was obtained.

The structure of the thus-obtained phenolic compound 2 (A-02) was confirmed with $^1$H-NMR spectrum and MALDI-TOF MS. The glass transition temperature was obtained by differential scanning calorimetry. The analysis results are shown in Table 1.

[Chemical Formula 17]

Chemical Formula (12)

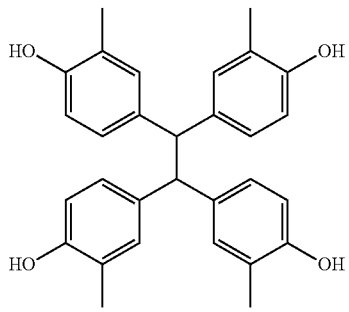

[Chemical Formula 18]

Chemical Formula (13)

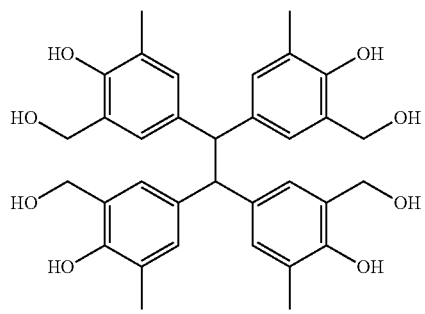

Synthesis Example 3

Under nitrogen atmosphere, 16.6 g (0.1 mol) of 1,3-diethoxybenzene was dissolved in 400 mL of ethanol in a 300 mL three-necked flask. With cooling the flask in an ice bath, 12.2 g (0.1 mol) of 4-hydroxybenzaldehyde was added thereto. Then, 20 mL of concentrated hydrochloric acid was added thereto slowly and dropwise and reacted at 75° C. for 12 hours. After reaction completion, the resulting reaction solution was cooled in an ice bath. The thus-precipitated crystal was collected by filtration, washed with distilled water until it is neutralized, and then dried. The resultant was purified by recrystallization using N,N-dimethylformamide as a solvent, thereby obtaining 9.6 g of a light yellow phenolic compound (Pre-3) represented by the following chemical formula (14).

A phenolic compound 3 (A-03) represented by the following chemical formula (15) was synthesized in the same manner as Synthesis Example 1, except that 1.1 g (1 mmol) of a phenolic compound (Pre-3) represented by the following chemical formula (14) was used in place of the phenolic compound (Pre-1). As a result, 0.8 g of a white compound was obtained.

The structure of the thus-obtained phenolic compound 3 (A-03) was confirmed with $^1$H-NMR spectrum and MALDI-TOF MS. The glass transition temperature was obtained by differential scanning calorimetry. The analysis results are shown in Table 1.

[Chemical Formula 19]

Chemical Formula (14)

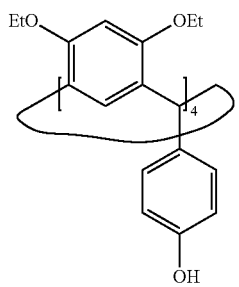

[Chemical Formula 20]

Chemical Formula (15)

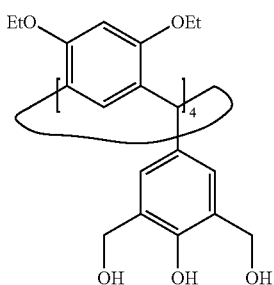

Synthesis Example 4

A phenolic compound 4 (A-04) represented by the following chemical formula (16) was synthesized in the same manner as Synthesis Example 1, except that 3.5 g (10 mmol) of 9,9-bis(4-hydroxyphenyl)fluorene was used in place of the phenolic compound (Pre-1). As a result, 3.9 g of a white compound was obtained.

The structure of the thus-obtained phenolic compound 4 (A-04) was confirmed with $^1$H-NMR spectrum and MALDI-TOF MS. The glass transition temperature was obtained by differential scanning calorimetry. The analysis results are shown in Table 1.

[Chemical Formula 21]

Chemical Formula (16)

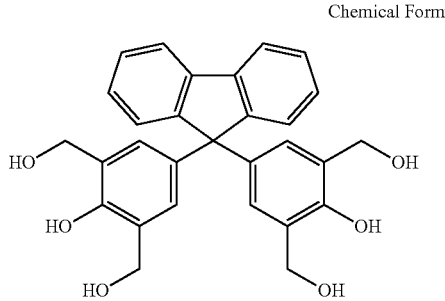

Synthesis Example 5

A phenolic compound 5 (A-05) represented by the following chemical formula (17) was synthesized in the same manner as Synthesis Example 1, except that 3.5 g (10 mmol) of 1,3-bis[2-(4-hydroxyphenyl)-2-propyl]benzene was used in place of the phenolic compound (Pre-1). As a result, 4.6 g of a white compound was obtained.

The structure of the thus-obtained phenolic compound 5 (A-05) was confirmed with $^1$H-NMR spectrum and MALDI-TOF MS. The glass transition temperature was obtained by differential scanning calorimetry. The analysis results are shown in Table 1.

[Chemical Formula 22]

Chemical Formula (17)

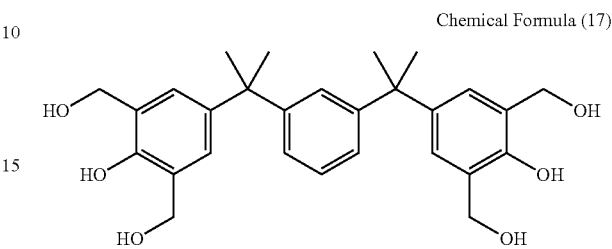

Synthesis Examples 6 to 8

A phenolic compound mixture (A-02M) having 1 to hydroxymethyl groups incorporated thereinto, was obtained in the same manner as Synthesis Example 2, except that the added amount of 37% formalin aqueous solution was changed to 3.5 mL (40 mmoL). The following compounds represented by the chemical formula (18) were obtained from this mixture by high-performance liquid chromatography: a phenolic compound (A-06) having one hydroxymethyl group incorporated into one of four Ls; a phenolic compound 7 (A-07) having two hydroxymethyl groups incorporated into two of four Ls; and a phenolic compound 8 (A-08) having three hydroxymethyl groups incorporated into three of four Ls.

The structure of the thus-obtained phenolic compounds 6 to 8 (A-06, A-07 and A-08) were confirmed with $^1$H-NMR spectra and MALDI-TOF MS. The glass transition temperature was obtained by differential scanning calorimetry. The analysis results are shown in Table 1.

[Chemical Formula 23]

Chemical Formula (18)

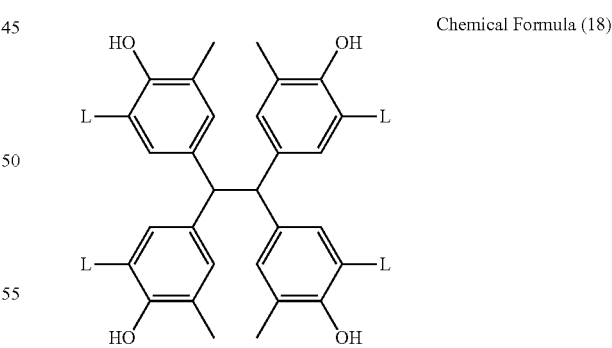

In this formula, L is a hydroxymethyl group or hydrogen atom.

Synthesis Example 9

A phenolic compound 9 (A-09) represented by the following chemical formula (20) was synthesized in the same manner as Synthesis Example, except that 7.3 g (10 mmol) of a phenolic compound (Pre-9) represented by the following chemical formula (19) (TEOCHP-DF: Asahi Organic Chemicals Industry Co., Ltd.) was used in place of the phenolic compound (Pre-1) and the added amount of 37% formalin aqueous solution was changed to 7.0 mL (80 mmoL). As a result, 6.9 g of a white compound was obtained.

The structure of the thus-obtained phenolic compound 9 (A-09) was confirmed with $^1$H-NMR spectrum and MALDI-TOF MS. The glass transition temperature was obtained by differential scanning calorimetry. The analysis results are shown in Table 2.

[Chemical Formula 24]

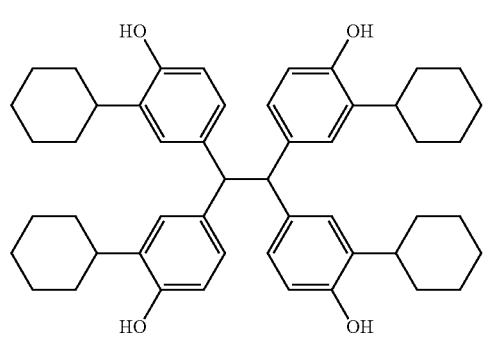

Chemical Formula (19)

[Chemical Formula 25]

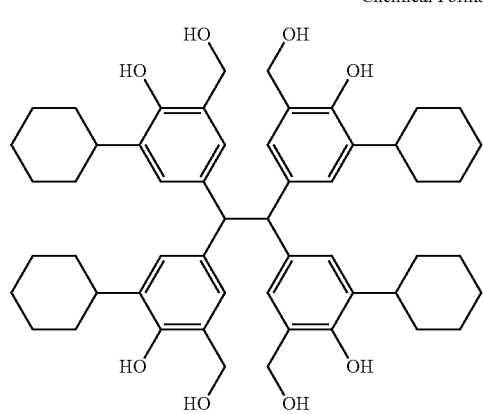

Chemical Formula (20)

Synthesis Example 10

Under nitrogen atmosphere, 11.0 g (0.1 mol) of resorcinol was dissolved in 400 mL of ethanol in a 300 mL three-necked flask. 10.2 mL (0.1 mol) of benzaldehyde was added thereto. Then, 20 mL of concentrated hydrochloric acid was added thereto slowly and dropwise and reacted at 75° C. for 12 hours. After reaction completion, the resulting reaction solution was cooled in an ice bath. The thus-precipitated crystal was collected by filtration, washed with distilled water until it is neutralized, and then dried, thereby obtaining 9.2 g of a light yellow phenolic compound (Pre-10) represented by the following chemical formula (21).

A phenolic compound 10 (A-10) represented by the following chemical formula (22) was synthesized in the same manner as Synthesis Example 1, except that 0.8 g (1 mmol) of a phenolic compound (Pre-10) represented by the following chemical formula (21) was used in place of the phenolic compound (Pre-1); the added amount of 37% formalin aqueous solution was changed to 0.7 mL (8 mmoL); and the reaction temperature was changed to 5° C. As a result, 0.7 g of a light yellow compound was obtained.

The structure of the thus-obtained phenolic compound 10 (A-10) was confirmed with $^1$H-NMR spectrum and MALDI-TOF MS. The glass transition temperature was obtained by differential scanning calorimetry. The analysis results are shown in Table 2.

[Chemical Formula 26]

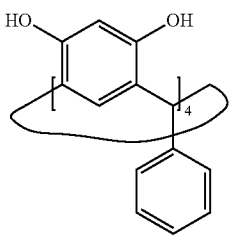

Chemical Formula (21)

[Chemical Formula 27]

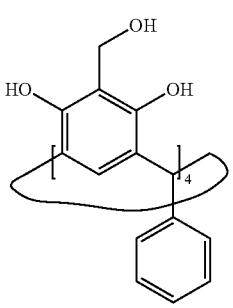

Chemical Formula (22)

Synthesis Example 11

Under nitrogen atmosphere, 11.0 g (0.1 mol) of resorcinol was dissolved in 400 mL of ethanol in a 300 mL three-necked flask. 14.8 g (1.1 mmol) of 3-phenylpropionaldehyde was added thereto. Then, 20 mL of concentrated hydrochloric acid was added thereto slowly and dropwise and reacted at 75° C. for 12 hours. After reaction completion, the resulting reaction solution was poured into water. The thus-precipitated solid was collected by filtration, washed with distilled water until it is neutralized, and then dried. Acetonitrile was added to the thus-obtained solid and stirred. A Solid insoluble in acetonitrile was separated by filtration and dried, thereby obtaining 12.3 g of a light yellow phenolic compound (Pre-11) represented by the following chemical formula (23).

A phenolic compound 11 (A-11) represented by the following chemical formula (24) was synthesized in the same manner as Synthesis Example 10, except that 0.9 g (1 mmol) of a phenolic compound (Pre-11) represented by the following chemical formula (23) was used in place of the phenolic compound (Pre-1). As a result, 0.8 g of a light yellow compound was obtained.

The structure of the thus-obtained phenolic compound 11 (A-11) was confirmed with ¹H-NMR spectrum and MALDI-TOF MS. The glass transition temperature was obtained by differential scanning calorimetry. The analysis results are shown in Table 2.

[Chemical Formula 28]

Chemical Formula (23)

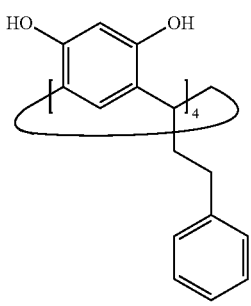

[Chemical Formula 29]

Chemical Formula (24)

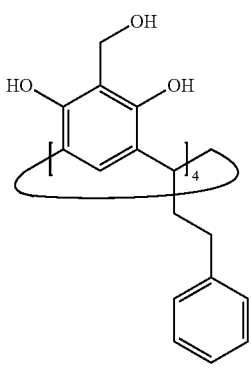

Synthesis Example 12

5.7 g (1.0 mmol) of the phenolic compound 2 (A-02) represented by the chemical formula (13) was added to 250 mL of methanol and heated and stirred to dissolve. 0.25 mL of concentrated sulfuric acid was added to this solution, and the mixture was heated to reflux for 15 hours. After reaction completion, the resulting reaction solution was cooled, and 1.0 g of potassium carbonate was added thereto. After concentrating the solution, 300 mL of ethyl acetate was added thereto. The solution was washed with water three times and then concentrated, thereby obtaining 4.9 g of a phenolic compound 12 (A-12) represented by the following chemical formula (25), which was a white compound.

The structure of the thus-obtained phenolic compound 12 (A-12) was confirmed with ¹H-NMR spectrum and MALDI-TOF MS. The glass transition temperature was obtained by differential scanning calorimetry. The analysis results are shown in Table 2.

[Chemical Formula 30]

Chemical Formula (25)

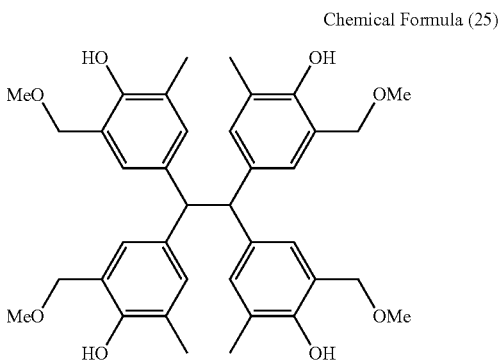

Synthesis Example 13

A phenolic compound 13 (A-13) represented by the following chemical formula (27) was synthesized in the same manner as Synthesis Example 1, except that 6.3 g (10 mmol) of a phenolic compound (Pre-13) represented by the following chemical formula (26) (TekOC-4HBPA: Honshu Chemical Industry Co., Ltd.) was used in place of the phenolic compound (Pre-1), and the added amount of 37% formalin aqueous solution was changed to 7.0 mL (80 mmoL). As a result, 5.8 g of a white compound was obtained.

The structure of the thus-obtained phenolic compound 13 (A-13) was confirmed with ¹H-NMR spectrum and MALDI-TOF MS. The glass transition temperature was obtained by differential scanning calorimetry. The analysis results are shown in Table 2.

[Chemical Formula 31]

Chemical Formula (26)

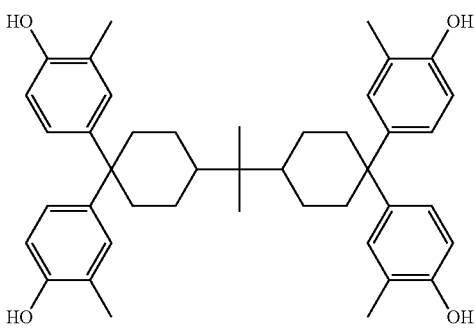

[Chemical Formula 32]

Chemical Formula (27)

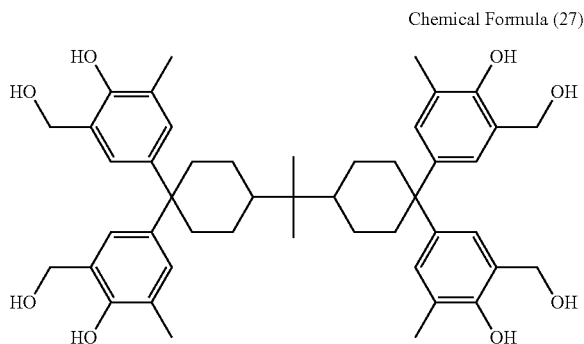

Synthesis Example 14

A phenolic compound (Pre-14) represented by the following chemical formula (28) was synthesized in accordance with the synthesis method explained in an article (J. Mater. Chem., 18, 3588 (2008)). As a result, 5.4 g of a white solid was obtained.

A phenolic compound 14 (A-14) represented by the following chemical formula (29) was synthesized in the same manner as Synthesis Example 1, except that 2.1 g (1 mmol) of a phenolic compound (Pre-14) represented by the following chemical formula (28) was used in place of the phenolic compound (Pre-1); the added amount of 37% formalin aqueous solution was changed to 2.1 mL (24 mmol); and the reaction temperature was changed to 5° C. As a result, 2.0 g of a light yellow compound was obtained.

The structure of the thus-obtained phenolic compound 14 (A-14) was confirmed with $^1$H-NMR spectrum and MALDI-TOF MS. The glass transition temperature was obtained by differential scanning calorimetry. The analysis results are shown in Table 2.

Synthesis Example 15

A phenolic compound 15 (A-15) represented by the following chemical formula (31) was synthesized in the same manner as Synthesis Example 1, except that 7.5 g (10 mmol) of a phenolic compound (Pre-15) represented by the following chemical formula (30) (TEIPP-BOCP: Asahi Organic Chemicals Industry Co., Ltd.) was used in place of the phenolic compound (Pre-1), and the added amount of 37% formalin aqueous solution was changed to 7.0 mL (80 mmoL). As a result, 7.3 g of a white compound was obtained.

The structure of the thus-obtained phenolic compound 15 (A-15) was confirmed with $^1$H-NMR spectrum and MALDI-TOF MS. The glass transition temperature was obtained by differential scanning calorimetry. The analysis results are shown in Table 2.

[Chemical Formula 33]

Chemical Formula (28)

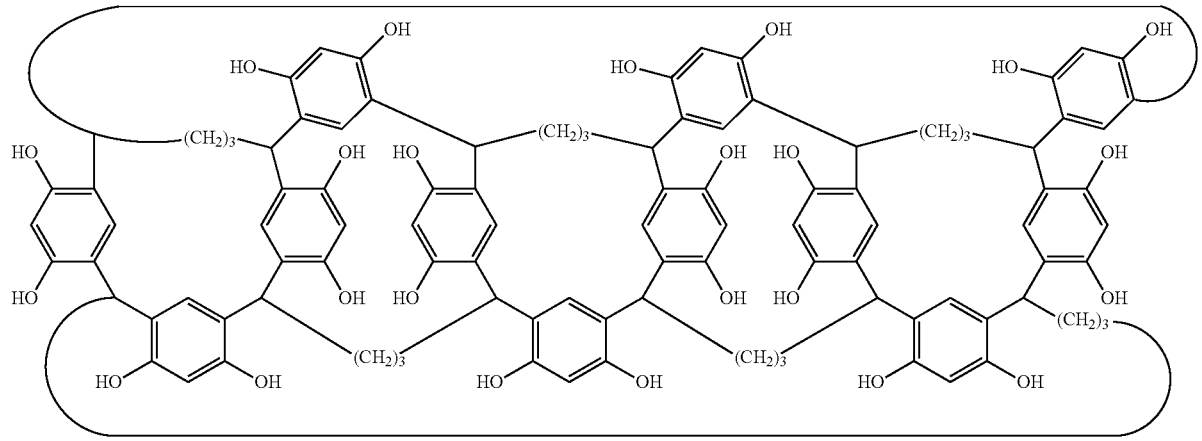

[Chemical Formula 34]

Chemical Formula (29)

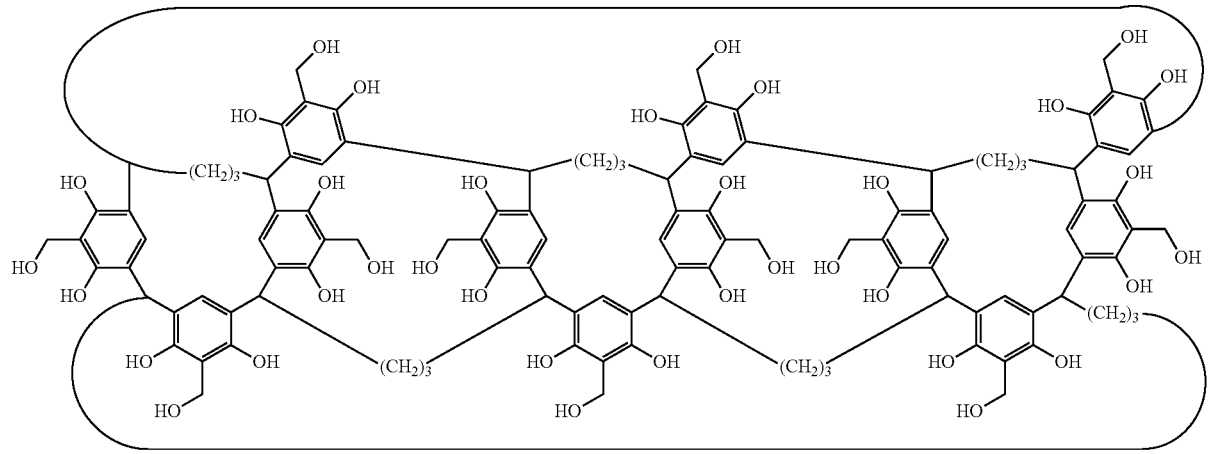

[Chemical Formula 35]

Chemical Formula (30)

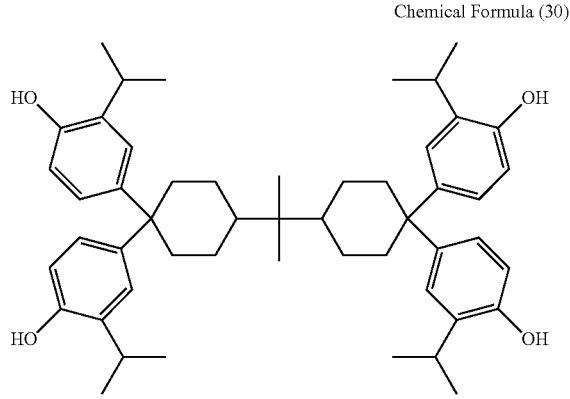

[Chemical Formula 36]

Chemical Formula (31)

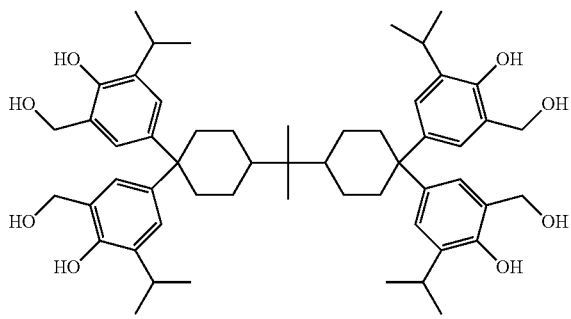

Comparative Synthesis Example 12

A comparative phenolic compound (CA-02) represented by the following chemical formula (32) was synthesized in the same manner as Synthesis Example 1, except that 3.0 g of a polyhydroxystyrene compound (VP-3500: Nippon Soda Co., Ltd.) was used as a phenolic compound, in place of the phenolic compound (Pre-1).

The structure of the thus-obtained comparative phenolic compound (CA-02) was confirmed with $^1$H-NMR spectrum. The glass transition temperature was obtained by differential scanning calorimetry. The analysis results are shown in Table 2. The weight-average molecular weight and the molecular weight distribution were measured by gel permeation chromatography (GPC) using THF as an eluent.

[Chemical Formula 37]

Chemical Formula (32)

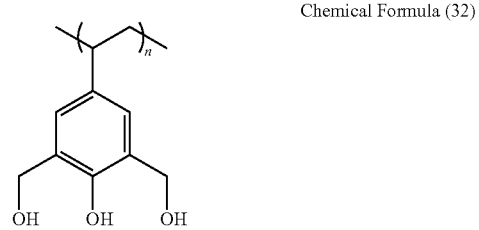

A comparative phenolic compound (CA-01) used in the below-described comparative examples, which is 2,2-bis(4-hydroxy-3,5-dihydroxymethylphenyl)propane represented by the chemical formula (33), was obtained from Asahi Organic Chemicals Industry Co., Ltd.

[Chemical Formula 34]

Chemical Formula (33)

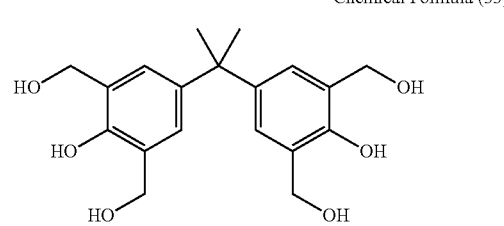

TABLE 1

| Synthesis Example | Compound | $^1$H-NMR | Purity (%) | Molecular Weight | Glass Transition Temperature (° C.) |
|---|---|---|---|---|---|
| 1 | A-01M | 0.46(6H, —CH3), 1.09-1.71(14H, cHex), 2.68-2.71(4H, cHex), 4.45-4.53(14H, Ph—CH2—OH), 5.17-5.24(7H, Ph—CH2—OH), 6.98-7.12(9H, Aromatic H), 8.28-8.32(4H, Ph—OH) | 87 | 816.97 | 67 |
| 1 | A-01 | 0.46(6H, —CH3), 1.09-1.71(14H, cHex), 2.68-2.71(4H, cHex), 4.45-4.53(16H, Ph—CH2—OH), 5.17-5.24(8H, Ph—CH2—OH), 6.98-7.12(8H, Aromatic H), 8.28-8.32(4H, Ph—OH) | 97 | 816.97 | 63 |
| 2 | A-02 | 1.99(12H, —CH3), 4.39(8H, Ph—CH2—OH), 5.21(4H, Ph—CH2—OH), 6.87-7.00 (8H, Aromatic H), 8.00(4H, Ph—OH) | 98 | 574.66 | 200° C. or more |
| 3 | A-03 | 0.98-1.17(40H, PhO—CH2—CH3), 4.23(4H, —CH—), 4.37(16H, Ph—CH2—OH), 5.10(8H, Ph—CH2—OH), 5.57-6.49(16H, Aromatic H), 8.24(4H, Ph—OH) | 97 | 1081.29 | 200° C. or more |
| 4 | A-04 | 4.42(8H, Ph—CH2—OH), 5.11(4H, Ph—CH2—OH), 6.93-7.86(12H, Aromatic H), 8.44(2H, Ph—OH) | 96 | 470.51 | 62 |

TABLE 1-continued

| Synthesis Example | Compound | $^1$H-NMR | Purity (%) | Molecular Weight | Glass Transition Temperature (°C.) |
|---|---|---|---|---|---|
| 5 | A-05 | 1.54(12H, —CH3), 4.49(8H, Ph—CH2—OH), 5.18-5.21(4H, Ph—CH2—OH), 6.89-7.20 (8H, Aromatic H), 8.38(2H, Ph—OH) | 99 | 466.57 | 135 |
| 6 | A-06 | 1.99(12H, —CH3), 4.39(2H, Ph—CH2—OH), 5.21(1H, Ph—CH2—OH), 6.43(3H, Aromatic H), 6.90-6.99(8H, Aromatic H), 7.99(1H, Ph—OH), 8.76(3H, Ph—OH) | 97 | 484.58 | 200° C. or more |
| 7 | A-07 | 1.99(12H, —CH3), 4.39(4H, Ph—CH2—OH), 5.21(2H, Ph—CH2—OH), 6.43(2H, Aromatic H), 6.90-6.99(8H, Aromatic H), 7.99(2H, Ph—OH), 8.76(2H, Ph—OH) | 97 | 514.61 | 200° C. or more |
| 8 | A-08 | 1.99(12H, —CH3), 4.39(6H, Ph—CH2—OH), 5.21(3H, Ph—CH2—OH), 6.43(1H, Aromatic H), 6.90-6.99(8H, Aromatic H), 7.99(3H, Ph—OH), 8.76(1H, Ph—OH) | 96 | 544.63 | 200° C. or more |

TABLE 2

| Synthesis Example | Compound | $^1$H-NMR | Purity (%) | Molecular Weight | Glass Transition Temperature (°C.) |
|---|---|---|---|---|---|
| 9 | A-09 | 1.17-1.72(40H, $^c$Hex), 2.66(4H, $^c$Hex), 4.40-4.51(8H, Ph—CH$_2$—OH), 4.54(2H, CH—CH), 5.38(4H, Ph—CH$_2$—OH), 6.78-7.06(8H, Aromatic H), 8.67(4H, Ph—OH) | 75 | 847.13 | 200° C. or more |
| 10 | A-10 | 3.38(4H, Ph—CH—Ph), 4.65(8H, Ph—CH$_2$—OH), 5.75(4H, Ph—CH$_2$—OH), 6.16(4H, Aromatic H), 6.73-6.98(40H, Aromatic H), 8.30(8H, Ph—OH) | 95 | 912.97 | 200° C. or more |
| 11 | A-11 | 2.08(8H, CH—CH$_2$—CH$_2$), 2.45(8H, CH$_2$—CH$_2$—Ph), 4.25(4H, Ph—CH—Ph), 4.42(8H, Ph—CH$_2$—OH), 4.67(4H, Ph—CH$_2$—OH), 7.10-7.18(20H, Aromatic H), 7.50(4H, Aromatic H), 9.05(8H, Ph—OH) | 93 | 1025.19 | 200° C. or more |
| 12 | A-12 | 1.98(12H, —CH$_3$), 3.2(12H, —OCH$_3$), 4.29(8H, Ph—CH$_2$—OH), 6.87-7.00(8H, Aromatic H), 8.05(4H, Ph—OH) | 95 | 630.77 | 200° C. or more |
| 13 | A-13 | 0.44(6H, —CH$_3$), 1.09-1.67(14H, $^c$Hex), 2.03(12H, Ph—CH$_3$), 2.64-2.67(4H, $^c$Hex), 4.44-4.51(8H, Ph—CH$_2$—OH), 5.19-5.25(4H, Ph—CH$_2$—OH), 6.74-7.02(8H, Aromatic H), 8.10-8.13(4H, Ph—OH) | 92 | 752.97 | 200° C. or more |
| 14 | A-14 | 0.85-2.36(36H, —(CH$_2$)$_3$—), 3.97-4.23(12HPh—CH—Ph), 4.61(24H, Ph—CH$_2$—OH), 5.69(12H, Ph—CH$_2$—OH), 6.12(12H, Aromatic), 8.61-9.50(24H, Ph—OH) | 94 | 2077.85 | 200° C. or more |
| 15 | A-15 | 0.42(6H, —CH$_3$), 1.03-1.13(24H, CH—(CH$_3$)$_2$), 1.04-1.68(14H, $^c$Hex), 2.58-2.61(4H, CH), 3.05-3.34(4H, $^c$Hex), 4.40-4.45(8H, Ph—CH$_2$—OH), 5.21-5.32(4H, Ph—CH$_2$—OH), 6.52-7.09(8H, Aromatic H), 8.88-8.95(4H, Ph—OH) | 98 | 745.50 | 200° C. or more |
| — | CA-01 | 1.55(6H, —CH$_3$), 4.50(8H, Ph—CH$_2$—OH), 5.20(4H, Ph—CH$_2$—OH), 7.04(4H, Aromatic H), 8.35(2H, Ph—OH) | 96 | 348.39 | 27 |
| Comparative Example 1 | CA-02 | 0.7-2.3(3H, —CH—CH2—), 4.5(4, Ph—CH$_2$—OH), 5.2(2H, —CH$_2$—OH), 6.1-6.7(2H, Aromatic H), 8.4(1H, Ph—OH) | Mw/Mn = 1.17 | 2860 | 131 |

<Evaluation of Solvent Solubility of Phenolic Compound>

The phenolic compounds (A-01 to A-15) obtained in Synthesis Examples 1 to 15 and the comparative phenolic compounds (CA-01 and CA-02) were added to the following typical resist solvents so as to have a concentration of 1 or 5 wt % at 23° C., followed by stirring:

(D)-1: Propylene glycol monomethylether
(D)-2: Propylene glycol monomethyl ether acetate
(D)-3: Cyclopentanone The thus-obtained mixtures were evaluated based on the following evaluation criterion. The results are shown in Table 3.

◎: The material for forming a pattern was dissolved at a concentration of 5 wt % at 23° C.,
○: The material for forming a pattern was dissolved at a concentration of 1 wt % at 23° C.
x: The material for forming a pattern was insoluble.

TABLE 3

|       | (D)-1 | (D)-2 | (D)-3 |
|-------|-------|-------|-------|
| A-01  | ○     | ○     | ◎     |
| A-02  | ◎     | ○     | ◎     |
| A-03  | ○     | ○     | ◎     |
| A-04  | ◎     | ◎     | ◎     |
| A-05  | ◎     | ○     | ◎     |
| A-06  | ◎     | ○     | ◎     |
| A-07  | ◎     | ○     | ◎     |
| A-08  | ◎     | ○     | ◎     |
| A-09  | ◎     | ◎     | ◎     |
| A-10  | ◎     | ○     | ◎     |
| A-11  | ◎     | ○     | ◎     |
| A-12  | ◎     | ◎     | ◎     |
| A-13  | ◎     | ◎     | ◎     |
| A-14  | ◎     | ○     | ◎     |
| A-15  | ◎     | ◎     | ◎     |
| CA-01 | ○     | X     | ○     |
| CA-02 | ○     | X     | ◎     |

As shown in Table 3, the phenolic compounds (A-01 to A-15) used in the present invention were found to have excellent solubility in resist solvents. On the other hand, the comparative phenolic compounds (CA-01 and CA-02) were found to dissolve in only specific solvents.

Example I Series

Chemically Amplified Negative Resist Composition

Examples I-1 to I-40 and Comparative Examples I-1 to I-4

The phenolic compound (A) of the present invention, an acid generator (B), a basic compound (C) and an organic solvent (D) were mixed in the amounts shown in Table 4 to produce homogeneous solutions. In Example I-40, in addition to the phenolic compound (A), the phenolic compound (Pre-1) was mixed with them, which is a phenolic compound that is different from the phenolic compound (A). The homogeneous solutions were each filtered with a 0.1 μm Teflon (trademark) filter to prepare negative resist compositions of Examples I-1 to I-40. In Example I-9, a mixture with the phenolic compound obtained in Synthesis Example 1 (A-01M) was used.

In Comparative Example I-1, the phenolic compound (Pre-1) having no hydroxymethyl group in the ortho-position of a phenolic hydroxyl group, was used as the phenolic compound, while the comparative phenolic compound (CA-01) having a hydroxymethyl group in the ortho-position of a phenolic hydroxyl group, was used as a crosslinking agent. A homogeneous solution was prepared by mixing the phenolic compound (Pre-1), the comparative phenolic compound (CA-01), the acid generator (B), the basic compound (C) and the organic solvent (D), according to the amounts shown in Table 4. The thus-obtained sample solution was filtered with a 0.1 μm Teflon (trademark) filter to prepare the negative resist composition of Comparative Example I-1.

The negative resist composition of Comparative Example I-2 was prepared in the same manner as Example I-1, except that the comparative phenolic compound (CA-01) having a hydroxymethyl group in the ortho-position of a phenolic hydroxyl group but having a molecular weight of 348, was used in place of the phenolic compound (A).

The negative resist composition of Comparative Example I-3 was prepared in the same manner as Example I-1, except that the comparative phenolic compound (CA-02) having a hydroxymethyl group in the ortho-position of a phenolic hydroxyl group but having a weight-average molecular weight of 2,860, was used in place of the phenolic compound (A).

The negative resist composition of Comparative Example I-4 was prepared in the same manner as Comparative Example I-1 and according to the amounts shown in Table 4, except that the phenolic compound (Pre-1) having no hydroxymethyl group in the ortho-position of a phenolic hydroxyl group, was used as the phenolic compound and the phenolic compound (A) of the present invention was used in a small amount as a crosslinking agent.

The meanings of abbreviations in Table 4 are as follows:
(B)-1: Triphenylsulfonium trifluoromethylsulfonate
(B)-2: Diphenyl-2,4,6-trimethylphenylsulfonium p-toluenesulfonate
(B)-3: Triphenylsulfonium cyclohexafluoropropane-1,3-bis(sulfonyl)imide
(B)-4: diphenyliodonium p-toluenesulfonate
(C)-1: Tri-n-octylamine
(C)-2: Tribenzylamine
(C)-3: 2,4,5-Triphenylimidazole
(D)-1: Propylene glycol monomethyl ether
(D)-2: Propylene glycol monomethyl ether acetate
(D)-3: Cyclopentanone
Developing solution: Tetramethylammonium hydroxide aqueous solution

TABLE 4

| | Phenolic Compound (A) | | Acid Generator (B) | | Others | | Organic Basic Compound (C) | | Organic Solvent (D) | | PEB ° C. | Concentration of Developing Solution % |
|---|---|---|---|---|---|---|---|---|---|---|---|---|
| | | Content (g) | | Content (g) | | Content (g) | | Content (g) | | Content (g) | | |
| Example I-1  | A-01   | 0.2 | (B)-1 | 0.02 | — | — | (C)-1 | 0.002 | (D)-1 | 20 | 100 | 0.6  |
| Example I-2  | A-01   | 0.2 | (B)-2 | 0.02 | — | — | (C)-1 | 0.002 | (D)-1 | 20 | 100 | 0.6  |
| Example I-3  | A-01   | 0.2 | (B)-3 | 0.02 | — | — | (C)-1 | 0.002 | (D)-1 | 20 | 100 | 0.6  |
| Example I-4  | A-01   | 0.2 | (B)-1 | 0.02 | — | — | (C)-2 | 0.002 | (D)-1 | 20 | 100 | 0.6  |
| Example I-5  | A-01   | 0.2 | (B)-1 | 0.02 | — | — | (C)-3 | 0.002 | (D)-1 | 20 | 100 | 0.6  |
| Example I-6  | A-01   | 0.2 | (B)-1 | 0.02 | — | — | (C)-1 | 0.002 | (D)-2 | 20 | 100 | 0.6  |
| Example I-7  | A-01   | 0.2 | (B)-1 | 0.02 | — | — | (C)-1 | 0.002 | (D)-3 | 20 | 100 | 0.6  |
| Example I-8  | A-01   | 0.2 | (B)-1 | 0.02 | — | — | (C)-1 | 0.002 | (D)-1 | 20 | 100 | 0.24 |
| Example I-9  | A-01M  | 0.2 | (B)-1 | 0.02 | — | — | (C)-1 | 0.002 | (D)-1 | 20 | 100 | 0.6  |
| Example I-10 | A-02   | 0.2 | (B)-1 | 0.02 | — | — | (C)-1 | 0.002 | (D)-1 | 20 | 100 | 0.24 |
| Example I-11 | A-03   | 0.2 | (B)-1 | 0.02 | — | — | (C)-1 | 0.002 | (D)-3 | 20 | 100 | 0.24 |

TABLE 4-continued

|  | Phenolic Compound (A) | Content (g) | Acid Generator (B) | Content (g) | Others | Content (g) | Organic Basic Compound (C) | Content (g) | Organic Solvent (D) | Content (g) | PEB °C. | Concentration of Developing Solution % |
|---|---|---|---|---|---|---|---|---|---|---|---|---|
| Example I-12 | A-04 | 0.2 | (B)-1 | 0.02 | — | — | (C)-1 | 0.002 | (D)-1 | 20 | 100 | 0.24 |
| Example I-13 | A-05 | 0.2 | (B)-1 | 0.02 | — | — | (C)-1 | 0.002 | (D)-1 | 20 | 100 | 0.24 |
| Example I-14 | A-02 | 0.2 | (B)-1 | 0.02 | — | — | (C)-2 | 0.002 | (D)-1 | 20 | 80 | 0.24 |
| Example I-15 | A-02 | 0.2 | (B)-1 | 0.02 | — | — | (C)-2 | 0.004 | (D)-1 | 20 | 80 | 0.24 |
| Example I-16 | A-02 | 0.2 | (B)-2 | 0.02 | — | — | (C)-2 | 0.002 | (D)-1 | 20 | 80 | 0.24 |
| Example I-17 | A-02 | 0.2 | (B)-3 | 0.02 | — | — | (C)-2 | 0.002 | (D)-1 | 20 | 80 | 0.24 |
| Example I-18 | A-06 | 0.2 | (B)-2 | 0.02 | — | — | (C)-2 | 0.002 | (D)-1 | 20 | 80 | 0.24 |
| Example I-19 | A-07 | 0.2 | (B)-2 | 0.02 | — | — | (C)-2 | 0.002 | (D)-1 | 20 | 80 | 0.24 |
| Example I-20 | A-08 | 0.2 | (B)-2 | 0.02 | — | — | (C)-2 | 0.002 | (D)-1 | 20 | 80 | 0.24 |
| Example I-21 | A-09 | 0.2 | (B)-2 | 0.02 | — | — | (C)-2 | 0.002 | (D)-1 | 20 | 100 | 2.38 |
| Example I-22 | A-09 | 0.2 | (B)-2 | 0.02 | — | — | (C)-2 | 0.002 | (D)-1 | 20 | 80 | 2.38 |
| Example I-23 | A-10 | 0.2 | (B)-2 | 0.02 | — | — | (C)-2 | 0.002 | (D)-1 | 20 | 80 | 0.24 |
| Example I-24 | A-10 | 0.2 | (B)-2 | 0.02 | — | — | (C)-2 | 0.002 | (D)-2 | 20 | 80 | 0.24 |
| Example I-25 | A-11 | 0.2 | (B)-2 | 0.02 | — | — | (C)-2 | 0.002 | (D)-1 | 20 | 100 | 0.24 |
| Example I-26 | A-11 | 0.2 | (B)-2 | 0.02 | — | — | (C)-2 | 0.002 | (D)-1 | 20 | 80 | 0.24 |
| Example I-27 | A-11 | 0.2 | (B)-2 | 0.02 | — | — | (C)-2 | 0.002 | (D)-2 | 20 | 80 | 0.24 |
| Example I-28 | A-12 | 0.2 | (B)-2 | 0.02 | — | — | (C)-2 | 0.002 | (D)-1 | 20 | 80 | 0.24 |
| Example I-29 | A-13 | 0.2 | (B)-1 | 0.02 | — | — | (C)-2 | 0.002 | (D)-1 | 20 | 100 | 1.19 |
| Example I-30 | A-13 | 0.2 | (B)-2 | 0.02 | — | — | (C)-2 | 0.002 | (D)-1 | 20 | 100 | 1.19 |
| Example I-31 | A-13 | 0.2 | (B)-2 | 0.02 | — | — | (C)-2 | 0.002 | (D)-1 | 20 | 80 | 1.19 |
| Example I-32 | A-13 | 0.2 | (B)-4 | 0.02 | — | — | (C)-2 | 0.002 | (D)-1 | 20 | 100 | 1.19 |
| Example I-33 | A-13 | 0.2 | (B)-2 | 0.03 | — | — | (C)-2 | 0.003 | (D)-1 | 20 | 100 | 2.38 |
| Example I-34 | A-13 | 0.2 | (B)-2 | 0.03 | — | — | (C)-2 | 0.003 | (D)-1 | 20 | 110 | 2.38 |
| Example I-35 | A-13 | 0.2 | (B)-2 | 0.05 | — | — | (C)-2 | 0.005 | (D)-1 | 20 | 110 | 2.38 |
| Example I-36 | A-14 | 0.2 | (B)-2 | 0.02 | — | — | (C)-2 | 0.002 | (D)-1 | 20 | 80 | 0.24 |
| Example I-37 | A-15 | 0.2 | (B)-1 | 0.02 | — | — | (C)-2 | 0.002 | (D)-1 | 20 | 100 | 2.38 |
| Example I-38 | A-15 | 0.2 | (B)-2 | 0.02 | — | — | (C)-2 | 0.002 | (D)-1 | 20 | 100 | 2.38 |
| Example I-39 | A-15 | 0.2 | (B)-2 | 0.03 | — | — | (C)-2 | 0.003 | (D)-1 | 20 | 100 | 2.38 |
| Example I-40 | A-01 | 0.2 | (B)-1 | 0.025 | Pre-1 | 0.05 | (C)-1 | 0.003 | (D)-1 | 20 | 100 | 0.6 |
| Comparative Example I-1 | Pre-1 | 0.2 | (B)-1 | 0.02 | CA-01 | 0.03 | (C)-1 | 0.002 | (D)-1 | 20 | 100 | 0.6 |
| Comparative Example I-2 | CA-01 | 0.2 | (B)-1 | 0.02 | — | — | (C)-1 | 0.002 | (D)-1 | 20 | 100 | — |
| Comparative Example I-3 | CA-02 | 0.2 | (B)-1 | 0.02 | — | — | (C)-1 | 0.002 | (D)-1 | 20 | 100 | 1.19 |
| Comparative Example I-4 | Pre-1 | 0.2 | (B)-1 | 0.02 | A-01 | 0.1 | (C)-1 | 0.002 | (D)-1 | 20 | 100 | 0.6 |

<Resist Pattern Formation and Evaluation Method>

Using the resist compositions obtained in the above-described Examples I-1 to I-40 and Comparative Examples I-1 to I-4, resist patterns were formed and evaluated by the methods described below. The results are shown in Table 5.

(1) Application of Resist

Each resist composition was uniformly applied onto a 6-inch silicon substrate with a spinner and a post-applied bake (PAB) treatment was performed thereon at 100° C. for 60 seconds, thereby forming a resist film having a thickness of 50 nm. In Table 5, "○" indicates that an excellent resist film was formed, and "x" indicates that excellent film formation was difficult due to cissing, etc.

(2) Formation of Resist Pattern

Each resist film was subjected to writing with an electron beam lithography system (accelerating voltage: 100 Key). After the writing was completed, each film was subjected to a post-exposure bake (PEB) treatment at 100° C. for 60 seconds, developed in a TMAH aqueous solution (23° C.) for 60 seconds, and then rinsed with pure water for 60 seconds, thereby forming a line and space (L/S) pattern.

(3) Evaluation Method

[Sensitivity, Resolution and Line Edge Roughness]

Sensitivity and line edge roughness (LER) were measured with a scanning electron microscope (SEM) manufactured by HOLON Co., Ltd. Sensitivity is the minimum exposure amount at which a 100 nm L/S pattern is formed at 1:1, and it was measured in μC/cm². Resolution is the limiting resolution at the minimum exposure amount (lines and spaces are separately resolved). LER was obtained by the steps of measuring line width at 500 points within a range of 0.7 μm from the longitudinal edge of a 100 nm L/S pattern, obtaining the standard deviation therefrom, and calculating 3σ.

TABLE 5

|  | Resist Film Forming Ability | Sensitivity (μC/cm²) | Resolution (nm) | LER (nm) |
|---|---|---|---|---|
| Example I-1 | ○ | 60 | 30 | 3.6 |
| Example I-2 | ○ | 110 | 32 | 3.4 |
| Example I-3 | ○ | 130 | 30 | 3.2 |
| Example I-4 | ○ | 65 | 30 | 3.5 |
| Example I-5 | ○ | 100 | 28 | 3.6 |
| Example I-6 | ○ | 80 | 30 | 3.5 |
| Example I-7 | ○ | 75 | 30 | 3.4 |
| Example I-8 | ○ | 50 | 26 | 3.6 |
| Example I-9 | ○ | 65 | 35 | 4.0 |
| Example I-10 | ○ | 100 | 20 | 3.2 |
| Example I-11 | ○ | 270 | 40 | 4.1 |
| Example I-12 | ○ | 130 | 20 | 3.8 |
| Example I-13 | ○ | 90 | 40 | 4.2 |
| Example I-14 | ○ | 40 | 35 | 4.2 |
| Example I-15 | ○ | 75 | 28 | 4.0 |
| Example I-16 | ○ | 90 | 22 | 3.4 |
| Example I-17 | ○ | 60 | 35 | 3.6 |
| Example I-18 | ○ | 400 | 32 | 4.5 |
| Example I-19 | ○ | 280 | 28 | 4.2 |
| Example I-20 | ○ | 190 | 22 | 3.8 |
| Example I-21 | ○ | 55 | 22 | 4.3 |
| Example I-22 | ○ | 95 | 24 | 4.1 |
| Example I-23 | ○ | 280 | 30 | 4.5 |
| Example I-24 | ○ | 310 | 28 | 5.1 |
| Example I-25 | ○ | 35 | 35 | 6.2 |
| Example I-26 | ○ | 90 | 35 | 4.8 |
| Example I-27 | ○ | 100 | 32 | 5.5 |

TABLE 5-continued

| | Resist Film Forming Ability | Sensitivity (μC/cm$^2$) | Resolution (nm) | LER (nm) |
|---|---|---|---|---|
| Example I-28 | ○ | 390 | 35 | 5.2 |
| Example I-29 | ○ | 45 | 26 | 4.5 |
| Example I-30 | ○ | 60 | 26 | 4.2 |
| Example I-31 | ○ | 80 | 24 | 3.8 |
| Example I-32 | ○ | 15 | 30 | 5.2 |
| Example I-33 | ○ | 55 | 24 | 4.0 |
| Example I-34 | ○ | 50 | 26 | 4.3 |
| Example I-35 | ○ | 45 | 26 | 4.6 |
| Example I-36 | ○ | 230 | 35 | 5.8 |
| Example I-37 | ○ | 35 | 28 | 4.8 |
| Example I-38 | ○ | 45 | 24 | 4.2 |
| Example I-39 | ○ | 40 | 26 | 4.4 |
| Example I-40 | ○ | 105 | 32 | 4.2 |
| Comparative Example I-1 | ○ | 40 | 30 | 7.4 |
| Comparative Example I-2 | X | — | — | — |
| Comparative Example I-3 | ○ | — | — | — |
| Comparative Example I-4 | ○ | 150 | 40 | 7.8 |

<Results>

For the resist compositions of Examples I-1 to I-40, which used 70% by weight or more of the phenolic compound (A) that has a crosslinkable group incorporated into the resist substrate and thus functions as the resist substrate and also as the crosslinking agent, it is clear from the above results that the resist films formed from the compositions were more uniform than Comparative Examples I-1 and I-4 and showed a decrease (improvement) in line edge roughness (LER).

For the resist composition of Comparative Example I-2, which used the phenolic compound I-2 having a molecular weight of less than 400 and a crosslinkable group, no amorphous film was obtained from the resist composition; therefore, no pattern was obtained.

For the resist composition of Comparative Example I-3, which used the polymer (polyhydroxystyrene) derivative CA-02 having a molecular weight of about 3,000, swelling occurred during development and a pattern of 100 nm or less was not obtained, therefore.

It is clear from a comparison of Examples I-1 and I-9 that Example I-1, which is high purity, showed higher resolution and lower LER than Example I-9, which is a mixture.

It is clear from a comparison of Examples I-8 and I-10 that Example I-10, which used A-02 having a solubility of 5% in propylene glycol monomethyl ether as the resist substrate, showed lower LER than Example I-8, which used A-01 having a solubility of 2% in propylene glycol monomethyl ether as the resist substrate.

It is clear from a comparison of Examples of I-23 and I-24 and that of Examples I-26 and I-27 that Examples I-23 and I-26, which were each prepared with a highly-soluble solvent (propylene glycol monomethyl ether), showed lower LER.

It is clear from a comparison between Example I-16 and Examples I-18, I-19 and I-20 that the phenolic compound (A) having three or more hydroxymethyl groups per molecule, which function as crosslinkable groups, is more crosslinkable and provides a pattern with higher sensitivity, higher resolution and lower LER.

It is clear from a comparison of Examples I-26 and I-16 that Example I-16, which had a methylol group as a crosslinkable group, showed higher reactivity, higher sensitivity, higher resolution and lower LER.

Example II Series

Non-Chemically Amplified Negative Resist Composition

Examples II-1 to II-11 and Comparative Examples II-1 to II-4

The phenolic compound (A) and an organic solvent were mixed in the amounts shown in Table 6 to produce homogeneous solutions. In Comparative Example II-2, a crosslinking agent was mixed with them. The homogeneous solutions were each filtered with a 0.1 μm Teflon (trademark) filter to prepare negative resist compositions of Examples II-1 to II-11 and Comparative Examples II-1 to II-4.

The meanings of abbreviations in Table 6 are as follows:
PAB: Post-applied bake temperature (° C.)
PEB: Post-exposure bake temperature (° C.)
(D)-1: Propylene glycol monomethyl ether
(D)-3: Cyclopentanone
(D)-4: Anisole
(D)-5: Ortho-dichlorobenzene
Developing solution: Tetramethylammonium hydroxide aqueous solution

TABLE 6

| | Phenolic Compound (A) | | Crosslinking Agent | Organic Solvent | | PAB | PEB | Concentration of Developing Solution |
|---|---|---|---|---|---|---|---|---|
| | | Content (g) | Content (g) | | Content (g) | ° C. | ° C. | % |
| Example II-1 | A-01 | 0.2 | — | — | (D)-1 | 20 | 100 | — | 0.12 |
| Example II-2 | A-01 | 0.2 | — | — | (D)-1 | 20 | 100 | 100 | 0.12 |
| Example II-3 | A-01 | 0.2 | — | — | (D)-1 | 20 | 100 | 100 | 0.24 |
| Example II-4 | A-13 | 0.2 | — | — | (D)-1 | 20 | 100 | — | 0.24 |
| Example II-5 | A-13 | 0.2 | — | — | (D)-1 | 20 | 100 | 100 | 0.24 |
| Example II-6 | A-13 | 0.2 | — | — | (D)-3 | 20 | 100 | 100 | 0.24 |
| Example II-7 | A-13 | 0.2 | — | — | (D)-4 | 20 | 100 | 100 | 0.24 |
| Example II-8 | A-13 | 0.2 | — | — | (D)-4 | 20 | 130 | 100 | 0.24 |
| Example II-9 | A-13 | 0.2 | — | — | (D)-5 | 20 | 100 | 100 | 0.24 |
| Example II-10 | A-15 | 0.2 | — | — | (D)-1 | 20 | 100 | — | 0.24 |
| Example II-11 | A-15 | 0.2 | — | — | (D)-1 | 20 | 100 | 100 | 0.24 |

TABLE 6-continued

|  | Phenolic Compound (A) | | Crosslinking Agent | | Organic Solvent | | PAB | PEB | Concentration of Developing Solution |
|---|---|---|---|---|---|---|---|---|---|
|  |  | Content (g) |  | Content (g) |  | Content (g) | °C. | °C. | % |
| Comparative Example II-1 | Pre-1 | 0.2 | — | — | (D)-1 | 20 | 100 | — | 0.24 |
| Comparative Example II-2 | Pre-1 | 0.2 | CA-01 | 0.03 | (D)-1 | 20 | 100 | — | 0.24 |
| Comparative Example II-3 | CA-01 | 0.2 | — | — | (D)-1 | 20 | 100 | 100 | — |
| Comparative Example II-4 | CA-02 | 0.2 | — | — | (D)-1 | 20 | 100 | 100 | 1.19 |

<Resist Pattern Formation and Evaluation Method>

Using the resist compositions obtained in the above-described examples II-1 to II-11 and Comparative Examples II-1 to II-4, resist patterns were formed and evaluated by the methods described below. The results are shown in Table V.

(1) Application of Resist

Each resist composition was uniformly applied onto a 6-inch silicon substrate with a spinner and a post-applied bake (PAB) treatment was performed thereon at 100° C. for 60 seconds, thereby forming a resist film having a thickness of 40 nm. In Table 7, "○" indicates that an excellent resist film was formed, and "x" indicates that excellent film formation was difficult due to cissing, etc.

(2) Formation of Resist Pattern

Each resist film was subjected to writing with an electron beam lithography system (accelerating voltage: 100 KeV). After the writing was completed, as needed, each film was subjected to a post-exposure bake (PEB) treatment at 100° C. for 60 seconds, developed in a TMAH aqueous solution (23° C.) for 60 seconds, and then rinsed with pure water for 60 seconds, thereby forming a line and space (L/S) pattern.

(3) Evaluation Method

[Sensitivity, Resolution and Line Edge Roughness]

Sensitivity, resolution and line edge roughness (LER) were measured with a scanning electron microscope (SEM) manufactured by HOLON Co., Ltd. Sensitivity is the minimum exposure amount at which a 100 nm L/S pattern is formed at 1:1, and it was measured in μC/cm². Resolution is the limiting resolution at the minimum exposure amount (lines and spaces are separately resolved). LER was obtained by the steps of measuring line width at 500 points within a range of 0.7 μm from the longitudinal edge of a 100 nm L/S pattern, obtaining the standard deviation therefrom, and calculating 3σ. In Table 7, LER is evaluated as follows: "⊚" indicates that LER is less than 5 nm; "○" indicates that LER is 5 to 7 nm; and "x" indicates that LER exceeds 7 nm.

(4) Post-Exposure Line Width Stability in Vacuum

A resist pattern was formed in the same manner as described above under "(2) Formation of resist pattern," except that the writing step was performed after each resist composition was left for 5 hours inside the electron beam lithography system under a high vacuum of 5.0×10⁻⁶ Pa. The line width of the thus-obtained L/S pattern with a designed line width of 100 nm, was measured at an exposure amount that is the same as the minimum exposure amount obtained by the method described above under "Sensitivity, resolution and line edge roughness" using each resist composition prior to being left for 5 hours under high vacuum. In Table 7, "○" indicates that the change between the line width of a pattern obtained from each resist composition prior to being left for 5 hours under high vacuum, and that of a pattern obtained from each resist composition after being left for 5 hours under a high vacuum, is within 5%, and "x" indicates that the change exceeds 5%.

TABLE 7

|  | Resist Film Forming Ability | Sensitivity (μC/cm²) | Resolution (nm) | LER (nm) | Line Width Stability |
|---|---|---|---|---|---|
| Example II-1 | ○ | 2000 | 18 | ⊚ | ○ |
| Example II-2 | ○ | 1600 | 20 | ⊚ | ○ |
| Example II-3 | ○ | 2200 | 20 | ⊚ | ○ |
| Example II-4 | ○ | 800 | 16 | ⊚ | ○ |
| Example II-5 | ○ | 600 | 16 | ⊚ | ○ |
| Example II-6 | ○ | 1000 | 20 | ⊚ | ○ |
| Example II-7 | ○ | 700 | 18 | ⊚ | ○ |
| Example II-8 | ○ | 350 | 20 | ⊚ | ○ |
| Example II-9 | ○ | 500 | 20 | ⊚ | ○ |
| Example II-10 | ○ | 500 | 18 | ⊚ | ○ |
| Example II-11 | ○ | 450 | 20 | ⊚ | ○ |
| Comparative Example II-1 | ○ | — | — | — | — |
| Comparative Example II-2 | ○ | — | — | — | — |
| Comparative Example II-3 | X | — | — | — | — |
| Comparative Example II-4 | ○ | — | — | — | — |

<Results>

For the non-chemically amplified resist compositions of Examples II-1 to II-11, which used the phenolic compound (A) that has a crosslinkable group incorporated into the resist substrate and thus functions as the resist substrate and also as the crosslinking agent, it is clear that an alkali-developable pattern with high post-exposure line width stability in vacuum, high resolution and low line edge roughness can be obtained therefrom. Especially for Examples II-4 to II-9 which used the phenolic compound 13 (A-13), it is clear that the resist composition has high sensitivity.

For Comparative Example II-1 which used the phenolic compound (Pre-1) having no crosslinkable group incorporated thereinto, no pattern was obtained at an exposure amount of up to 3,000 μc/cm². For Comparative Example II-2 which used a combination of the phenolic compound (Pre-1) having no crosslinkable group incorporated thereinto with the crosslinking agent (CA-01), no pattern was obtained at an exposure amount of up to 3,000 μc/cm².

For the resist composition of Comparative Example II-3 which used the phenolic compound CA-01 having a molecular weight of 400 or less and a crosslinkable group, dissolution (dewetting) occurred during the post-applied bake treatment. Therefore, a uniform resist film could not formed and resist film evaluation could not be conducted.

The resist composition of Comparative Example II-4 which used the polymer (polyhydroxystyrene) derivative CA-02 having a molecular weight of about 3,000, swelling occurred during development and no pattern of 100 nm or less was obtained, therefore.

Reference Examples 1 and 2

A material for forming a pattern (TEP-G) represented by the following chemical formula (34) disclosed in Non-Patent Literature 3, was obtained from Asahi Organic Chemicals Industry Co., Ltd. and purified by high-performance liquid chromatography to have a purity of 99% or more. The material for forming a pattern (TEP-G) represented by the following chemical formula (34) had a glass transition temperature of 47° C.

[Chemical Formula 39]

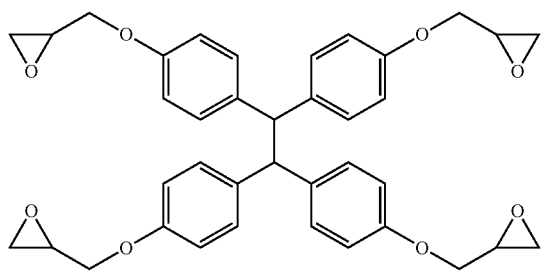

Chemical Formula (34)

A resist composition was prepared by uniformly dissolving 0.2 g of the material for forming a pattern (TEP-G) represented by the chemical formula (34) and, as an acid generator, 0.02 g of triphenylsulfonium hexafluoroantimonate in 15 g of cyclopentanone.

In Reference Example 1, the resist composition was uniformly applied onto a 6-inch silicon substrate with a spinner and a post-applied bake (PAB) treatment was performed thereon at 90° C. for 60 seconds, thereby forming a resist film having a thickness of 50 nm. However, dissolution (dewetting) occurred during the post-applied bake treatment. Therefore, a uniform resist film could not be formed and resist film evaluation could not be conducted.

In Reference Example 2, therefore, a resist film was formed at a low post-applied bake temperature of 60° C.

Then, the resist film was subjected to writing with an electron beam lithography system (accelerating voltage: 100 KeV). After the writing was completed, the film was subjected to a post-exposure bake (PEB) treatment at 60° C. for 60 seconds, developed in an organic solvent for 60 seconds, and then rinsed with isopropyl alcohol (IPA) for 60 seconds, thereby forming a line and space (L/S) pattern.

For evaluation of pattern dimensional stability, a resist pattern was formed in the same manner as described above, except that the writing step was performed after the resist composition was left for 5 hours inside the electron beam lithography system under a high vacuum. The line width of the thus-obtained L/S pattern with a designed line width of 100 nm, was measured at an exposure amount that is the same as the minimum exposure amount obtained by the method described above under "Sensitivity" of Examples, using the resist composition prior to being left for 5 hours under a high vacuum. It is clear that the change between the line width of a pattern obtained from the resist composition prior to being left for 5 hours under high vacuum, and that of a pattern obtained from the resist composition after being left for 5 hours under a high vacuum, exceeded 5% and the resist film obtained in Reference Example 2 had poor vacuum stability, therefore.

From the above results, it is clear that cussing is caused in the pre-applied bake treatment upon resist film formation by using a pattern forming composition with a low glass transition temperature; therefore, pattern formation is difficult. It is also clear that the remaining solvent amount in the resist film is increased when the pre-applied bake treatment is performed at a low temperature that is equal to or less than Tg; therefore, there is a problem of a decrease in resist stability (line width stability, vacuum stability, time stability during the time of standing after application of the resist).

The invention claimed is:

1. A negative resist composition comprising a phenolic compound (A) which has: two or more phenolic hydroxyl groups per molecule; one or more hydroxymethyl groups per molecule in the ortho-position of any of the phenolic hydroxyl groups; and a molecular weight of 400 to 2,500,
wherein the content of the phenolic compound (A) is 70% by weight or more of the total solid content of the negative resist composition;
wherein the ratio "Mw/Mn" of the weight average molecular weight "Mw" of the phenolic compound and the number average molecular weight "Mn" of the same is from 1.0 to 1.1; and
wherein the phenolic compound (A) is one or more kinds selected from the group consisting of compounds represented by the following chemical formula (1):

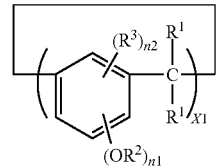

Chemical Formula (1)

wherein, each $R^1$ is independently one selected from the group consisting of a hydrogen atom, an alkyl group, a cycloalkyl group, an aryl group and a group represented by the following chemical formula (2), and the aryl group contained in $R^1$ can contain a hydroxyl group and one or more substituents selected from the group consisting of a hydroxymethyl group and an alkoxymethyl group; each $R^2$ is independently a hydrogen atom or a monovalent organic group; at least two $R^2$s per molecule are hydrogen atoms; $R^3$ is one selected from the group consisting of a halogen atom, an alkyl group, a cycloalkyl group, an aryl group, an alkoxy group, an acyl group, a cyano group, a nitro group, a hydroxymethyl group and an alkoxymethyl group; n1 is an integer of 1 to 3; n2 is an integer of 0 to 2; n1 and n2 are selected from these ranges so as to satisfy the formula n1+n2≤4; x1 is an integer of 3 to 12; in $R^1$ and/or $R^3$, the phenolic compound (A) has one or more hydroxymethyl groups per molecule in the ortho-position of any of the phenolic hydroxyl groups; and groups represented by the same symbol in the chemical formula (1) can be identical or different;

Chemical Formula 2

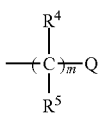

wherein, $R^4$ and $R^5$ are each independently a hydrogen atom or an alkyl group having 1 to 3 carbon atoms; Q is an aryl group or a cycloalkyl group; m is 1 or 2;

wherein the phenolic compound (A) is one or more kinds selected from the group consisting of compounds represented by the following chemical formulae (a-41) to (a-47):

Chemical Formula (a-41)

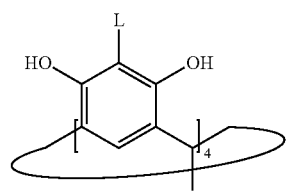

Chemical Formula (a-42)

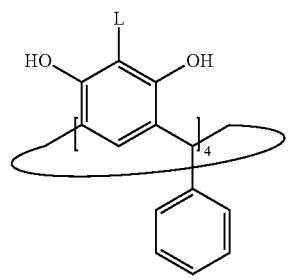

Chemical Formula (a-43)

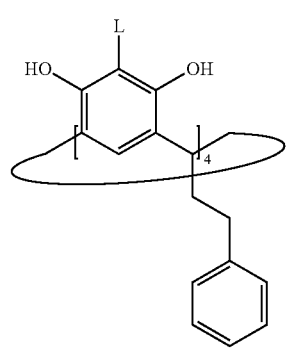

Chemical Formula (a-44)

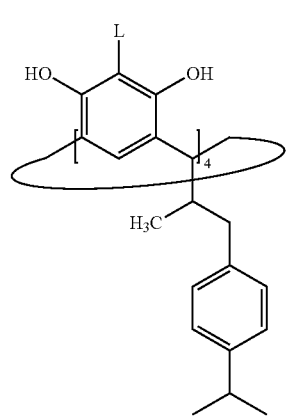

Chemical Formula (a-45)

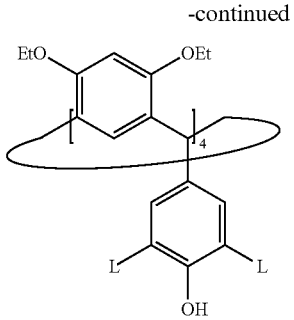

Chemical Formula (a-46)

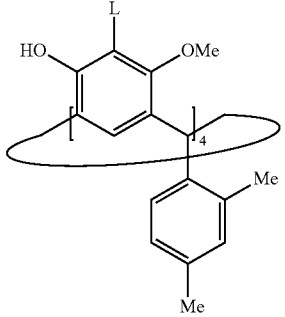

Chemical Formula (a-47)

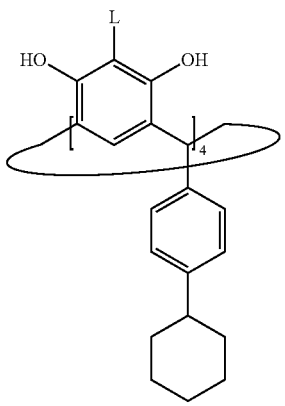

wherein each L is independently a hydrogen atom or the substituent selected from the group consisting of a hydroxymethyl group and an alkoxymethyl group, and at least one L per molecule is a hydroxymethyl group at the ortho-position of the phenolic hydroxyl group.

2. The negative resist composition according to claim 1, further comprising an acid generator (B) which directly or indirectly produces acid by exposure to active energy rays having a wavelength of 248 nm or less, wherein the negative resist composition is a chemically amplified negative resist composition.

3. The negative resist composition according to claim 2, further comprising an organic basic compound (C).

4. The negative resist composition according to claim 1, wherein the phenolic compound (A) has two or more substituents of one or more kinds selected from the group consisting of a hydroxymethyl group and an alkoxymethyl group per molecule in the ortho-position of any of the phenolic hydroxyl groups, and wherein the negative resist composition substantially comprises no acid generator and is a non-chemically amplified negative resist composition.

5. The negative resist composition according to claim 1, wherein the phenolic compound (A) has a glass transition temperature (Tg) of 60° C. or more.

6. The negative resist composition according to claim 1, wherein the phenolic compound (A) has three or more substituents of one or more kinds selected from the group consisting of a hydroxymethyl group and an alkoxymethyl group per molecule in the ortho-position of any of the phenolic hydroxyl groups.

7. A method for producing a relief pattern comprising the steps of:
(i) forming a resist film by applying the negative resist composition defined by claim 1 to a substrate and heating the same, and
(ii) exposing the resist film to electron beams, ion beams, EUV or x-rays and then developing the same.

8. The method for producing a relief pattern according to claim 7, further comprising the step of heating the resist film after the exposure and before the development.

9. An electronic component at least part of which comprises the negative resist composition defined by claim 1 or a cured product thereof.

10. A negative resist composition,
comprising a phenolic compound (A) which has: two or more phenolic hydroxyl groups per molecule; one or more substituents of one or more kinds selected from the group consisting of a hydroxymethyl group and an alkoxymethyl group per molecule in the ortho-position of any of the phenolic hydroxyl groups; and a molecular weight of 400 to 2,500, and an acid generator (B) which directly or indirectly produces acid by exposure to active energy rays having a wavelength of 248 nm or less;
comprising no crosslinking agent which is different from the phenolic compound (A); and
being a chemically amplified negative resist composition,
wherein the content of the phenolic compound (A) is 70% by weight or more of the total solid content of the negative resist composition;
wherein the ratio "Mw/Mn" of the weight average molecular weight "Mw" of the phenolic compound and the number average molecular weight "Mn" of the same is from 1.0 to 1.1; and
wherein the phenolic compound (A) is one or more kinds selected from the group consisting of compounds represented by the following chemical formulae (a-1), (a-2), a-7) to (a-8), (a-11), (a-13) to (a-21), (a-23) to (a-25), (a-27) to (a-32), (a-34) to (a-35), (20), (27), (29) and (31):

Chemical Formula (a-1)

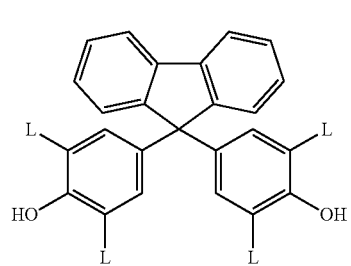

Chemical Formula (a-2)

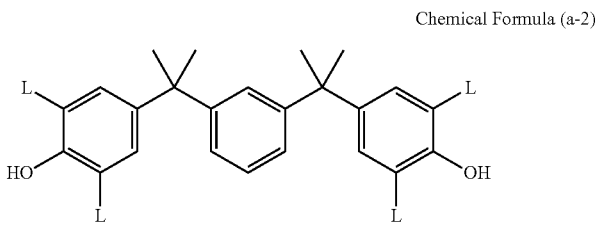

Chemical Formula (a-7)

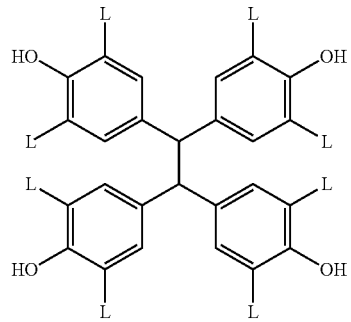

Chemical Formula (a-8)

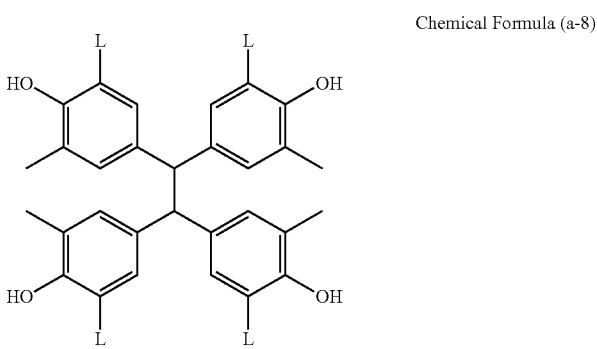

Chemical Formula (a-11)

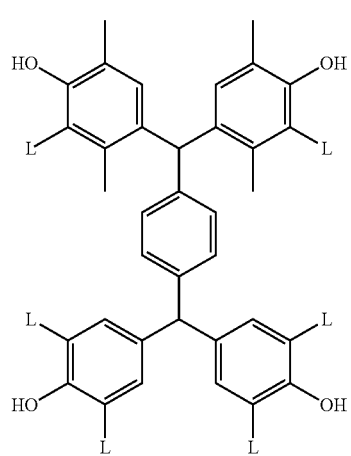

Chemical Formula (a-13)

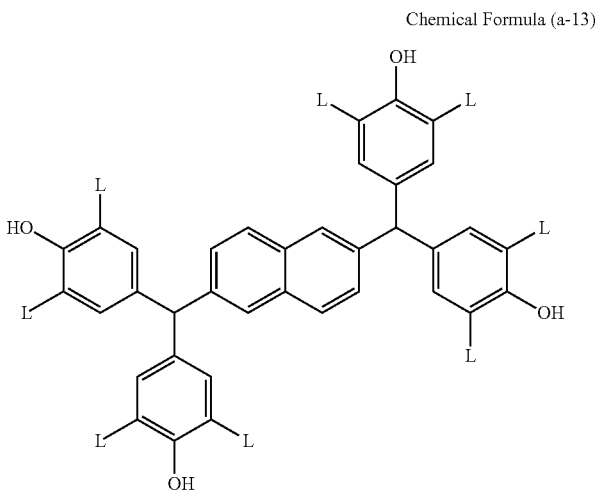

Chemical Formula (a-14)
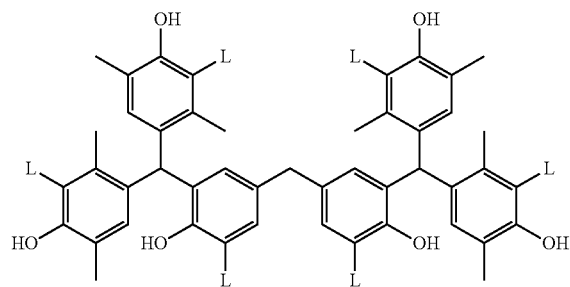
Chemical Formula (a-15)
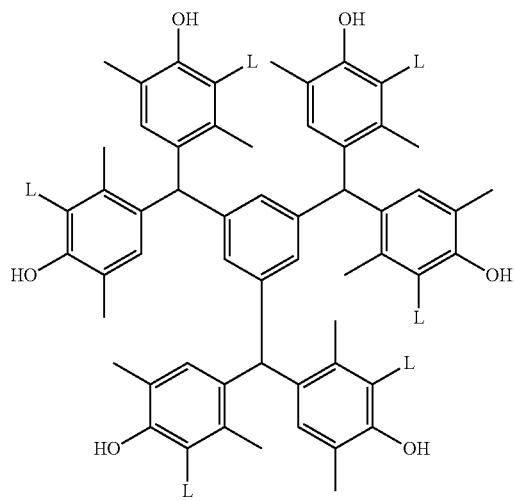
Chemical Formula (a-16)
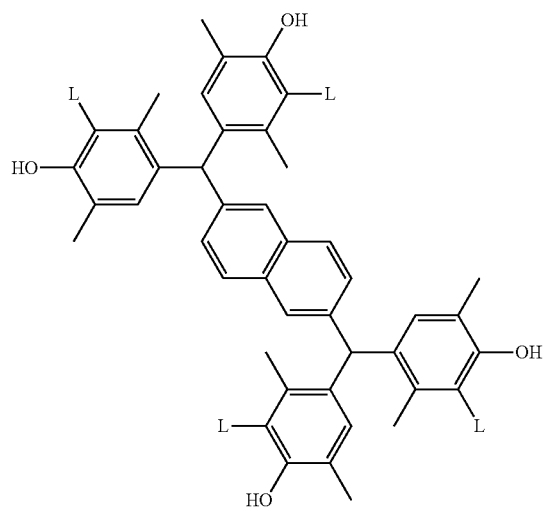
Chemical Formula (a-17)
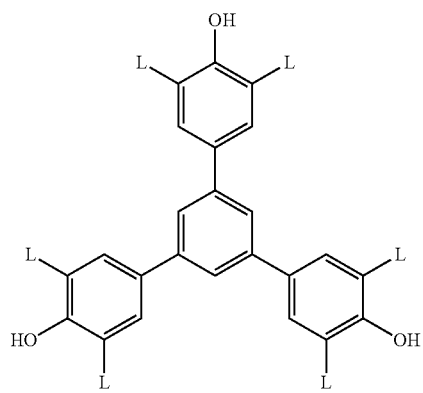
Chemical Formula (a-18)
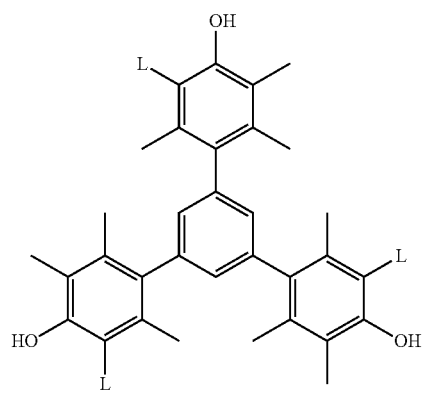
Chemical Formula (a-19)
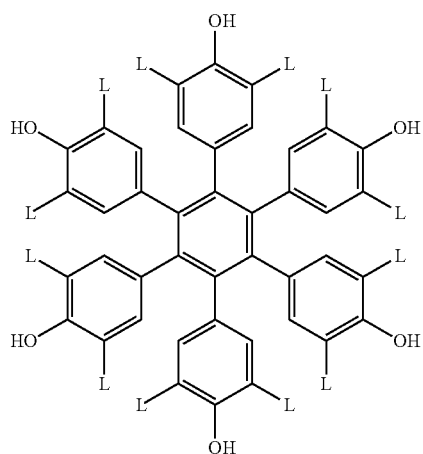

Chemical Formula (a-20)
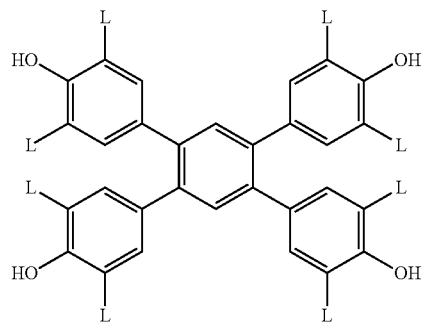
Chemical Formula (a-21)
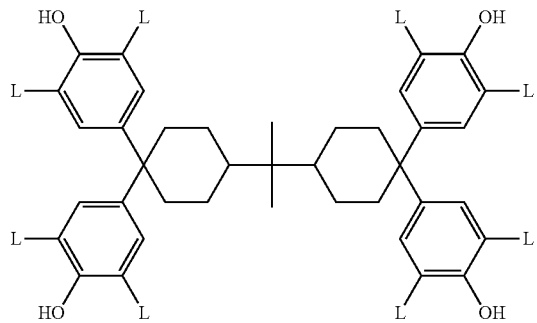
Chemical Formula (a-23)
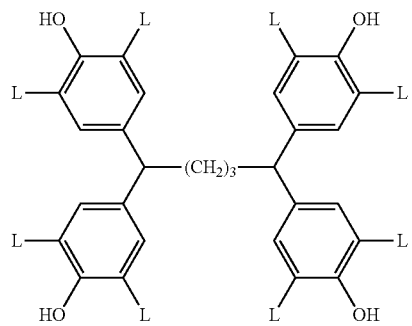
Chemical Formula (a-24)
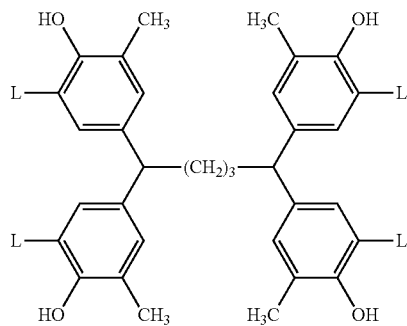
Chemical Formula (a-25)
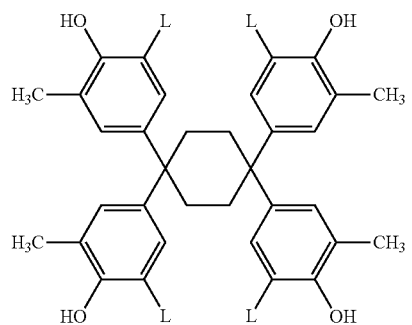
Chemical Formula (a-27)
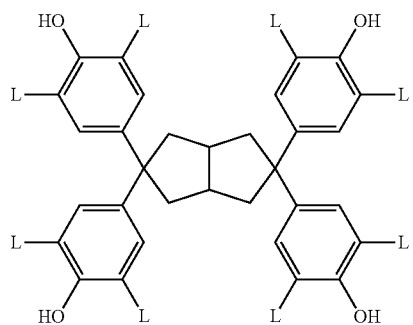
Chemical Formula (a-28)
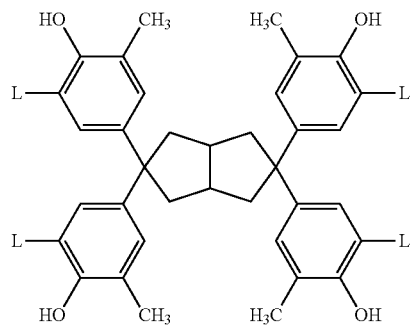
Chemical Formula (a-29)
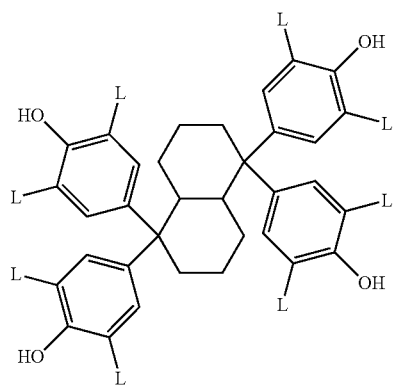

Chemical Formula (a-30)
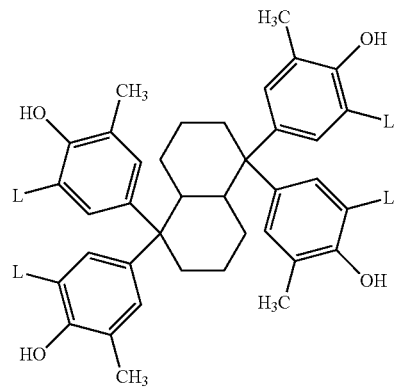
Chemical Formula (a-31)
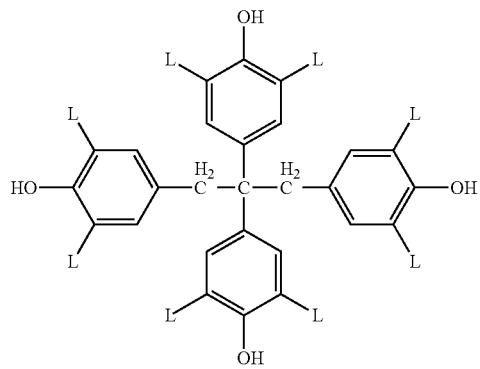
Chemical Formula (a-32)
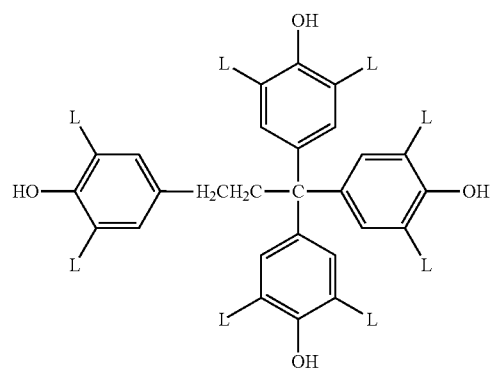
Chemical Formula (a-34)
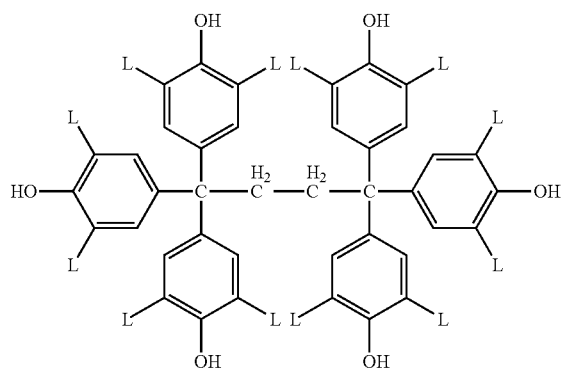
Chemical Formula (a-35)
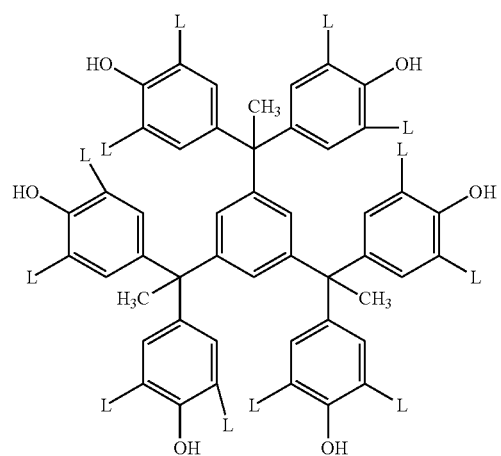
Chemical Formula (20)
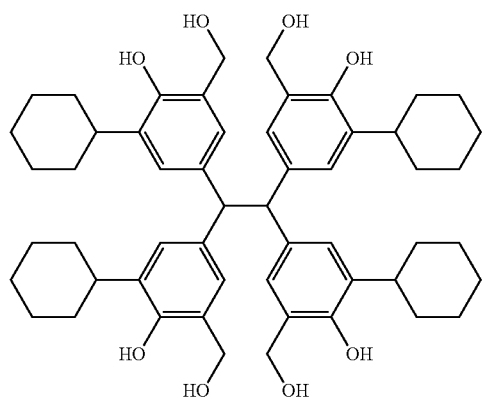
Chemical Formula (27)
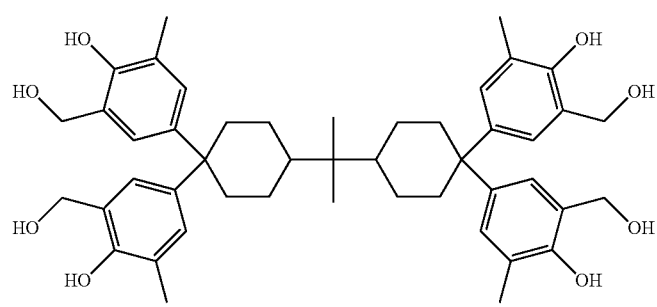

Chemical formula (29)

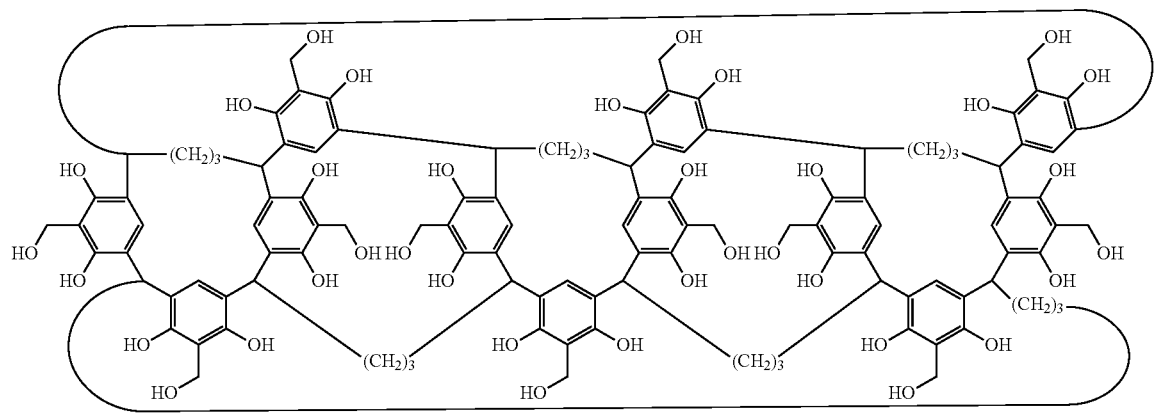

Chemical Formula (31)

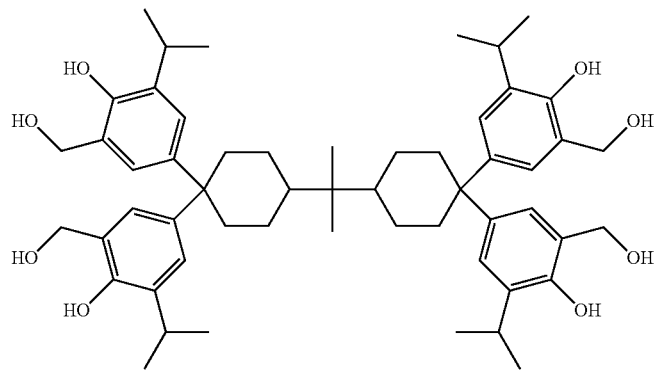

wherein each L is independently a hydrogen atom or the substituent selected from the group consisting of a hydroxymethyl group and an alkoxymethyl group, and at least one L per molecule is the substituent selected from the group consisting of a hydroxymethyl group and an alkoxymethyl group at the ortho-position of the phenolic hydroxyl group.

11. A method for producing a relief pattern comprising the steps of:
(i) forming a resist film by applying the negative resist composition defined by claim 10 a substrate and heating the same, and
(ii) exposing the resist film to electron beams, ion beams, EUV or x-rays and then developing the same.

12. An electronic component at least part of which comprises the negative resist composition defined by claim 10 or a cured product thereof.

13. A negative resist composition,
comprising a phenolic compound (A) which has: two or more phenolic hydroxyl groups per molecule; one or more substituents of one or more kinds selected from the group consisting of a hydroxymethyl group and an alkoxymethyl group per molecule in the ortho-position of any of the phenolic hydroxyl groups; and a molecular weight of 400 to 2,500; a solvent which is one or more kinds selected from the group consisting of diethylene glycol dimethyl ether, cyclohexanone, cyclopentanone, 1-ethoxy-2-propanol, ethyl lactate, propylene glycol monomethyl ether and propylene glycol monomethyl ether acetate; and a photoacid generator which is in a content of less than 1 part by weight with respect to 100 parts by weight of the phenolic compound (A);

comprising no crosslinking agent which is different from the phenolic compound (A); and being a non-chemically amplified negative resist composition, wherein the content of the phenolic compound (A) is 70% by weight or more of the total solid content of the negative resist composition;

wherein the ratio "Mw/Mn" of the weight average molecular weight "Mw" of the phenolic compound and the number average molecular weight "Mn" of the same is from 1.0 to 1.1; and wherein the phenolic compound (A) is one or more kinds selected from the group consisting of compounds represented by the following chemical formulae (a-1), (a-2), (a-7) to (a-8), (a-11), (a-13) to (a-21), (a-23) to (a-25), (a-27) to (a-32), (a-34) to (a-35), (20), (27), (29) and (31):

Chemical Formula (a-1)
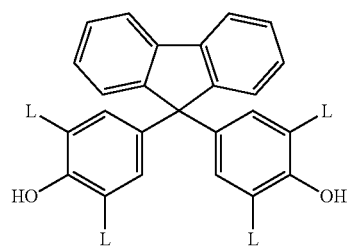
Chemical Formula (a-2)
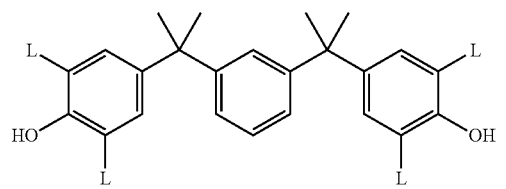
Chemical Formula (a-7)
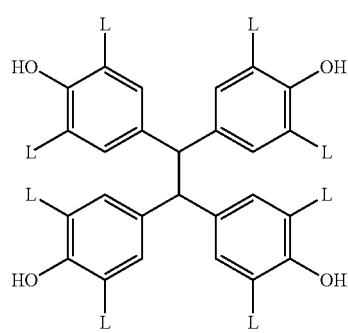
Chemical Formula (a-8)
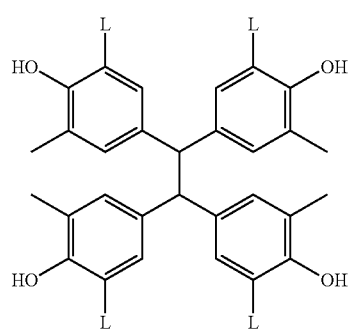
Chemical Formula (a-11)
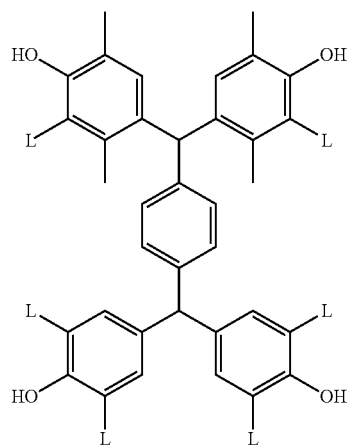
Chemical Formula (a-13)
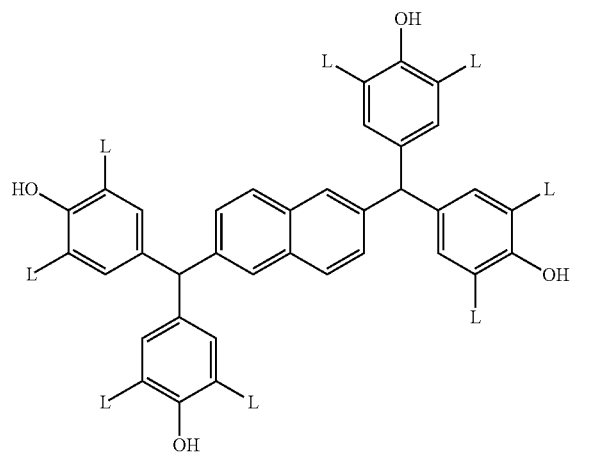
Chemical Formula (a-14)
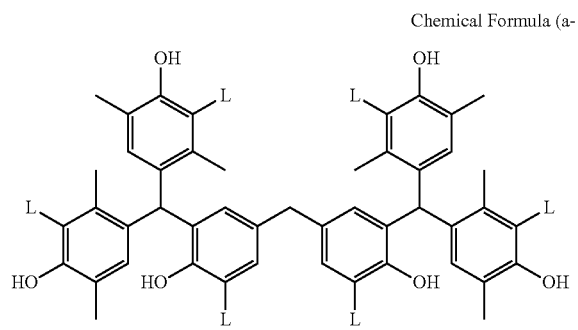
Chemical Formula (a-15)
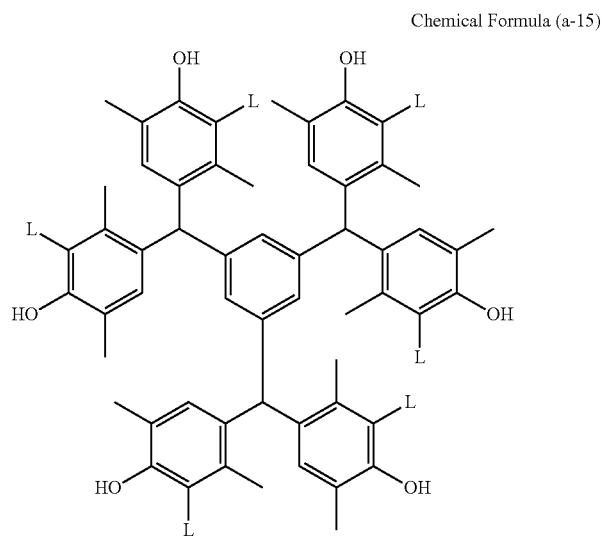

Chemical Formula (a-16)
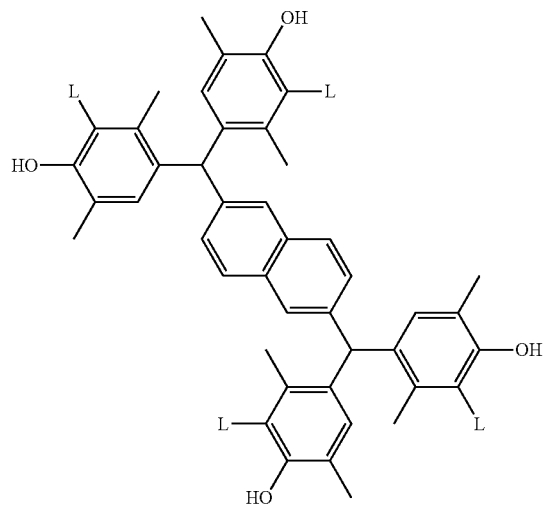
Chemical Formula (a-17)
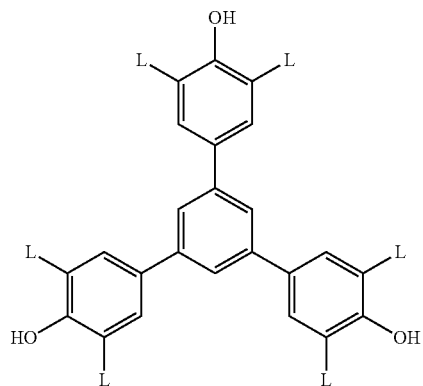
Chemical Formula (a-18)
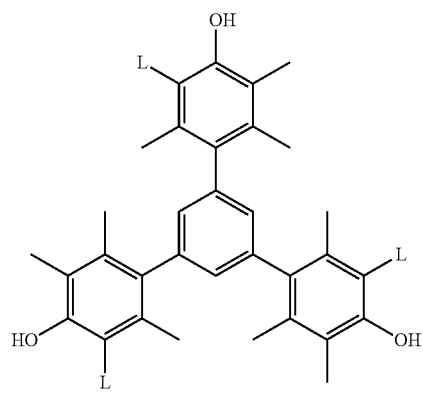
Chemical Formula (a-19)
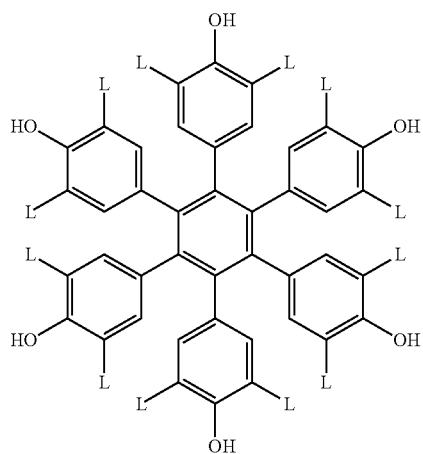
Chemical Formula (a-20)
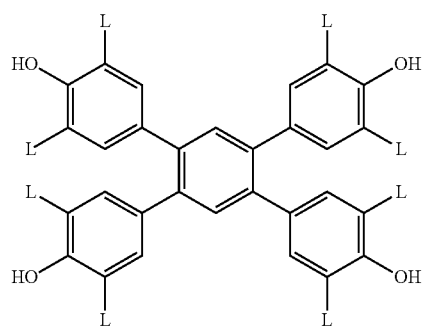
Chemical Formula (a-21)
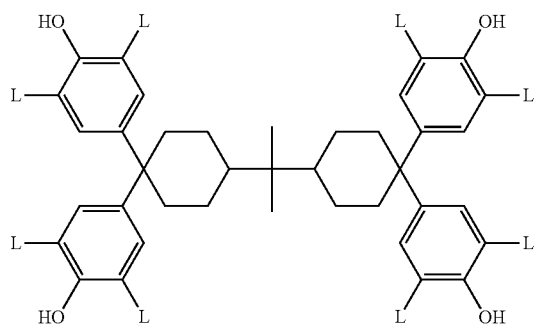

Chemical Formula (a-23)
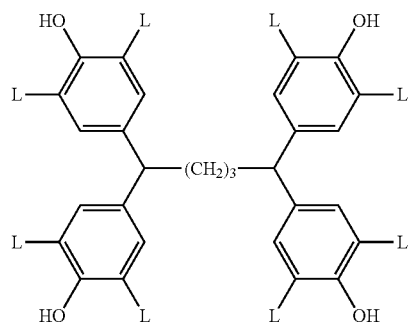
Chemical Formula (a-24)
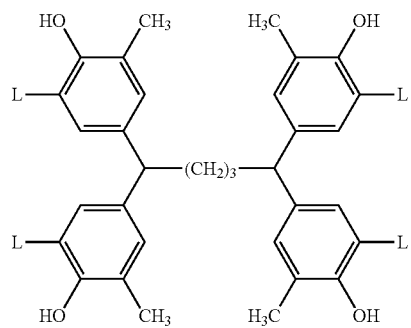
Chemical Formula (a-25)
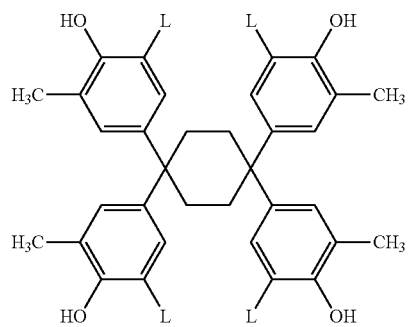
Chemical Formula (a-27)
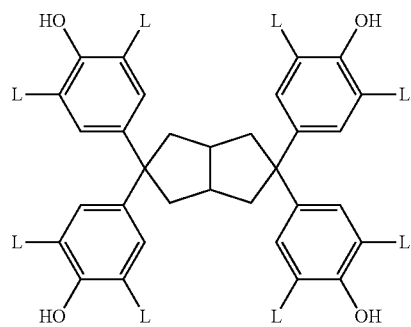
Chemical Formula (a-28)
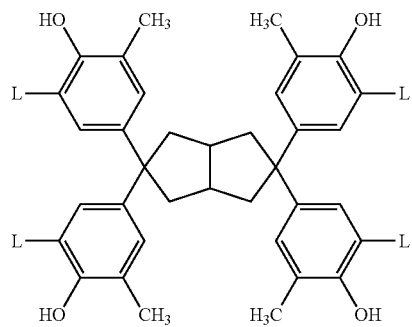
Chemical Formula (a-29)
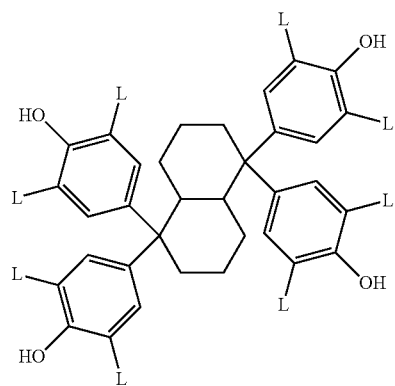
Chemical Formula (a-30)
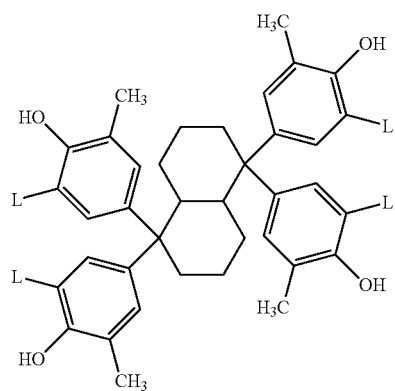
Chemical Formula (a-31)
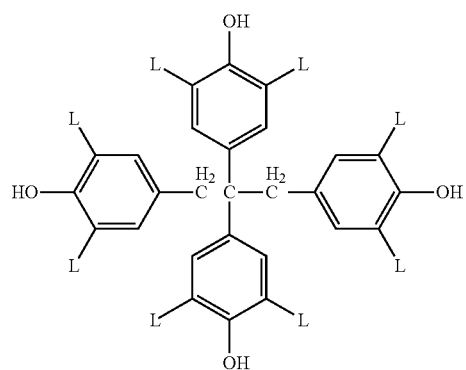

Chemical Formula (a-32)
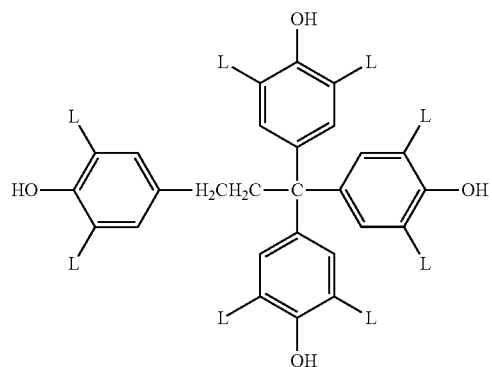
Chemical Formula (a-34)
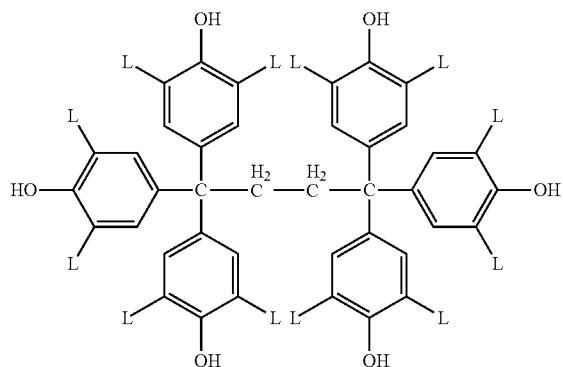
Chemical Formula (a-35)
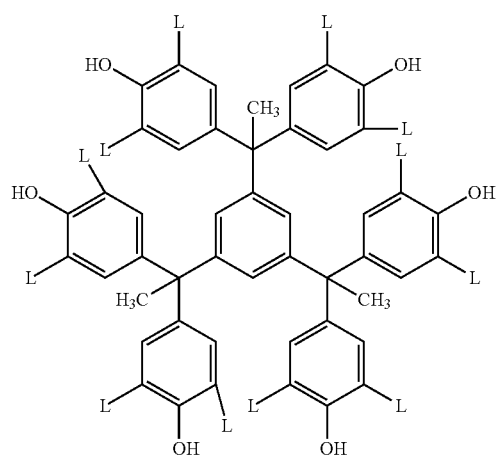
Chemical Formula (20)
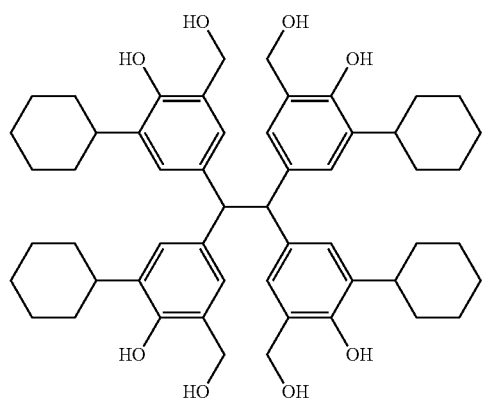
Chemical Formula (27)
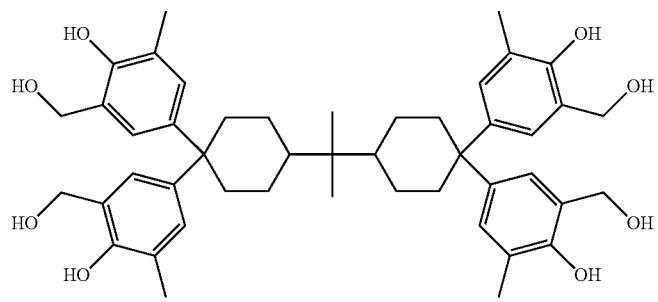
Chemical formula (29)
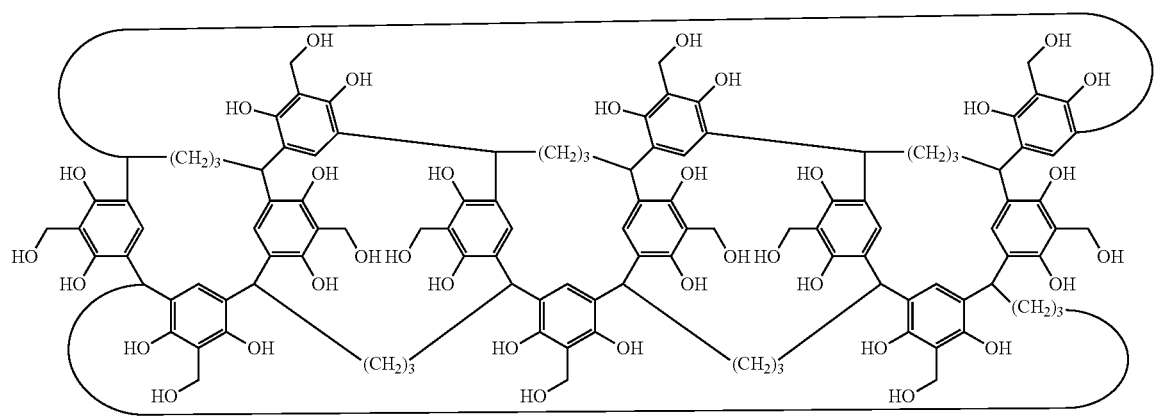

-continued

Chemical Formula (31)

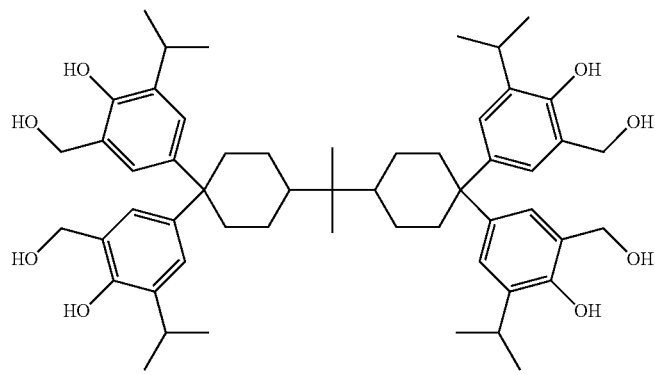

wherein each L is independently a hydrogen atom or the substituent selected from the group consisting of a hydroxymethyl group and an alkoxymethyl group, and at least one L per molecule is the substituent selected from the group consisting of a hydroxymethyl group and an alkoxymethyl group at the ortho-position of the phenolic hydroxyl group.

14. A method for producing a relief pattern comprising the steps of:

(i) forming a resist film by applying the negative resist composition defined by claim 13 a substrate and heating the same, and
(ii) exposing the resist film to electron beams, ion beams, EUV or x-rays and then developing the same.

15. An electronic component at least part of which comprises the negative resist composition defined by claim 13 or a cured product thereof.

* * * * *